United States Patent
Tanaka et al.

(10) Patent No.: US 7,183,145 B2
(45) Date of Patent: *Feb. 27, 2007

(54) SEMICONDUCTOR DEVICE AND MANUFACTURING METHOD THEREOF

(75) Inventors: Koichiro Tanaka, Kanagawa (JP); Hideto Ohnuma, Kanagawa (JP); Chiho Kokubo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/148,400

(22) Filed: Jun. 8, 2005

(65) Prior Publication Data

US 2005/0233557 A1 Oct. 20, 2005

Related U.S. Application Data

(62) Division of application No. 09/800,627, filed on Mar. 7, 2001, now Pat. No. 7,098,084.

(30) Foreign Application Priority Data

Mar. 8, 2000  (JP)  .............................. 2000-063000
Mar. 8, 2000  (JP)  .............................. 2000-064186

(51) Int. Cl.
*H01L 21/00* (2006.01)

(52) U.S. Cl. ....................... 438/149; 438/151; 438/162; 438/166; 438/487

(58) Field of Classification Search ................ 438/149, 438/151, 482, 486, 487, 162, 166
See application file for complete search history.

(56) References Cited

U.S. PATENT DOCUMENTS 5,247,190 A   9/1993  Friend et al. .................. 257/40

(Continued)

FOREIGN PATENT DOCUMENTS

EP          0 651 431       5/1995

(Continued)

OTHER PUBLICATIONS

U.S. Appl. No. 09/799,373 (pending) to Ohnuma et al, including specification, claims, abstract, drawings and PTO filing receipt.

(Continued)

*Primary Examiner*—M. Wilczewski
*Assistant Examiner*—Toniae M. Thomas
(74) *Attorney, Agent, or Firm*—Cook, Alex, McFarron, Manzo, Cummings & Mehler, Ltd.

(57) ABSTRACT

In a crystallization process of an amorphous semiconductor film, a first polycrystalline semiconductor film, in which amorphous regions are dotted within the continuous crystal region, is obtained by performing heat treatment after introducing a metallic element which promotes crystallization on the amorphous semiconductor film. At this point, the amorphous regions are kept within a predetermined range. A laser beam having a wave length region, which can give more energy to the amorphous region than to the crystal region, is irradiated to the first polycrystalline semiconductor film, it is possible to crystallize the amorphous region without destroying the crystal region. If a TFT is manufactured based on a second polycrystalline semiconductor film, which is obtained through the above-mentioned crystallization processes, the TFT with high electric characteristics and less fluctuation can be obtained.

15 Claims, 34 Drawing Sheets

U.S. PATENT DOCUMENTS

| | | | |
|---|---|---|---|
| 5,399,502 A | 3/1995 | Friend et al. | 437/1 |
| 5,529,937 A | 6/1996 | Zhang et al. | 437/10 |
| 5,550,070 A | 8/1996 | Funai et al. | 438/486 |
| 5,595,923 A * | 1/1997 | Zhang et al. | 438/162 |
| 5,643,826 A | 7/1997 | Ohtani et al. | 437/88 |
| 5,681,759 A | 10/1997 | Zhang | 437/21 |
| 5,830,784 A | 11/1998 | Zhang et al. | 438/154 |
| 5,854,096 A * | 12/1998 | Ohtani et al. | 438/166 |
| 5,879,974 A | 3/1999 | Yamazaki | 438/162 |
| 5,879,977 A | 3/1999 | Zhang et al. | 438/166 |
| 5,897,347 A | 4/1999 | Yamazaki et al. | 438/166 |
| 5,904,770 A | 5/1999 | Ohtani et al. | 117/103 |
| 5,923,962 A | 7/1999 | Ohtani et al. | 438/150 |
| 5,923,966 A | 7/1999 | Teramoto et al. | 438/162 |
| 5,953,597 A | 9/1999 | Kusumoto et al. | 438/161 |
| 6,066,547 A | 5/2000 | Maekawa | 438/486 |
| 6,071,764 A | 6/2000 | Zhang et al. | 438/166 |
| 6,077,758 A | 6/2000 | Zhang et al. | 438/486 |
| 6,088,070 A | 7/2000 | Ohtani et al. | 349/38 |
| 6,110,770 A | 8/2000 | Zhang et al. | 438/166 |
| 6,160,279 A | 12/2000 | Zhang et al. | 257/255 |
| 6,232,156 B1 | 5/2001 | Ohtani et al. | 438/151 |
| 6,285,042 B1 | 9/2001 | Ohtani et al. | 257/66 |
| 6,312,979 B1 | 11/2001 | Jang et al. | 438/166 |
| 6,319,761 B1 | 11/2001 | Zhang et al. | 438/166 |
| 6,326,226 B1 | 12/2001 | Jang et al. | 438/48 |
| 6,335,541 B1 | 1/2002 | Ohtani et al. | 257/59 |
| 6,417,031 B2 | 7/2002 | Ohtani et al. | 438/476 |
| 6,420,246 B1 | 7/2002 | Yamazaki et al. | 438/166 |
| 6,451,638 B1 | 9/2002 | Zhang et al. | 438/486 |
| 6,455,401 B1 | 9/2002 | Zhang et al. | 438/162 |
| 6,461,899 B1 | 10/2002 | Kitakado et al. | 438/149 |
| 6,465,287 B1 | 10/2002 | Yamazaki et al. | 438/486 |
| 6,482,721 B1 | 11/2002 | Lee | 438/166 |
| 6,495,404 B1 | 12/2002 | Teramoto et al. | 438/166 |
| 6,537,863 B1 | 3/2003 | Jung | 315/169.3 |
| 6,541,918 B1 | 4/2003 | Yudasaka | 315/169.3 |
| 6,730,550 B1 | 5/2004 | Yamazaki et al. | 438/166 |
| 6,753,212 B2 | 6/2004 | Yamazaki et al. | 438/166 |
| 2001/0000011 A1 | 3/2001 | Zhang et al. | 257/59 |
| 2001/0021544 A1 | 9/2001 | Ohnuma et al. | 438/162 |
| 2002/0048864 A1 | 4/2002 | Yamazaki et al. | 438/151 |
| 2002/0053670 A1 | 5/2002 | Ohtani et al. | 438/151 |

FOREIGN PATENT DOCUMENTS

| | | |
|---|---|---|
| EP | 0 978 877 A2 | 2/2000 |
| JP | 04-130735 | 5/1992 |
| JP | 7-183540 | 7/1995 |
| JP | 07-335547 | 12/1995 |
| JP | 10-092576 | 4/1998 |
| JP | 11-097702 | 4/1999 |
| JP | 11-261077 | 9/1999 |
| JP | 2001-326178 | 11/2001 |
| JP | 2001-326363 | 11/2001 |
| WO | WO 90/13148 | 11/1990 |

OTHER PUBLICATIONS

Schenk, H. et al, "Polymers for Light Emitting Diodes," EURODISPLAY '99, Proceedings of the 19th International Display Research Conference, Sep. 6-9, Berlin, Germany, pp. 33-37, (1999).

* cited by examiner

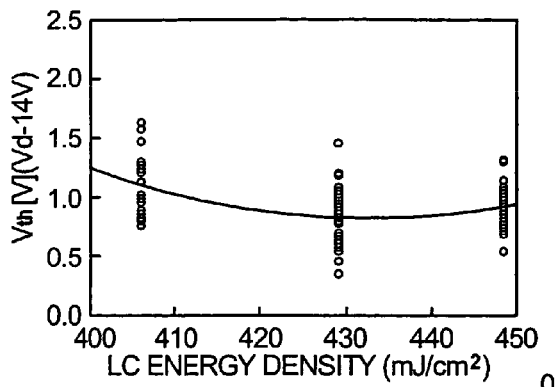
*FIG. 10A*
*FIG. 10B*
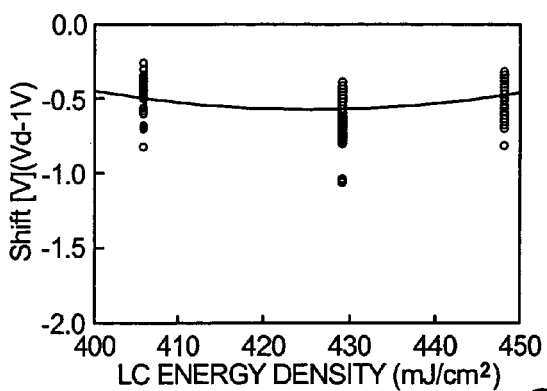
*FIG. 10C*
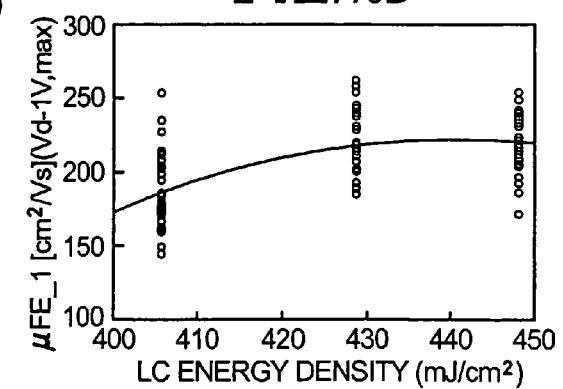
*FIG. 10D*

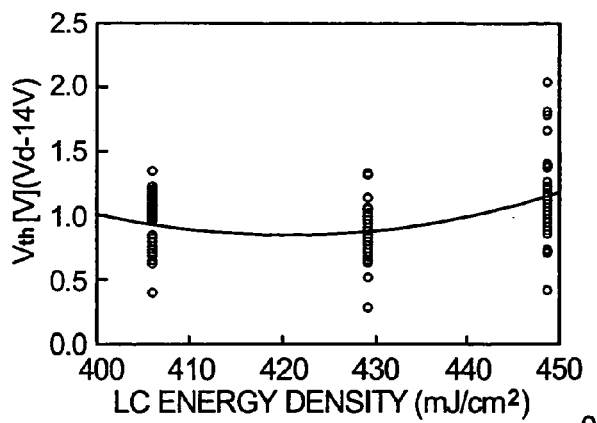
*FIG. 10E*
*FIG. 10F*
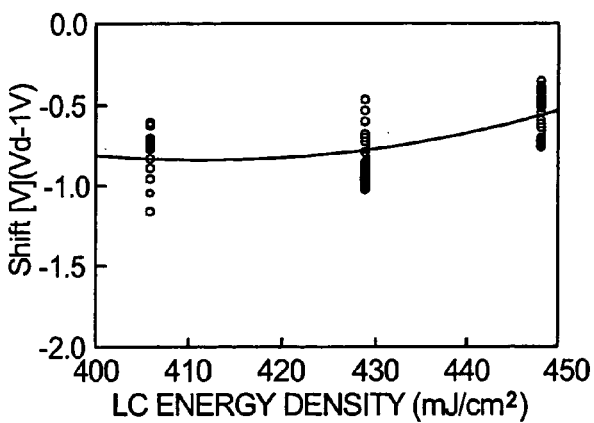
*FIG. 10G*
*FIG. 10H*
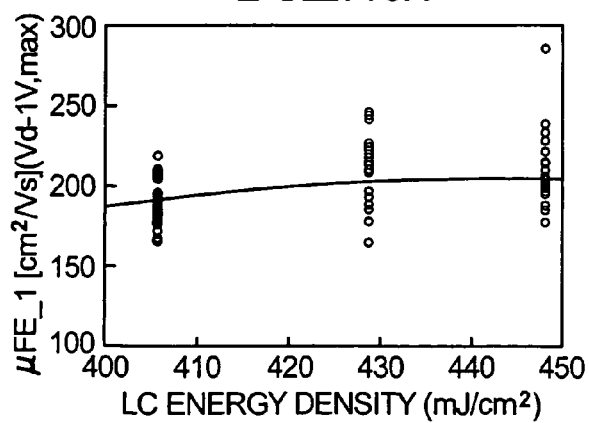

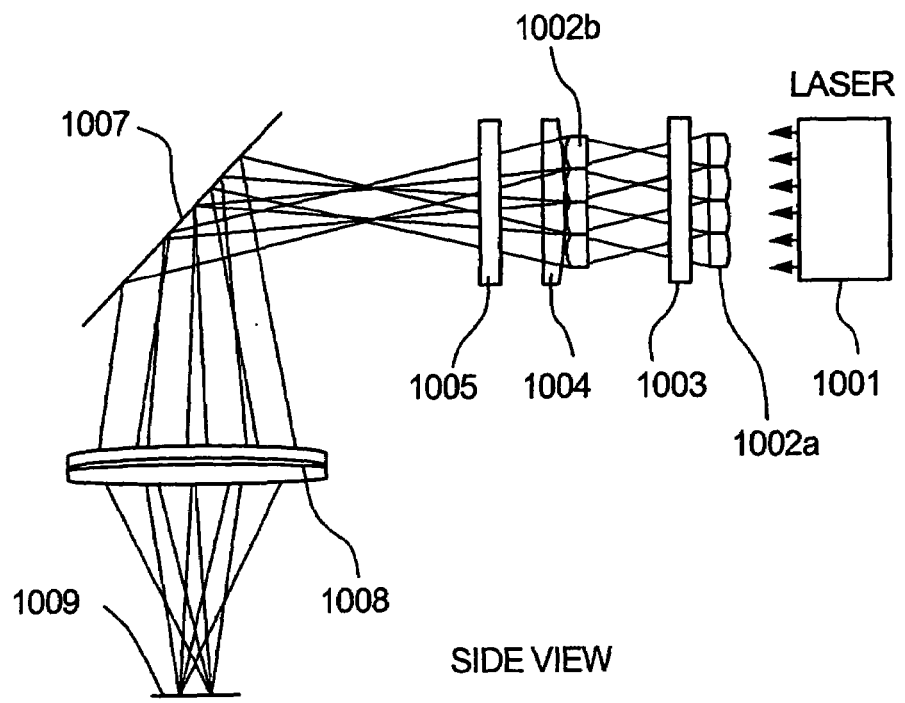
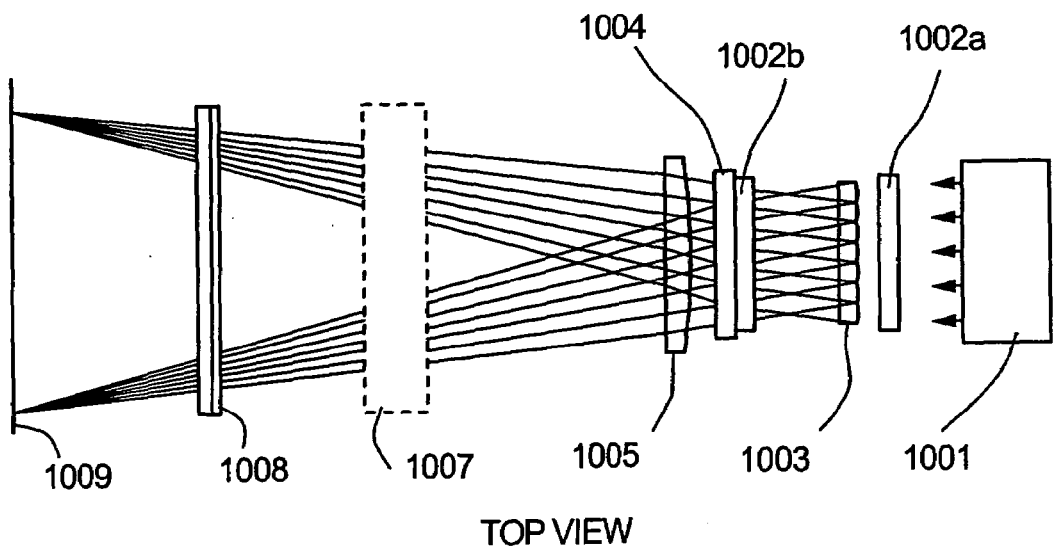
FIG. 13

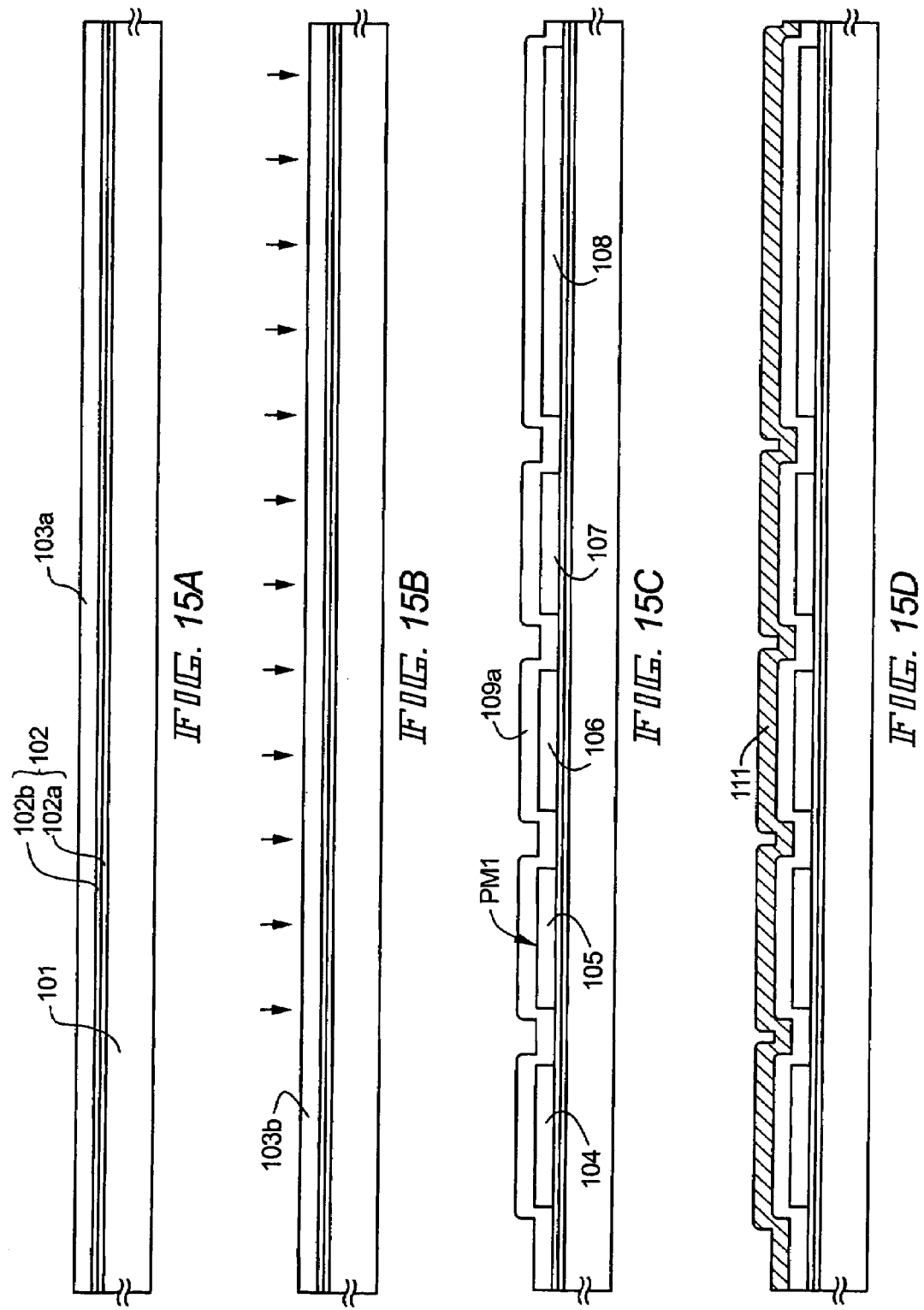

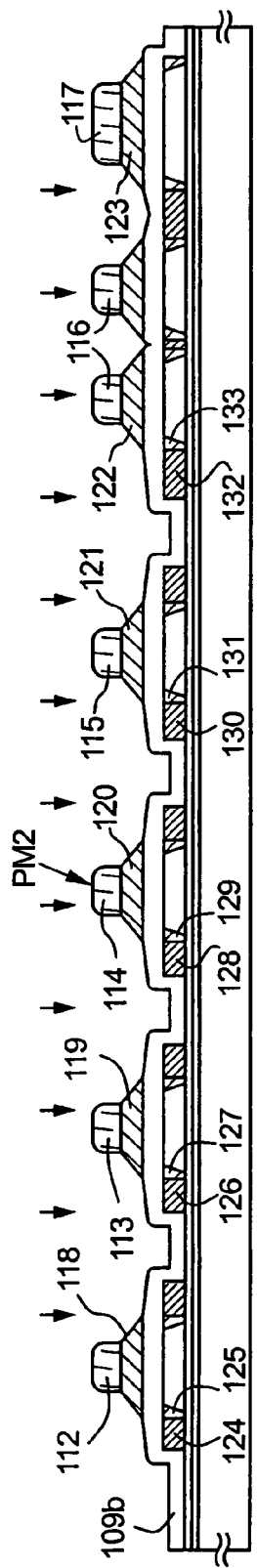
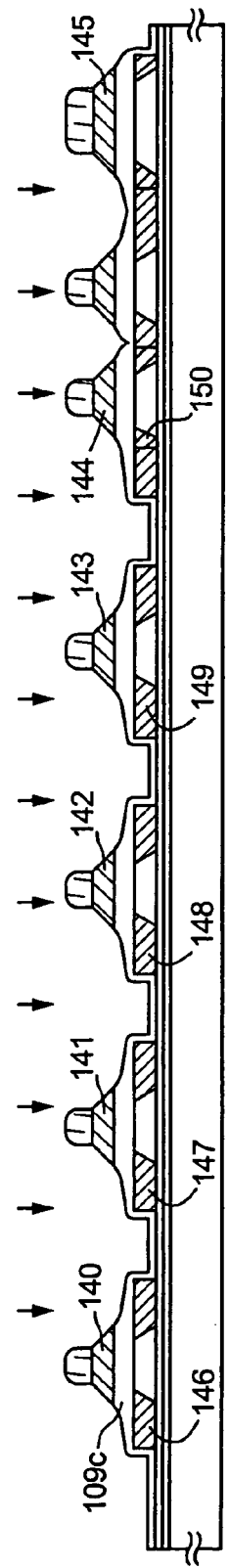
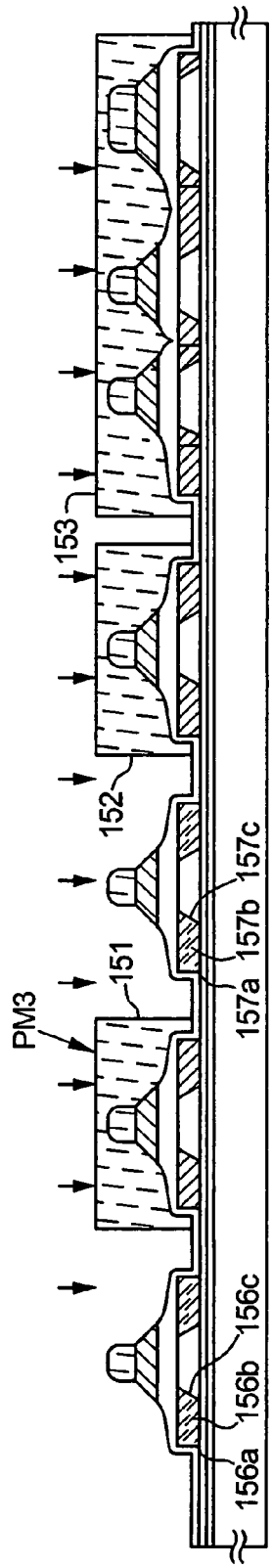

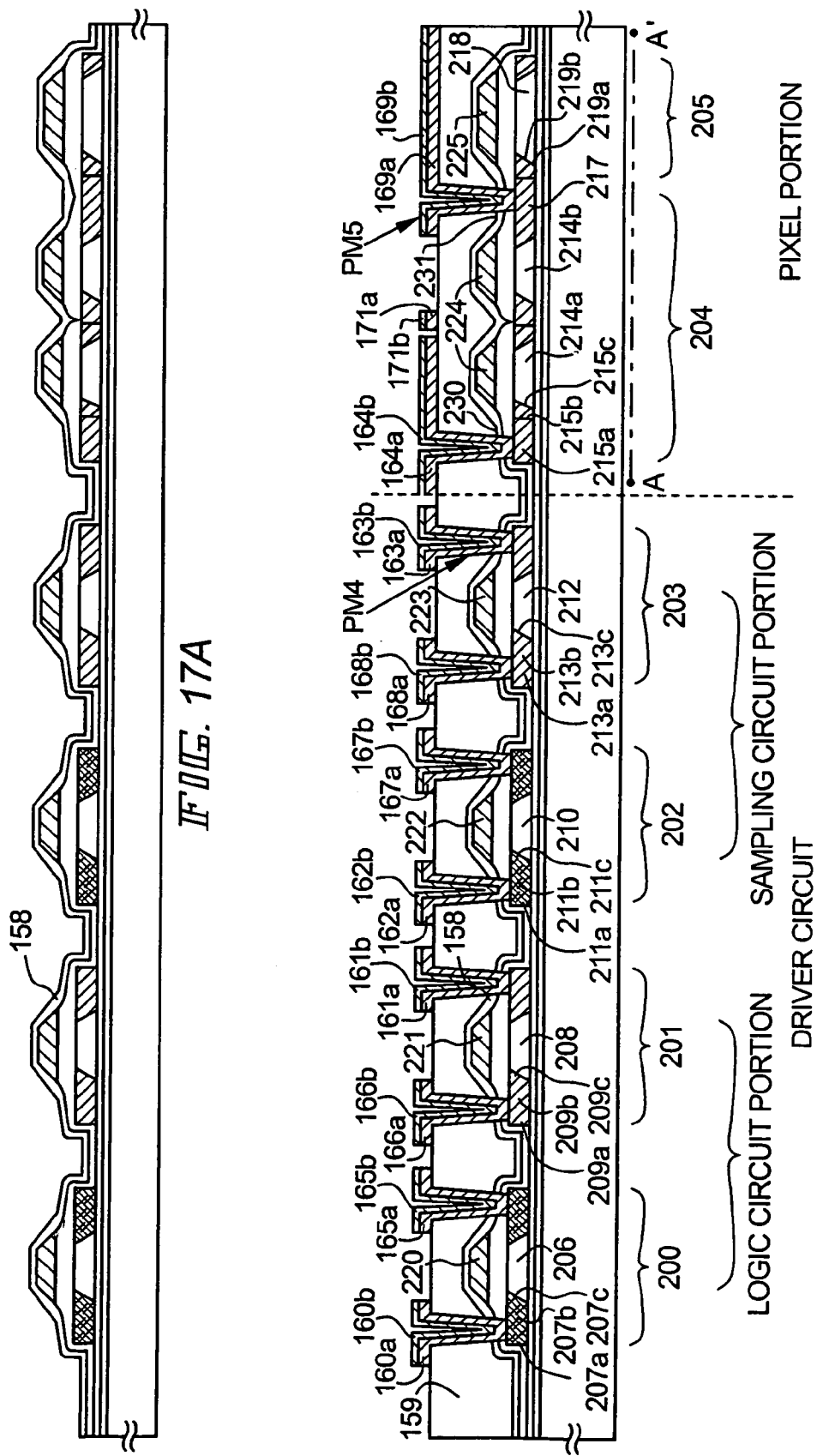

LOGIC CIRCUIT PORTION

SAMPLING CIRCUIT PORTION

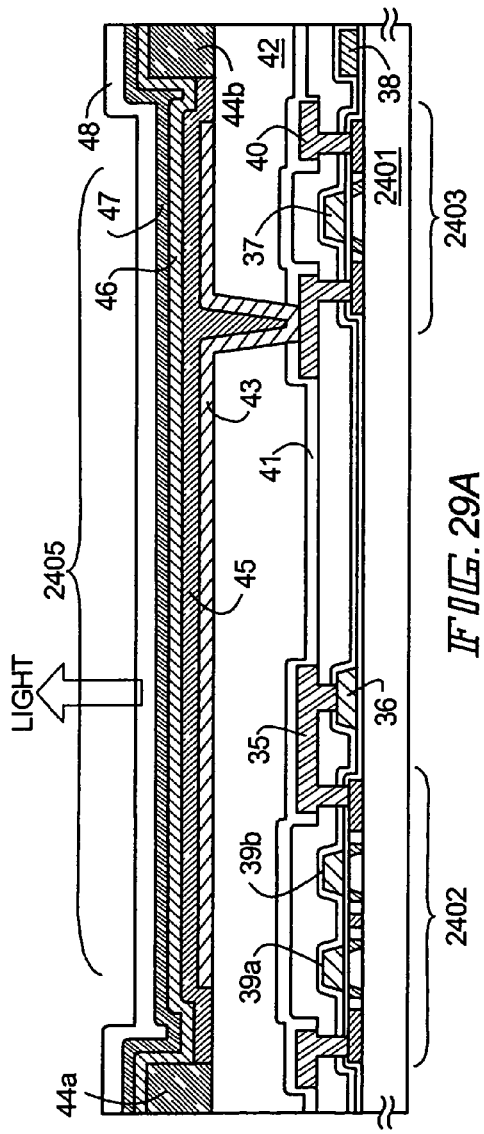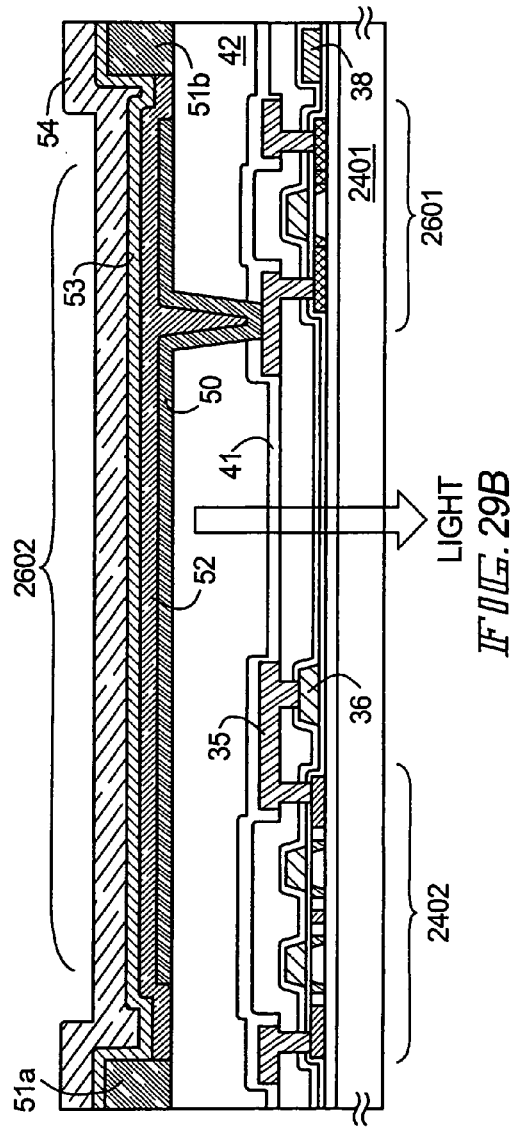
FIG. 29A
FIG. 29B

SEMICONDUCTOR DEVICE AND MANUFACTURING METHOD THEREOF

This application is a divisional of U.S. application Ser. No. 09/800,627 filed on Mar. 7, 2001 now U.S. Pat. No. 7,098,084.

BACKGROUND OF THE INVENTION

1. Field of the Invention

The present invention relates to a semiconductor device having a circuit constituted by a thin film transistor (hereafter referred to as a TFT), and to a method of manufacturing the semiconductor device. For example, the present invention relates to an electro-optical device, typically a liquid crystal display device, and to electronic equipment loaded with the electro-optical device as a part. Note that, throughout this specification, the term semiconductor device, indicates general devices which function by utilizing semiconductor characteristics, and that the above electro-optical device and electronic equipment fall under the semiconductor device category.

2. Description of the Related Art

Techniques for crystallizing and increasing crystallinity of an amorphous semiconductor film formed on an insulating substrate such as glass by performing heat treatment, laser annealing, or both heat treatment and laser annealing have been widely researched. Silicon is often used in the semiconductor film.

Crystalline semiconductor films obtained in accordance with the above techniques are made from a plurality of crystal grains, and therefore it is referred to as polycrystalline semiconductor films. The polycrystalline semiconductor films have extremely high mobility in comparison with amorphous semiconductor films. A monolithic type liquid crystal electro-optical device (a semiconductor device in which thin film transistors (TFTs) for driving pixels and for a driver circuit are manufactured on one substrate), which cannot be realized by a semiconductor device manufactured using a conventional amorphous semiconductor film, for example, can therefore be manufactured if a polycrystalline semiconductor film is utilized.

The polycrystalline semiconductor films are thus semiconductor films which have extremely good characteristics compared to amorphous semiconductor films. This is why the above stated research is being carried out. For example, it is necessary to perform a heat treatment at temperature equal to or greater than 600° C., and for a heat treatment time equal to or greater than 10 hours, preferably equal to or greater than 20 hours, to perform crystallization of an amorphous semiconductor film. Substrates, which can withstand these crystallization conditions, include quartz substrates, for example. However, quartz substrates are high cost, poor for processability, and in particular, they are extremely difficult to be processed into a large surface area. Increasing the surface area of the substrate is indispensable for raising mass production efficiency, in particular. Work towards increasing the surface area of the substrate for increasing mass production efficiency has been remarkable in recent years, and a substrate size of 600×720 mm is becoming a standard more and more for newly constructed mass production lines.

The processing of a quartz substrate into this type of large surface area substrate is difficult with present techniques, and even if it were possible, the price thereof will not be reduced to the extent that the industry may be established. Glass is available, for example, as a material which can easily be manufactured into a large surface area substrate. A glass substrate referred to as Corning 7059 exists, for example, as this type of glass substrate. Corning 7059 is extremely low cost, has good processability, and is easily made into a large surface area substrate. However, Corning 7059 has a softening temperature of 593° C,. and has a problem in heat treatment at 600° C. or higher.

Corning 1737 exists as one of glass substrates with a relatively high softening temperature. The softening temperature is high at 667° C. If an amorphous semiconductor film is formed on a Corning 1737 substrate, and the substrate is then placed in a 600° C. atmosphere for 20 hours, there is almost no change in shape of the substrate which will influence manufacturing. However, a heat treatment time of 20 hours is too long in a mass production process, and from the viewpoint of costs, it is preferable to lower the heat treatment temperature of 600° C., even by a small amount.

A novel method of crystallization has been proposed in order to resolve such problems. The method is disclosed in detail in Japanese Patent Application Laid-open No. Hei 7-183540. A simple explanation thereof is presented here. First, a very small amount of an element such as nickel, palladium, or lead is added to an amorphous semiconductor film. Methods such as plasma processing, evaporation, ion injection, sputtering, or liquid application can be utilized as the method for the addition. After the addition, if the amorphous semiconductor film is placed, for example, in a 550° C. nitrogen atmosphere for 4 hours, a polycrystalline semiconductor film having good characteristics can be obtained. The optimal heat treatment temperature and heat treatment time for crystallization are dependent upon the amount of the element added and the state of the amorphous semiconductor film.

A method of crystallization of an amorphous semiconductor film by heat treatment is described above. On the other hand, the temperature of the substrate does not increase very much with crystallization by laser annealing and high energy can be imparted to only the amorphous semiconductor film, and therefore substrates such as plastic substrates can also be used, in addition to glass substrates with low softening temperature.

Lasers such as an excimer laser, and an Ar laser can be given as examples of lasers which can be used in laser annealing. A method for performing laser annealing in which: a pulse laser beam of a high output is processed into a square spot of several centimeters in size, or into a linear shape having a length equal to or greater than 10 cm, by an optical system on an irradiation surface; and in which the laser beam is then scanned (or the laser beam irradiation position is moved relatively with respect to the irradiation surface), has high productivity and is industrially superior. This method is therefore used preferably.

In particular, when a laser beam of which the shape is linear on the irradiation surface (hereafter referred to as a linear beam) is used, the entire surface to be irradiated can be irradiated by scanning the linear beam in only a perpendicular direction to the linear direction of the linear beam, while it is necessary to scan forward and backward, and left and right in the case of using a spot laser beam, and productivity is therefore high. Scanning in a perpendicular direction to the linear direction is performed because it is the most efficient scanning direction. It is becoming a present tendency to use pulse emission excimer laser processed into a linear beam by a suitable optical system for laser annealing, due to this high productivity.

Further, there is also a method of performing crystallization of an amorphous semiconductor film by laser annealing after crystallization is performed by heat treatment. It may make the characteristics of the semiconductor film better to perform this method, compared to performing only heat treatment or only laser annealing. In order to obtain high characteristics, the conditions of heating and laser annealing require to be optimized. When For example, the thin film transistor (TFT) is manufactured by a known method, using a polycrystalline semiconductor film that is obtained in accordance with the method described above, electric characteristics of the TFT may be markedly improved.

SUMMARY OF THE INVENTION

In order to obtain a semiconductor film having a higher electric characteristics, there is a method, for example, in which additional laser annealing is performed after performing crystallization of an amorphous semiconductor film by heat treatment. It can make increase the characteristics of the semiconductor film to use this method, compared to cases of using either one of heat treatment and laser annealing. It is necessary to optimize the heat treatment conditions and the laser annealing conditions in order to obtain good electric characteristics. When a polycrystalline semiconductor film obtained using this method is made into an active layer of a thin film transistor (TFT), there are also cases where the fluctuation of the electric characteristics becomes remarkable, though the electric characteristics of the TFT are greatly increased. The fluctuation of electric characteristics causes failure such as display dispersion when an active matrix liquid crystal display device is manufactured using the thin film transistors (TFTs) obtained in accordance with the method described above, for instance. An object of the present invention is, therefore, to manufacture the TFT of high quality with suppressing the fluctuation of the electric characteristics.

The inventors of the present invention thought the cause of the fluctuation of electric characteristics of the TFT resides in a crystallization process. As described above, in order to obtain the TFT having the higher electric characteristics, for example, in the crystallization process, it is necessary to heat the amorphous semiconductor film and further perform a laser annealing. If these heating step and laser annealing step can be optimized, there is a possibility of being capable of suppressing the fluctuation of electric characteristics of the TFT.

First, an attention is given to the heating step, and the optimization of the step is conducted. In performing an experiment for optimization, an amorphous silicon film is used as the amorphous silicon semiconductor. After carrying out the heat treatment of the amorphous semiconductor film, a polycrystalline silicon film, in which crystallized portion and amorphous portion are intermingled, may be obtained depending upon the heating conditions. To analyze the intermingled state in detail, the following experiment has been conducted.

First, an experiment in which the heat treatment time is varied in performing heat treatment of an amorphous silicon film is explained. A 100 nm thick oxynitride silicon film and a 55 nm thick amorphous silicon film are formed on a glass substrate of 5 inch square using a plasma CVD apparatus. Note that, throughout this specification, the term, oxynitride silicon film indicates an insulating film expressed by $SiO_xN_y$, including silicon, oxygen, and nitrogen at predetermined ratios. An aqueous nickel acetate solution (5 ppm concentration by weight, 5 ml volume) is then applied by spin coating to the surface of the amorphous silicon film, employing the method disclosed in Japanese Patent Application Laid-open No. Hei 7-183540. Then, heating is performed in a 500° C. nitrogen atmosphere for 1 hour, and additionally at a temperature of 550° C. for 4 hours, 8 hours, or 12 hours to form a polycrystalline silicon film. The polycrystalline silicon film, observed at a magnification of 500× in the bright-field transmission mode of an optical microscope, is shown in FIGS. 1A, 1B, and 1C. FIG. 1A the polycrystalline silicon film after heating for 4 hours at 550° C., FIG. 1B is the polycrystalline silicon film for heating for 8 hours at 550° C., and FIG. 1C is the polycrystalline silicon film heat treated for 12 hours at 550° C., respectively.

Crystallization by heating under the above mentioned conditions produces a mixture of crystallized regions (white color regions denoted by reference numeral 5001 in FIG. 5B) and amorphous regions (black color regions denoted by reference numeral 5002 in FIG. 5B). It is possible to expect here, comparing FIGS. 1A to 1C and FIG. 5B, that the longer heating time is made, the more black color region is reduced in the crystallized region and the amorphous region. Accordingly, it is concluded that the white color region 5001 is a crystallized region and the black region 5002 is an amorphous region in FIG. 5B. In this specification, the amorphous portion surrounded by the polycrystalline regions is referred to as an amorphous region. That is, the black color region 5002 in FIG. 5B is one of the amorphous regions. The respective surface areas of the amorphous regions were analyzed using image processing for the purpose of analyzing in detail the polycrystalline silicon film having infinite number of the amorphous regions as seen in FIG. 5B.

A method of image processing is explained here. A photograph taken by a digital camera, which is observed in a bright-field transmission mode using an optical microscope, is shown in FIG. 2a. In order to separate the amorphous regions and the crystallized regions, image processing is performed on the photograph and to convert into two gray-scales. There are methods of directly converting the photograph into two gray-scales, but the influence of the difference in brightness between the center and the edge portions of the photograph appears strongly. In order to suppress such influence of brightness and darkness, it is better to separate the photograph into RGB (red, green, blue) or CMYK (cyan, magenta, yellow, black), etc., and then to form the two gray-scales. The image processing can easily be performed if a method of separating the photograph by RGB is used. In this experiment, the color of the photograph is separated by RGB. However, the color may be separated by CMYK, etc., depending upon the object to be analyzed.

The color of FIG. 2A is separated into an R (red), a G (green), and a B (blue), which are shown in FIGS. 2B, 3A, and 3B, respectively. FIG. 4 shows gray-scale (density) histograms based on the respective photographs separated into the R (red), the G (green), and the B (blue). According to FIG. 4, two peaks appear before separating into the R (red), the (blue), and the G (green). However, if separating into three of the R (red), the (blue), and the G (green) is performed, though only one peak appears in the R (red) and the B (blue), two peaks appear in the G (green). It is therefore understood that the amorphous regions and the crystallized regions can only be separated in the G (green). FIG. 5A shows the image changed into two gray-scales for the purpose of separating the G (green) image into the amorphous portion and the crystal portion. Then, the line for separating into two gray-scales is provided at the lowest minimum value existing between the two peaks of the G (green) as shown in FIG. 4.

Then, the G image is separated at the lowest minimum existing between the two peaks shown in FIG. 4, and changed into two gray-scales as shown in FIG. 5A. An area of the amorphous region in FIG. 5A is calculated using an image processing software (NIH-Image). The relationship between the heating time and the total area of the amorphous regions with respect to the total area of the silicon film after heat treatment is shown in FIG. 6A. From FIG. 6A, the longer the heat treatment time is, the lower the ratio of the total area of the amorphous regions becomes.

Further, the area of each of the amorphous regions in FIG. 5A is calculated using the image processing software (NIH-Image), and the results are shown in FIG. 6B. FIG. 6B is a probable statistical distribution diagram, and the horizontal axis shows the respective surface areas of the amorphous regions, whereas the vertical axis shows the probability. FIG. 6B is a probable statistical distribution diagram in which the circular symbols show the probability of the respective surfaces of the amorphous regions contained in the polycrystalline silicon film shown in FIG. 1A. Triangle symbols similarly show the one shown in FIG. 1B, and X shape symbols similarly show the one shown in FIG. 1C. From FIG. 6B, it can be seen that although amorphous regions having areas equal to or greater than 10 $\mu m^2$ exist after heating for 4 hours, they do not exist after heating for 8 hours or 12 hours. In addition, the fluctuation of the areas of the amorphous regions after heating for 4 hours is larger than that of the other cases.

Laser annealing is then performed to each of the polycrystalline silicon films shown in FIGS. 1A, 1B and 1C. Then, thin film transistors (TFTs) are formed based on the polycrystalline silicon films, and the electric characteristics of n-channel are measured. The results of measurements are shown in the probable statistical distribution diagrams of FIGS. 7A to 7C. The circle, triangle, and x shape symbols used in FIGS. 7A to 7C correspond to conditions which are explained in FIG. 6B. That is, the circle symbol shows the electric characteristics of the TFT formed using the polycrystalline silicon film obtained by heating at 550° C. for 4 hours, the triangle symbol shows the electric characteristics of the TFT formed using the polycrystalline silicon film obtained by heating at 550° C. for 8 hours, and the X shape symbol shows the electric characteristics of the TFT formed using the polycrystalline silicon film obtained by heating at 550° C. for 12 hours. FIG. 7A shows the Vth with respect to the area of the amorphous regions, FIG. 7B shows the S value with respect to the area of the amorphous regions, and FIG. 7C shows the mobility with respect to the area of the amorphous regions. Large fluctuations have developed in the characteristics in the case of heating for 4 hours, compared to the characteristics of in the case of heating for 8 hours or 12 hours. In other words, it can be seen from FIG. 6A and FIG. 7A to 7C that if the ratio of the total area of the amorphous regions with respect to the total area of the silicon film, fluctuation of the electric characteristics develops. Further, from FIG. 6B and FIGS. 7A to 7C, it is seen if relatively large area amorphous regions exist in the silicon film, fluctuation of electric characteristics develops.

Description on the other experimental results will be made. In the above-mentioned experiment, the concentration by weight of nickel acetate solution is set as 5 ppm, 10 ppm thereof is used in this experiment. In addition, in this experiment, the heating temperature is varied in place of varying the heating time, and a correlation is examined between the probable statistical distribution diagram of areas of amorphous regions and the TFT characteristics, in the polycrystalline silicon film obtained through the heating.

A 100 nm thick oxynitride silicon film and a 55 nm thick amorphous silicon film are formed on a glass substrate of 5 inch square using a plasma CVD apparatus. An aqueous nickel acetate solution (10 ppm concentration by weight, 5 ml volume) is then applied to the surface of the amorphous silicon film by spin coating. Next, heating is carried out in a 500° C. nitrogen atmosphere for 1 hour, and additionally, successively, heating for 4 hours at a temperature of 550° C., 575° C., or 600° C. is carried out in a nitrogen atmosphere to thereby form a polycrystalline silicon film. The polycrystalline silicon film, observed at a magnification of 500× in the bright-field transmission mode of an optical microscope, is shown in FIGS. 8A, 8B, and 8C. FIG. 8A is a photograph of the polycrystalline silicon film after heating at 550° C., FIG. 8B is a photograph of the polycrystalline silicon film after heating at 575° C., and FIG. 8C is a photograph of the polycrystalline silicon film after heating at 600° C.

Image processing performed in FIG. 2A is also similarly performed to FIGS. 8A to 8C, and the polycrystalline silicon film is separated into amorphous regions and crystallized regions. The relationship between the heating temperature and the ratio of the total area of the amorphous regions with respect to the total area of the silicon film is shown in FIG. 9A. It can be seen from FIG. 9A that the higher the heating temperature becomes, the less observable the amorphous regions become. In particular, almost no amorphous region is observed by the optical microscope (magnification of 500× in the bright-field) in the polycrystalline silicon film obtained by heating at 600° C.

Further, each area of the amorphous regions separated by the image processing is shown in a probable statistical distribution diagram in FIG. 9B. In FIG. 9B, circular symbols show the probable statistical distribution on the silicon film after heating at 550° C. triangular symbols at 575° C., and x shape symbols at 600° C. From FIG. 9B, amorphous regions having a size equal to or greater than 0.3 $\mu m^2$ exist in the films after heating at 550° C. and at 575° C., but amorphous regions having a size equal to or greater than 0.3 $\mu m^2$ do not exist in the film after heating at 600° C.

Laser annealing of the polycrystalline silicon film obtained by heating at each temperature is then performed while varying the conditions of the laser power. Then, measurements of the electric characteristics of n-channel TFTs manufactured based upon the polycrystalline silicon films are performed and the results are shown in FIGS. 10A to 10H, and in FIGS. 11A to 11D. FIGS. 10A to 10D show the distribution of the electric characteristics of the TFT obtained after heating at 500° C. for 1 hour in a nitrogen atmosphere, and additionally, successively, heating at 550° C. for 4 hours in a nitrogen atmosphere. FIGS. 10E to 10H show the distribution of the electric characteristics of the TFT obtained after heating at 500° C. for 1 hour in a nitrogen atmosphere, and additionally, successively, heating at 575° C. for 4 hours in a nitrogen atmosphere. FIGS. 11A to 11D show the distribution of the electric characteristics of the TFT obtained after heating at 500° C. for 1 hour in a nitrogen atmosphere, and additionally, successively, heating at 600° C. for 4 hours in a nitrogen atmosphere. FIG. 10A, FIG. 10E, and FIG. 11A show the Vth with respect to laser energy density, FIGS. 10B, 10F, and 11B show the S value with respect to the laser energy density; FIGS. 10C, 10G, and 11C show the shift with respect to the laser energy density; and FIGS. 10D, 10H, and 11D show the mobility with respect to the laser energy density. The term, shift refers to the value of the gate voltage when the drain current rises.

Comparing FIGS. 10A to 10H and FIGS. 11A to 11D, the electric characteristics of TFTs manufactured based upon the polycrystalline semiconductor film obtained by heating at 500° C. for 1 hour in a nitrogen atmosphere, and additionally, successively, heating at 600° C. for 4 hours in a nitrogen atmosphere, are most influenced by changes in the laser power. In other words, if almost no amorphous region exists in the polycrystalline silicon film after the heat treatment, then the electric characteristics vary greatly due to laser power energy variation. In other words, the correlation is satisfied between the facts that almost no amorphous region exists in the polycrystalline silicon film obtained after heating temperature at 600° C., as shown in FIGS. 9A and 9B, and that the electric characteristics of the TFT relatively greatly vary in accordance with the conditions of the laser power, as shown in FIGS. 10A to 10H and FIGS. 11A to 11B.

It can be seen, as stated above, that there is a correlation between the total area of the amorphous regions that are not crystallized by heating of the amorphous silicon film, and the electric characteristics of the TFT. Further, it can be seen that there is a correlation between each area of the amorphous regions that are not crystallized, and the electric characteristics of the TFT. According to the present invention, a polycrystalline silicon film is obtained by using the following methods. A metallic element that promotes a crystallization or an improvement of crystallinity of the amorphous silicon film is introduced onto the amorphous silicon film, and heat treatment is performed to the amorphous silicon film to thereby crystallize it.

Specifically speaking, a small amount of an element (a metallic element for promoting crystallization) is introduced into an amorphous silicon film by utilizing a method such as plasma processing, evaporation, sputtering, ion injection, or liquid application, and the amorphous silicon film is crystallized by performing heat treatment. In particular, in the present invention, it is important that the entire of the amorphous semiconductor film is not crystallized in the heat treatment, but rather the polycrystalline silicon film is manufactured such that the total area of amorphous regions contained within a region which becomes an active layer of one TFT is from 1.0 to 8.0% with respect to the area of the region which becomes the active layer of the TFT, preferably between 1.0 and 6.0%. In other words, it is important to manufacture the polycrystalline silicon film in which 92 to 99%, preferably 94 to 99% of the region that becomes the active layer of the TFT is crystallized. This is extremely important in order to increase the electric characteristics. It is noted that the region which becomes the active layer of the TFT is manufactured within a region in which crystal growth occurs, from the region in which the metallic element is introduced toward its periphery.

As it is stated it is preferable that the total area of the amorphous regions contained within the region which becomes the active layer of the TFT is from 1.0 to 8.0%, preferably between 1.0 and 6.0%, with respect to the area of the region which becomes the active layer, the basis is explained. First, the lower limit value of 1.0% is explained. The total area of the amorphous regions after heating for 4 hours at 575° C. in a nitrogen atmosphere is 1.75% of the total area of the polycrystalline silicon film, while the total area of the amorphous regions after heating for 4 hours at 600° C. in a nitrogen atmosphere is 0.00% of the total area of the polycrystalline semiconductor film.

Further, as seen from FIGS. 11A to 11D, the electric characteristics of a TFT manufactured based upon a polycrystalline silicon film heated at 600° C. and then laser annealed are greatly influenced by the variation of the laser power energy at the time of laser annealing. Existing laser oscillators which are suitable for laser annealing have large fluctuation in laser power, and depending upon the semiconductor device to be manufactured, the fluctuation becomes a cause of lowering yields. Therefore, a silicon film, which varies sensitively in the electric characteristics of the TFT with respect to the laser power, is not suitable for mass production.

It is therefore necessary that the total area of the amorphous regions after heat treatment be equal to or greater than 1.0% of the total area of the polycrystalline silicon film. However, it is preferable that the total area of the amorphous regions with respect to observed regions be equal to or greater than 1.0% even when the surface observation of the polycrystalline silicon film is performed locally. The smallest observed region is taken as a region which becomes an active layer of one TFT, and the total area of the amorphous regions contained within the region which becomes the active layer of the TFT is set to be equal to or greater than 1.0% with respect to the area of the region which becomes the active layer of the TFT.

The reason why the upper limit value is set to 8.0%, preferably 6.0%, for the total area of the amorphous regions contained within the region which becomes the active layer of the TFT, with respect to the surface area of the region which becomes the active layer of one TFT, is explained next. The total area of the amorphous regions after performing the heat treatment for 4 hours at 550° C. in a nitrogen atmosphere is 9.25% of the total area of the polycrystalline silicon film, while the total area of the amorphous regions after performing the heat treatment for 8 hours at 550° C. in a nitrogen atmosphere is 5.63% of the total area of the polycrystalline silicon film. From FIGS. 7A to 7C, it is found that the fluctuation of the electric characteristics of a TFT manufactured based upon a polycrystalline silicon film, performed heat treatment for 4 hours and then laser annealing, is remarkable. Therefore, the upper limit is set to 8.0%, preferably 6.0%. With the similar reason to the case of determining the lower limit value, the total area of the amorphous regions contained within the region which becomes the active layer of the TFT is understood.

Further, if laser annealing is performed to the polycrystalline silicon film in which the area of the amorphous regions is less than or equal to 10.0 $\mu m^2$, and the area of at least one amorphous region is equal to or greater than 0.30 $\mu m^2$, and a TFT is manufactured based on the polycrystalline silicon film thus obtained, the fluctuation of electric characteristics of the TFT is minimized in this experiment. This is given as one of features of the present invention.

The upper limit of the area of the amorphous regions is set to 10.0 $\mu m^2$, because, as shown in FIG. 7A to 7C, the fluctuation of the electric characteristics of TFTs, which are manufactured based upon a polycrystalline silicon film with amorphous regions equal to or greater than 10.0 $\mu m^2$ in area to which laser annealing has been performed, is extremely large. The fact that an area of at least one of the amorphous regions is set to equal to or greater than 0.30 $\mu m^2$ is defined as one of the features of the present invention, because, as shown in FIGS. 10A to 10H and FIGS. 11A to 11D, when the laser annealing is performed after the heat treatment to the polycrystalline silicon film in which no amorphous region having an area of equal to or greater than 0.30 $\mu m^2$ exists, the electric characteristics of a TFT fluctuate greatly due to the laser power. Existing laser oscillators, which are suitable for laser annealing, have large fluctuation in laser power, and therefore depending upon the semiconductor device to be manufactured, the fluctuation becomes a cause of lowering yields. Therefore, the process, with which the electric characteristics of the TFT varies with respect to the laser power, is not suitable for mass production.

A semiconductor device is manufactured based on the polycrystalline silicon film manufactured through the above processes. The semiconductor device includes thin film transistors (TFTs), diodes, optical sensors, and the like, but all of them can be manufactured based on the polycrystalline silicon film.

As described above, a method of crystallizing an amorphous silicon film by heating is optimized. Subsequently, a method of laser annealing of a polycrystalline silicon film crystallized by heating is optimized. FIG. 12 shows a wave length dependency of an absorption coefficient of a polycrystalline silicon film and an amorphous silicon film. In a wave length region of excimer laser (351 nm or less) frequently used for laser annealing of non-single crystalline silicon film, the polycrystalline silicon film and amorphous silicon film have both a high absorption coefficient. Therefore, the excimer laser are frequently used for laser annealing of a polycrystalline silicon film or an amorphous silicon film.

In a case of manufacturing a TFT using polycrystalline silicon film obtained only by heat treatment while adding the metallic element, in comparison with a TFT manufactured with further performing laser annealing, a TFT with high electric characteristics cannot be obtained. For example, in a polycrystalline silicon film obtained with a heating temperature of 600° C. in the experiment disclosed in this specification, externally there is hardly no amorphous region remaining. However, if a TFT is manufactured based on the above polycrystalline silicon film, high electric characteristics could not be obtained. From the above facts, it may be assumed that with only a heating process at 600° C. or a lower temperature for 12 hours or less, even if a metal element that promotes crystallization as disclosed in this specification is used and the crystallization is apparently mostly performed, there remains small amorphous portions, so that a high electric characteristic may not be obtained.

FIG. 35A shows an SEM photograph of the silicon film when an amorphous silicon film with a thickness of 55 nm is heated for 4 hours in a nitrogen atmosphere at 550° C. after adding a nickel acetate aqueous solution with a concentration of 10 ppm by weight by a spin coating method. FIG. 35B shows an SEM photograph of the silicon film after laser annealing is performed to the silicon film shown in FIG. 35A, in which an XeCl excimer laser of a wave length of 308 nm is irradiated with an energy density of 400 mJ/cm$^2$. The condition of 400 mJ/cm$^2$ is a condition to obtain a TFT with the highest electric characteristics. In the photographs of FIGS. 35A and 35B, it is hard to see the state of the surface, so an emphasized surface state by an appropriate image processing is shown in FIGS. 36A and 36B. The photographs of FIGS. 35A and 35B, correspond to those of FIGS. 36A and 36B, respectively.

As can be seen from FIG. 36, on the surface of the polycrystalline silicon film obtained by performing only the heat treatment, amorphous regions (island-like regions in the figures) are seen existing dotted in the variously shaped continuous crystals, whereas on the surface of the polycrystalline silicon film obtained by performing laser annealing in addition to the heat treatment, there are seen many grains surrounded by something like a deep groove. The deep groove is a grain boundary of a single crystal contained in a polycrystalline silicon film. In the boundary, single crystals are contacted with each other discontinuously, which is the cause of deterioration of the TFT characteristics. On the other hand, on the surface of the polycrystalline silicon film obtained by performing only the heat treatment, significant boundaries are not visualized, crystal regions are continuously connected, and amorphous regions are dotted so as to fill the gap. A non-single crystal silicon film in such a state differ from a sate in which single crystals exist in plural, since the grain boundaries of the single crystals are not clear. However, for the simplicity, in this specification, they will be referred to as a polycrystalline silicon film.

As described above, with only the heat treatment of an amorphous silicon film, a polycrystalline silicon film with sufficiently high characteristics is not obtained. This is because, with only a heat treatment, it is not possible to completely clear the amorphous regions within the obtained polycrystalline silicon film. The electric characteristics of the polycrystalline silicon film obtained by performing laser annealing after the heat treatment is high, because the amorphous regions remaining after the heat treatment are crystallized by laser annealing.

However, if laser annealing is performed with a conventional excimer laser to a polycrystalline silicon film obtained by the heat treatment, the laser beam is sufficiently absorbed even by the portion crystallized by the heat treatment so that the history of crystallization by the heat treatment is mostly eliminated. Namely, the polycrystalline silicon film obtained by the heat treatment is almost completely melted by laser annealing with an excimer laser, thereafter crystallized. With this, the shape of the polycrystalline silicon film formed by the heat treatment, in which the grain boundaries of the single crystals formed by the heat treatment are not clear, is completely eliminated.

As described above, the polycrystalline silicon in which the boundaries single crystals are not clear are used, there is a higher possibility of obtaining a TFT with high electric characteristics. Therefore, if energy can be given to only amorphous regions contained in the polycrystalline silicon film in which the crystal regions obtained by the heat treatment are continuously connected, only the amorphous regions may be crystallized without destroying the shape of the crystal region The inventors of the present invention gave an attention to the wave length dependency of the absorption coefficients of the polycrystalline silicon and the amorphous silicon, and found a method of giving energy mainly to the amorphous region contained in the polycrystalline silicon film. Namely, if a laser beam with a wave length region which gives more energy to the amorphous region, compared to the crystalline region, is used as means for laser annealing, it is possible to perform laser annealing mainly to only the amorphous regions. A wave length region of such laser beam is, as may be seen from FIG. 12, in the range of 360 to 650 nm, preferably 400 to 600 nm. This range is an effective range only in the case that the irradiation object of the laser beam is a polycrystalline silicon film having amorphous regions. Therefore, if the semiconductor film to be an irradiation object differs, the range has to be set again. It may be easily assumed that this invention may be applied to other semiconductor films except the silicon film.

In a case of using an amorphous silicon film as an amorphous semiconductor film, in order to perform laser annealing with the structure remaining of the continuous crystalline region in a polycrystalline silicon film generated by heat treatment, it is essential that the wave length of the laser beam used is set to within the range of 360 to 650 nm, preferably 400 to 600 nm.

As the laser beam in the above wave length range, there is such as a second harmonic of a YAG laser, a second harmonic of a glass laser, an Ar laser, a second harmonic of a YLF laser, a second harmonic of a YVO$_4$ laser. Of those, particularly large output laser beam is obtained from such as the second harmonic of the YAG laser and the second harmonic of a glass laser.

A semiconductor device is manufactured using the polycrystalline silicon film manufactured through the above processes. As the semiconductor device, there are such as a thin film transistor (TFT), a diode and an optical sensor, which all can be manufactured based on the polycrystalline silicon film.

A manufacturing method of the present invention disclosed in the present specification is a method of manufacturing a semiconductor device, comprising:

a first step of introducing a metallic element for promoting crystallization of an amorphous semiconductor film into an amorphous semiconductor film;

a second step of partially crystallizing the amorphous semiconductor film by heat treatment to form a first polycrystalline semiconductor film; and a third step of irradiating a laser beam with a wave length of from 360 to 650 nm to the first polycrystalline semiconductor film to form a second polycrystalline semiconductor film, and characterized in that:

the first polycrystalline semiconductor film is crystallized in the range from 92 to 99% in a region which becomes an active layer of a TFT.

Another manufacturing method of the present invention is a method of manufacturing a semiconductor device, comprising:

a first step of introducing a metallic element for promoting crystallization of the amorphous semiconductor film into the amorphous semiconductor film:

a second step of partially crystallizing the amorphous semiconductor film by heat treatment to form a first polycrystalline semiconductor film; and a third step of irradiating a laser beam with a wave length of from 360 to 650 nm to the first polycrystalline semiconductor film to form a second polycrystalline semiconductor film, and characterized in that:

the first polycrystalline semiconductor film formed in accordance with the second step is crystallized in the range from 92 to 99% in a region which becomes an active layer of a TFT; and the second polycrystalline semiconductor film formed in accordance with the third step is crystallized equal to or greater than 99% in the region which becomes the active layer of the TFT.

Another manufacturing method of the present invention is a method of manufacturing a semiconductor device, comprising:

a first step of introducing a metallic element for promoting crystallization of an amorphous semiconductor film into an amorphous semiconductor film;

a second step of partially crystallizing the amorphous semiconductor film by heat treatment to form a first polycrystalline semiconductor film; and a third step of irradiating a laser beam with a wave length of from 360 to 650 nm to the first polycrystalline semiconductor film to form a second polycrystalline semiconductor film, and characterized in that:

the first polycrystalline semiconductor film is crystallized in the range from 94 to 99% in a region which becomes an active layer of a TFT.

Another manufacturing method of the present invention is a method of manufacturing a semiconductor device, comprising:

a first step of introducing a metallic element for promoting crystallization of the amorphous semiconductor film into the amorphous semiconductor film:

a second step of partially crystallizing the amorphous semiconductor film by heat treatment to form a first polycrystalline semiconductor film; and a third step of irradiating a laser beam with a wave length of from 360 to 650 nm to the first polycrystalline semiconductor film to form a second polycrystalline semiconductor film, and characterized in that:

the first polycrystalline semiconductor film formed in accordance with the second step is crystallized in the range from 94 to 99% in a region which becomes an active layer of a TFT; and the second polycrystalline semiconductor film formed in accordance with the third step is crystallized equal to or greater than 99% in the region which becomes the active layer of the TFT.

Another manufacturing method of the present invention is a method of manufacturing a semiconductor device, comprising the steps of:

introducing a metallic element for promoting crystallization of an amorphous semiconductor film into the amorphous semiconductor film;

partially crystallizing the amorphous semiconductor film in accordance with heat treatment to form a first polycrystalline semiconductor film; and irradiating a laser beam with a wave length of from 360 to 650 nm to the first polycrystalline semiconductor film to form a second polycrystalline semiconductor film, and characterized in that:

a region of each of amorphous regions in the first polycrystalline semiconductor film is equal to or less than 10.0 $\mu m^2$; and an area of at least one of the amorphous regions is equal to or greater than 0.30 $\mu m^2$.

In the inventions described above, the wave length is preferably from 400 to 600 nm so that a difference between absorption coefficients of the amorphous silicon film and the crystal silicon film becomes larger.

In the inventions described above, the metallic element is preferably one kind element or plural kinds of elements selected from the group consisting of Ni, Pd, Pt, Cu, Ag, Au, Al, In, Sn, Pb, P, As, and Sb, because the crystal growth is carried out better.

In the inventions described above, the metallic element is preferably one kind element or plural kinds of elements selected from the group consisting of periodic table group 8 elements, group 1B elements, group 3B elements, group 4B elements, and group 5B elements, because the crystal growth is carried out better.

In the inventions described above, the laser beam is preferably one of a YAG laser, $YVO_4$ laser, a YLF laser and an Ar laser, so that a laser beam with a desired wave length can be obtained.

In the inventions described above, the laser beam is preferably one kind selected from the group consisting of a second harmonic of a YAG laser, a second harmonic of a glass laser, an Ar laser, a second harmonic of a $YVO_4$ laser, and a second harmonic of a YLF laser, so that a laser beam with a desired wave length can be obtained.

In the inventions described above, the semiconductor device may be a liquid crystal display device, a light-emitting device, or an image sensor.

In the inventions described above, the semiconductor device may be a portable telephone, a video camera, a digital camera, a projector, a goggle type display, a personal computer, a DVD player, an electronic book, or a portable information terminal.

The structure of the present invention will be described below.

The invention disclosed in the present specification is a semiconductor device comprising a polycrystalline semiconductor film, characterized in that:

a metallic element for promoting crystallization of an amorphous semiconductor film is introduced into the amorphous semiconductor film;

a first polycrystalline semiconductor film is formed, in which 92 to 99% of a region which becomes an active layer of a TFT is crystallized by a heat treatment; and the second polycrystalline semiconductor film formed by irradiating a laser beam with a wave length of from 360 to 650 nm to the first polycrystalline semiconductor film, is used as the active layer of the TFT.

Another structure of the present invention is a semiconductor device comprising a polycrystalline semiconductor film, characterized in that:

a metallic element for promoting crystallization of an amorphous semiconductor film is introduced into the amorphous semiconductor film;

a first polycrystalline semiconductor film is formed, in which 94 to 99% of a region which becomes an active layer of a TFT is crystallized by a heat treatment, and the second polycrystalline semiconductor film formed by irradiating a laser beam with a wave length of from 360 to 650 nm to the first polycrystalline semiconductor film, is used as an active layer of a TFT.

Another structure of the present invention is a semiconductor device comprising a polycrystalline semiconductor film, characterized in that:

a metallic element for promoting crystallization of an amorphous semiconductor film is introduced into the amorphous semiconductor film;

a first polycrystalline semiconductor film is formed by heat treatment, in which an area of each of amorphous regions is equal to or less than 10.0 $\mu m^2$ and an area of at least one of the amorphous regions is equal to or greater than 0.30 $\mu m^2$; and the second polycrystalline semiconductor film formed by irradiating a laser beam with a wave length of from 360 to 650 nm to the first polycrystalline semiconductor film, is used as an active layer of a TFT.

Another structure of the present invention is a semiconductor device comprising a semiconductor film, characterized in that:

a metallic element for promoting crystallization of an amorphous semiconductor film is introduced into the amorphous semiconductor film;

a first polycrystalline semiconductor film is formed by heat treatment, in which an area of each of amorphous is equal to or less than 10.0 $\mu m^2$, and an area of at least one of the amorphous regions is equal to or greater than 0.30 $\mu m^2$; and a second polycrystalline semiconductor film formed by irradiating a laser beam with a wave length of from 400 to 600 nm to the first polycrystalline semiconductor film, is used as an active layer of a TFT.

Another structure of the present invention is a semiconductor device comprising: a silicon film; a gate insulating film; and a gate electrode on an insulating surface, characterized in that the silicon film is a second polycrystalline semiconductor film formed by a method comprising the steps of:

introducing a metallic element for promoting crystallization of an amorphous semiconductor film into the amorphous semiconductor film;

forming a first polycrystalline semiconductor film by heat treatment, in which 94 to 99% of a region which becomes an active layer of a TFT is crystallized; and irradiating a laser beam with a wave length of from 360 to 650 nm to the first polycrystalline semiconductor film to form the second polycrystalline semiconductor film.

Detailed description of the manufacturing method of the semiconductor device having a silicon film, a gate insulating film and a gate electrode on the insulating surface will be described with reference to embodiments of the present invention.

Another structure of the present invention is a semiconductor device comprising: a silicon film; a gate insulating film; and a gate electrode on an insulating surface, characterized in that the silicon film is a second polycrystalline semiconductor film formed by a method comprising the steps of:

introducing a metallic element for promoting crystallization of an amorphous semiconductor film into the amorphous semiconductor film;

forming a first polycrystalline semiconductor film by heat treatment, in which 94 to 99% of a region which becomes an active layer of a TFT is crystallized; and irradiating a laser beam with a wave length of from 400 to 600 nm to the first polycrystalline semiconductor film to form the second polycrystalline semiconductor film.

Detailed description of the manufacturing method of the semiconductor device having a silicon film, a gate insulating film and a gate electrode on the insulating surface will be described with reference to embodiments of the present invention.

Another structure of the present invention is a semiconductor device comprising: a silicon film; a gate insulating film; and a gate electrode on an insulating surface.

characterized in that: the silicon film is a second polycrystalline semiconductor film, which is obtained by:

introducing a metallic element or a compound containing the metallic element for promoting crystallization of an amorphous semiconductor film into the amorphous semiconductor film, and irradiating a laser beam to a first polycrystalline semiconductor film which is obtained by partially crystallizing with heat treatment:

an area of amorphous regions in the first polycrystalline semiconductor film is equal to or less than 10.0 $\mu m^2$;

an area of at least one of the amorphous regions is equal to or greater than 0.30 $\mu m^2$; and the wave length of the laser beam is from 360 to 650 nm.

Detailed description of the manufacturing method of the semiconductor device having a silicon film, a gate insulating film and a gate electrode formed on the insulating surface will be described with reference to embodiments of the present invention.

Another structure of the present invention is a semiconductor device comprising: a silicon film; a gate insulating film; and a gate electrode on an insulating surface, Characterized in that: the silicon film is a second polycrystalline semiconductor film, which is obtained by:

introducing a metallic element or a compound containing the metallic element for promoting crystallization of an amorphous semiconductor film into the amorphous semiconductor film, and irradiating a laser beam to a first polycrystalline semiconductor film which is obtained by partially crystallizing with heat treatment;

an area of amorphous regions in the first polycrystalline semiconductor film is equal to or less than 10.0 $\mu m^2$;

an area of at least one of the amorphous regions is a equal to or greater than 0.30 $\mu m^2$; and the wave length of the laser beam is from 400 to 600 nm.

Detailed description of the manufacturing method of the semiconductor device having a silicon film, a gate insulating film and a gate electrode formed on the insulating surface will be described with reference to embodiments of the present invention.

In the inventions described above, the metallic element is one kind element or plural kinds of elements selected from the group consisting of Ni, Pd, Pt, Cu, Ag, Au, Al, In, Sn, Pb, P, As, and Sb, because the crystal growth is carried out better In the inventions described above, the metallic element is one kind element or plural kinds of elements selected from the group consisting of periodic table group 8 elements, group 1B elements, group 3B elements, group 4B elements, and group 5B elements, because the crystal growth is carried out better.

In the inventions described above, the semiconductor device is a liquid crystal display device, a light-emitting device or an image sensor.

In the inventions described above, the semiconductor device is a portable telephone, a video camera, a digital camera, a projector, a goggle type display, a personal computer, a DVD player, an electronic book, or a portable information terminal.

BRIEF DESCRIPTION OF THE DRAWINGS

In the accompanying drawings:

FIGS. 10A to 10D are diagrams expressing the electric characteristics of an amorphous silicon film to which the heat treatment has been performed at 550° C. for 4 hours, and to which laser annealing is performed at various laser powers;

FIGS. 10E to 10H are diagrams expressing the electric characteristics of an amorphous silicon film to which the heat treatment has been performed at 575° C. for 4 hours, and to which laser annealing is performed at various laser powers;

FIG. 13 is an example of an optical system for forming a linear beam;

FIGS. 15A to 15D are cross-sectional views showing a manufacturing process of a pixel TFT and a TFT of a driver circuit;

FIGS. 16A to 16C are cross-sectional views showing a manufacturing process of the pixel TFT and the TFT of the driver circuit;

FIGS. 17A and 17B are cross-sectional views showing a manufacturing process of the pixel TFT and the TFT of the driver circuit;

FIGS. 29A and 29B are cross-sectional views of a pixel portion of the light-emitting device;

DETAILED DESCRIPTION OF THE PREFERRED EMBODIMENTS

[Embodiment Mode]

Description will be made on a method of manufacturing a polycrystalline silicon film, in which a total area of amorphous regions contained within a region which becomes an active layer of one TFT is from 1.0 to 8.0% with respect to an area of the region which becomes the active layer of the TFT, by partially crystallizing an amorphous silicon film. First, a Corning 1737 substrate with a thickness of 0.7 mm and 5 inch square is prepared. A 200 nm thick oxynitride silicon film is formed on the substrate using a plasma CVD apparatus, and then a 50 nm thick amorphous silicon film is formed on the surface of the oxynitride silicon film. A solution (volume 5 ml) containing 10 ppm by weight of an element for promoting crystallization is applied on the amorphous silicon film, and the heat treatment is performed in a nitrogen atmosphere for 1 hour at 500° C., and additionally for 4 hours at 550° C.

A polycrystalline silicon film is obtained in which the total area of amorphous regions contained within a region which becomes the active layer of the TFT is from 1.0% to 8.0% with respect to the area of the active layer of the TFT in accordance with the heat treatment. Further, the area of each of the amorphous regions is equal to or less than 10.0 $\mu m^2$, and the area of at least one of the amorphous regions is equal to or greater than 0.30 $\mu m^2$. The above-mentioned conditions for crystallization is rough standards to obtain a desired polycrystalline silicon film. An operator must optimize the conditions so that the area of the amorphous regions falls within a range indicated by the present invention.

Then laser annealing is performed by processing laser beam outputted from a laser oscillator into a linear beam using an optical system as shown in FIG. 13. The optical system will be described in detail in Embodiment 1. Further, if a laser oscillator with a relatively small output is used, the energy density is not sufficient to process the laser beam into a 10.0 cm or more long of linear beam, for example. Thus, the laser beam is irradiated so as to cover the entire substrate surface by condensing the laser beam sufficiently onto the surface on which objects to be irradiated are arranged. As the method of irradiating the laser beam, there is, for example, a method in which a galvanometer and an f-θ lens are used. Examples of the laser beam outputted from the laser oscillator with the relatively small output include a YVO$_4$ laser (second harmonic), a YLF laser (second harmonic), Ar laser, and the like. Thereafter, the TFT is manufactured using a known method or a method described in later embodiments.

Figure 14:
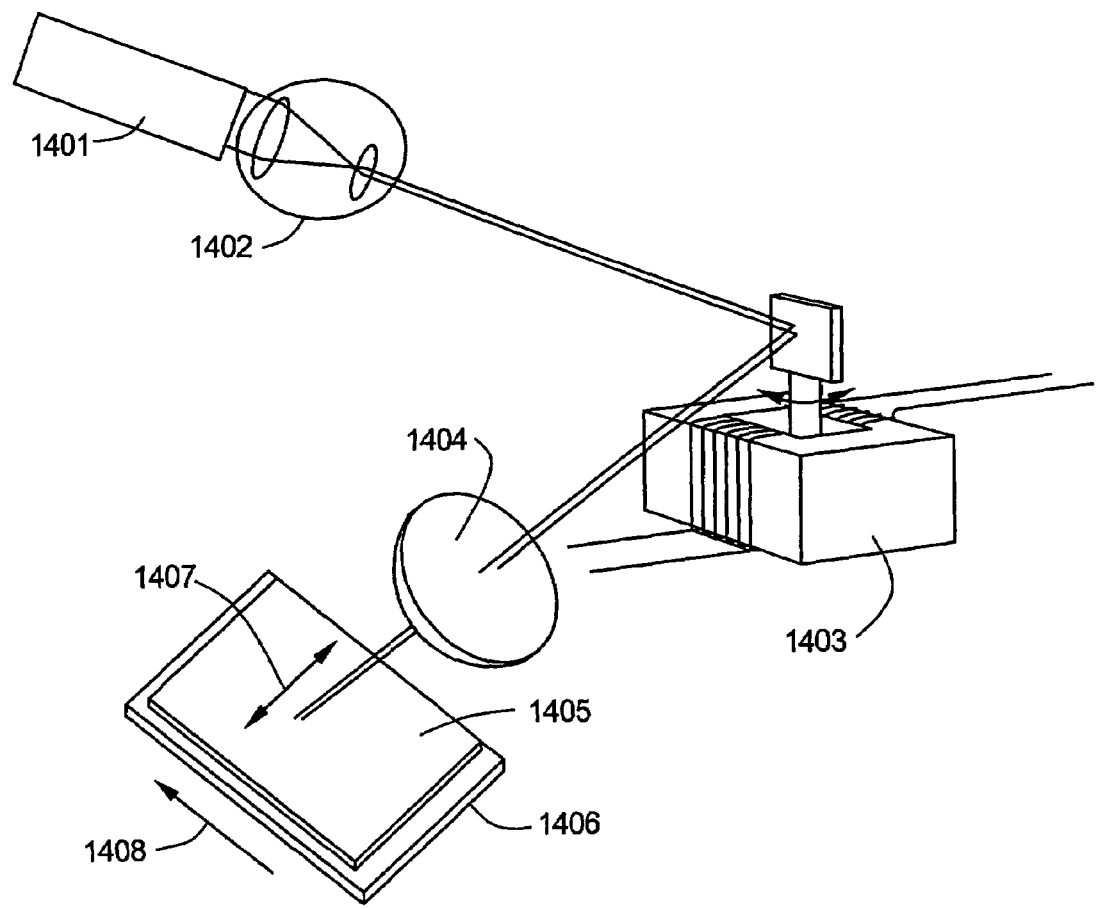
FIG. 14 is an example of an optical system using a galvanometer and an f-θ lens.

Further, if a laser oscillator with a small output is used, the energy density is not sufficient to process the laser beam into a 10.0 cm long linear laser, for example. Thus, the laser beam is irradiated so as to cover the entire substrate surface with a point light source. A method of irradiating using a galvanometer, for example, is used as a means. An example of an optical system for the method is shown in FIG. 14. Ar laser can be so far given as a typical laser oscillator in using the optical system. Examples of the laser beam outputted from the laser oscillator with the relatively small output include the YVO$_4$ laser (second harmonic), a YLF laser (second harmonic), and the like Laser annealing is performed onto the polycrystalline silicon film having amorphous regions by the methods described above. If a TFT is manufactured based on the polycrystalline silicon film, the fluctuation in the electric characteristics of the TFT is reduced.

In this Embodiment Mode, a description is made on a case in which an amorphous silicon film is used as an example of an amorphous semiconductor film. However, if a compound semiconductor film having an amorphous structure, such as an amorphous silicon germanium film, is employed there is no influence on the nature of the present invention.

[Embodiments]

[Embodiment 1]

A case of performing laser annealing using a second harmonic of an YAG laser in a laser annealing process of the present invention is explained in Embodiment 1.

A Corning 1737 substrate with a thickness of 0.7 mm and 5 inch square is prepared. A 200 nm thick oxynitride silicon film is formed on the substrate using a plasma CVD apparatus, and a 50 nm thick amorphous silicon film is formed on the surface of the silicon oxynitride film. A solution containing an element that promotes crystallization is then applied on the amorphous silicon film. When a nickel acetate solution is used, for example, the nickel acetate solution (concentration by weight 10 ppm, volume 5 ml) is applied onto the entire surface of the film by spin coating.

Heating is performed next for 1 hour at 500° C. in a nitrogen atmosphere, and additionally for 4 hours at 550° C. in a nitrogen atmosphere. The amorphous silicon film is partially crystallized by the heat treatment, and a polycrystalline silicon film is obtained in which the total area of amorphous regions contained in a region which becomes an active layer of one TFT is from 1.0% to 8.0% with respect to the area of the region which becomes the active layer of the TFT. Further, the area of the amorphous regions is equal to or less than 10.0 $\mu m^2$, and the area of at least one of the amorphous regions is equal to or greater than 0.30 $\mu m^2$. The above conditions for crystallization are rough standards to obtain a desired polycrystalline silicon film. An operator has to optimize the conditions so that the total area of the amorphous regions falls within the range indicated by the present invention.

Figure 1A:
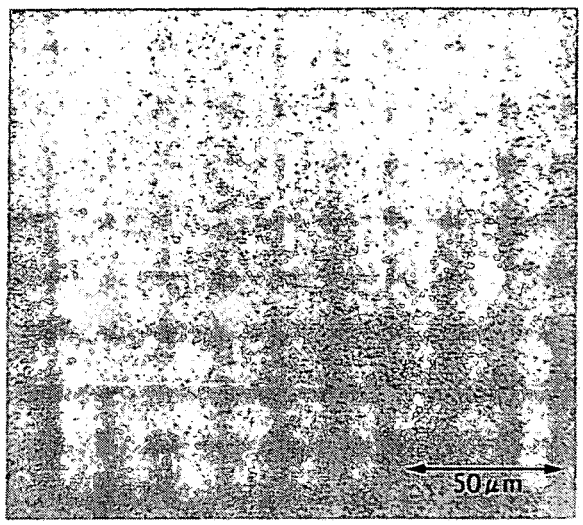
FIG. 1A is a photograph of an amorphous silicon film after conducting a heat treatment at 55020 C. for 4 hours.
Figure 1B:
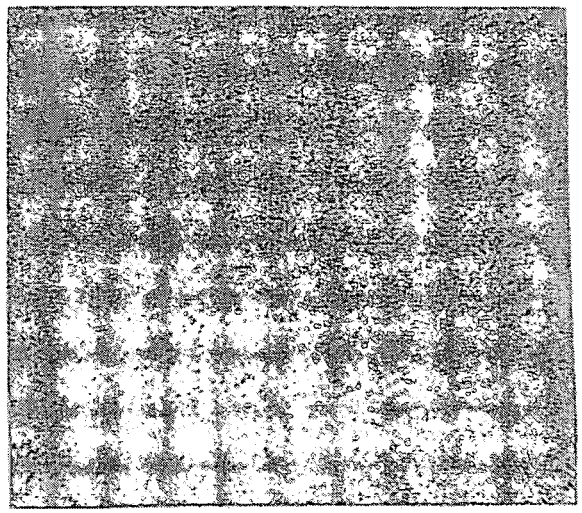
FIG. 1B is a photograph of an amorphous silicon film after conducting the heat treatment at 550° C. for 8 hours.
Figure 1C:
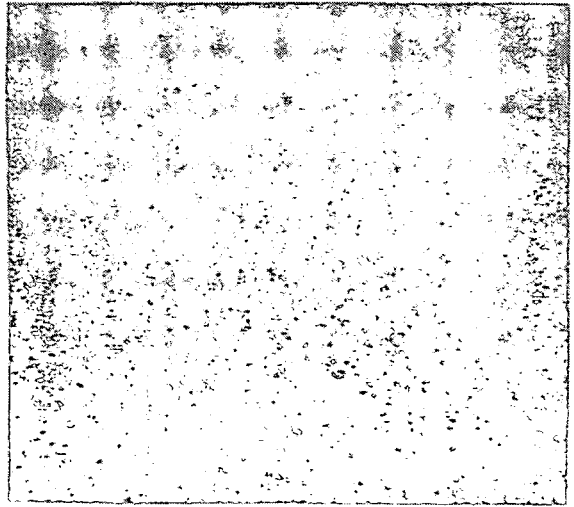
FIG. 1C is a photograph of an amorphous silicon film after conducting the heat treatment at 550° C. for 12 hours.
Figure 2A:
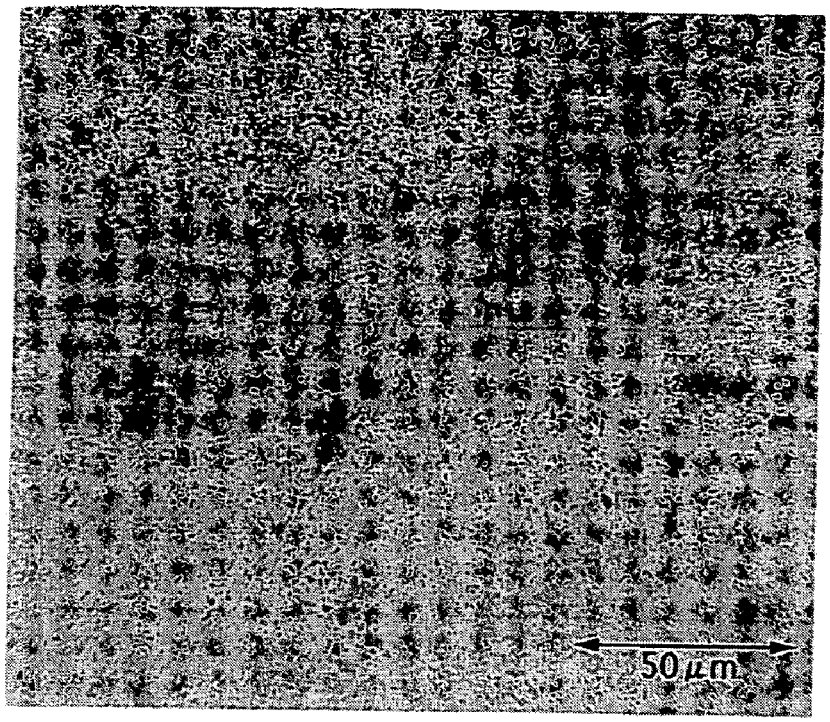
FIG. 2A is a photograph of a surface observed by an optical microscope using a bright-field transmission mode.
Figure 2B:
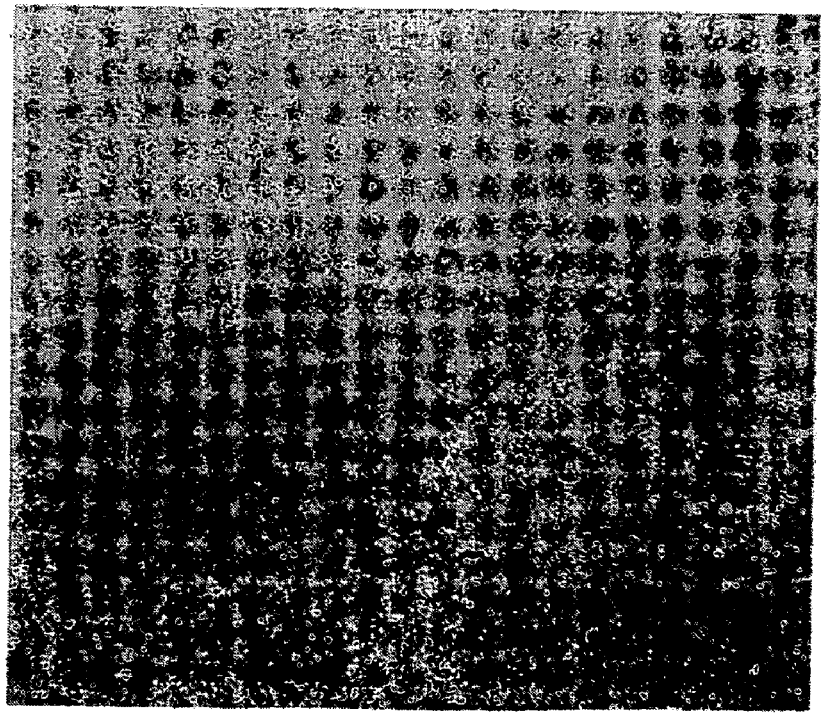
FIG. 2B is a photograph of FIG. 2A separated into an R (red) channel.
Figure 3A:
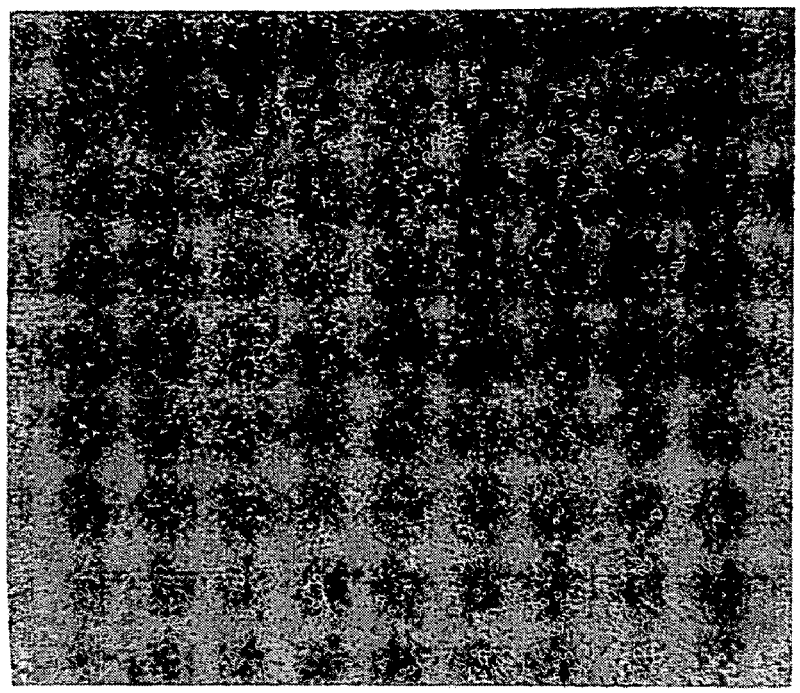
FIG. 3A is a photograph of FIG. 2A separated into a G (green) channel.
Figure 3B:
FIG. 3B is a photograph of FIG. 2A separated into a B (blue) channel.
Figure 4:
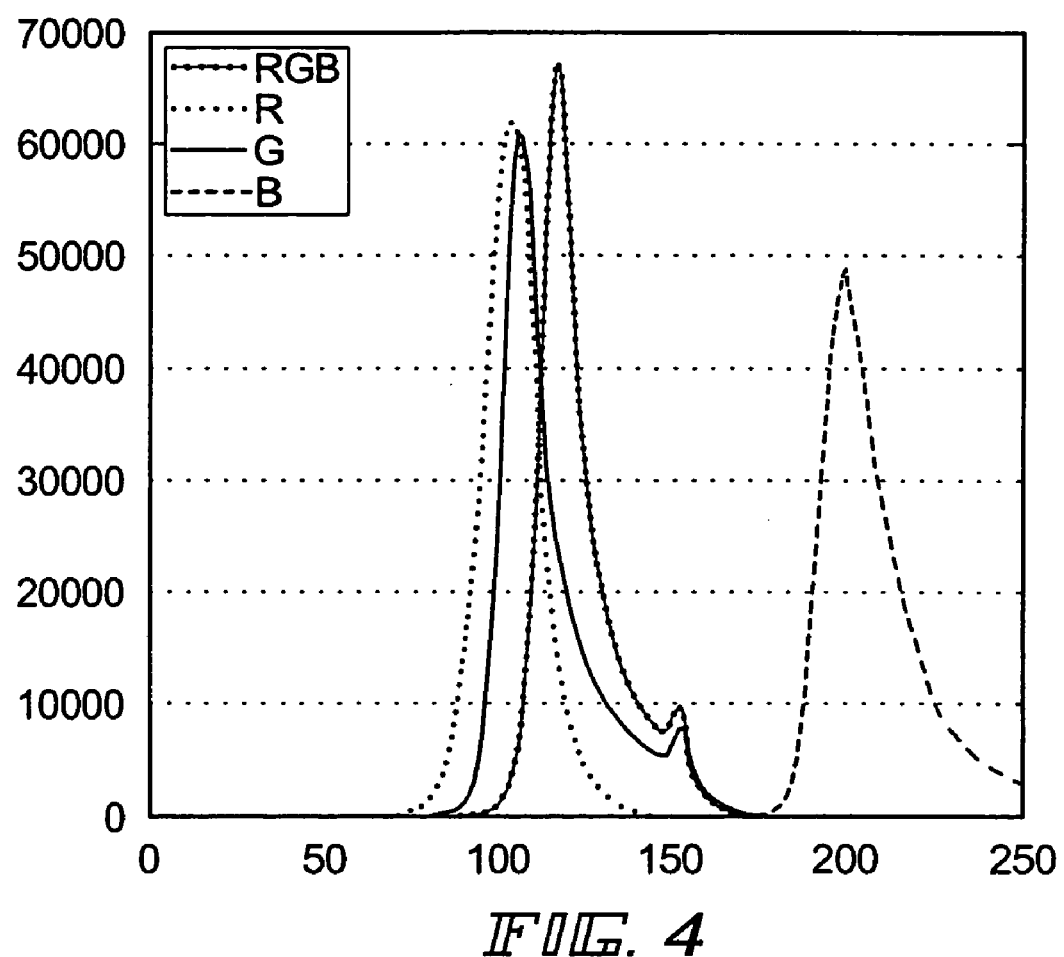
FIG. 4 is a histogram of the gray-scale (brightness) of each mode of FIG. 2A.
Figure 5A:
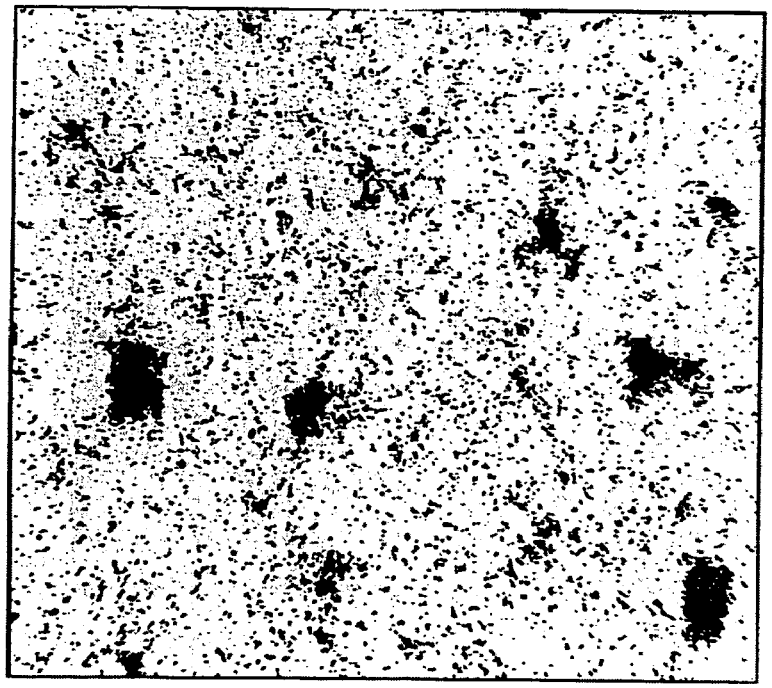
FIG. 5A is a photograph of FIG. 3A made into 2 gray-scales.
Figure 5B:
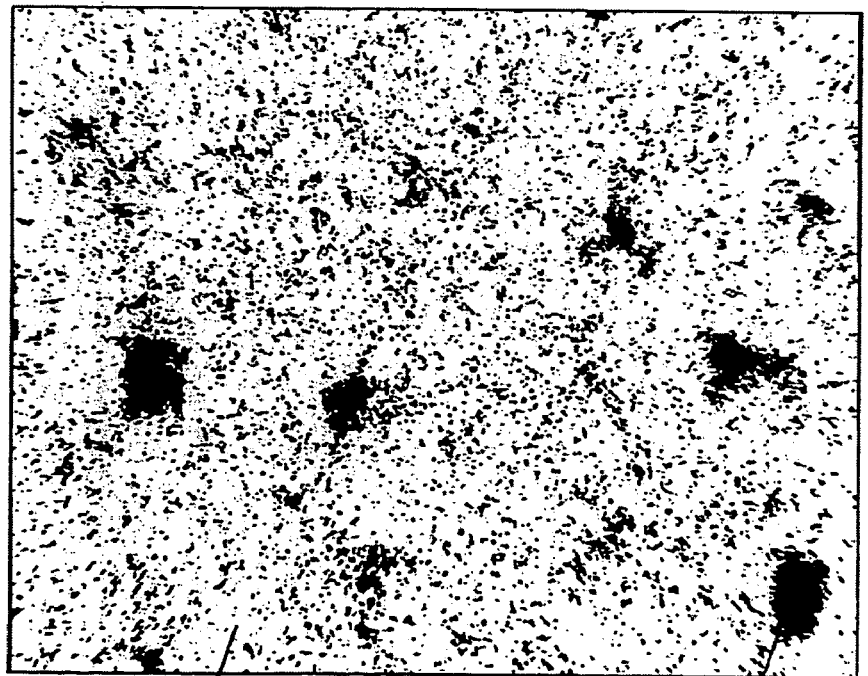
FIG. 5B is a diagram for explaining an amorphous region and a crystal region.
Figure 6A:
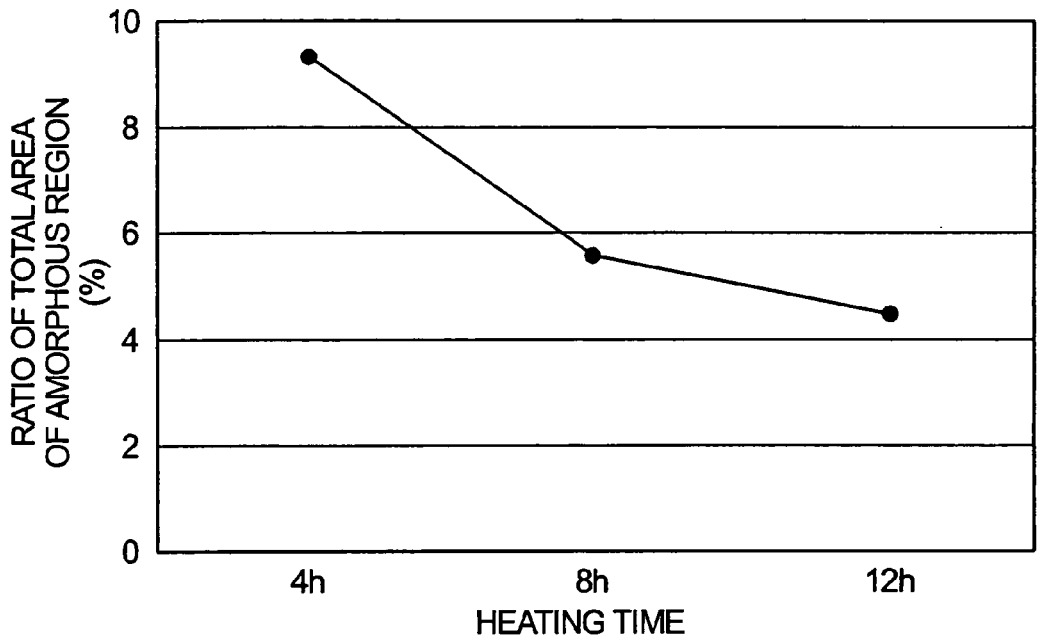
FIG. 6A shows an area ratio of each lump in an amorphous portion of FIGS. 1A to 1C.
Figure 6B:
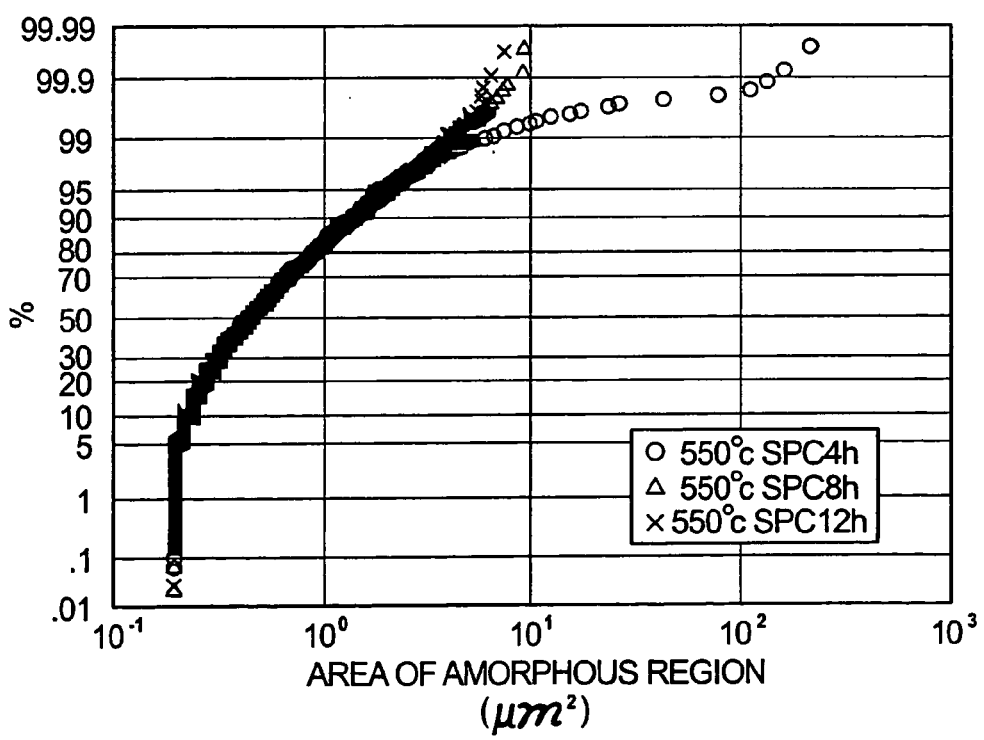
FIG. 6B is a probable statistical distribution diagram of the amorphous regions of FIGS. 1A to 1C.
Figure 7A:
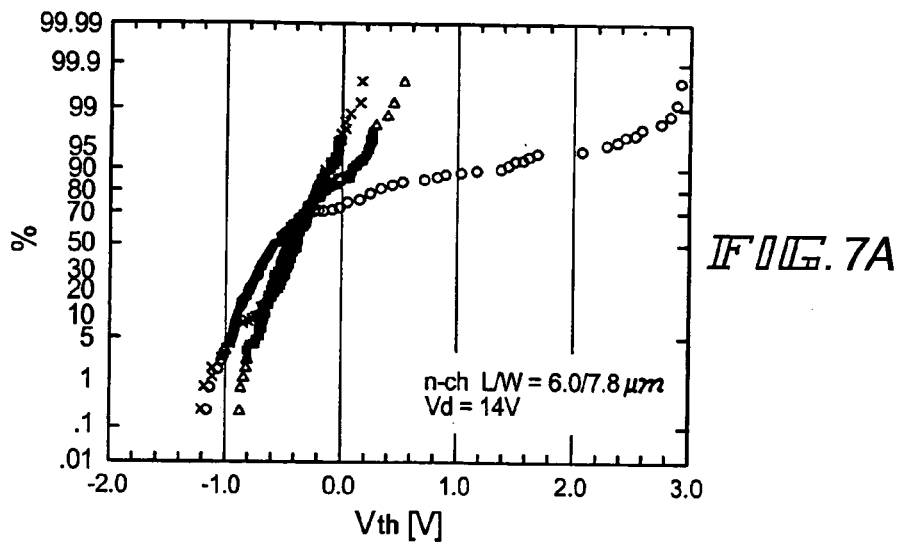
FIG. 7A is a distribution diagram of the Vth with respect to heat treatment time when performing the heat treatment on an amorphous silicon film.
Figure 7B:
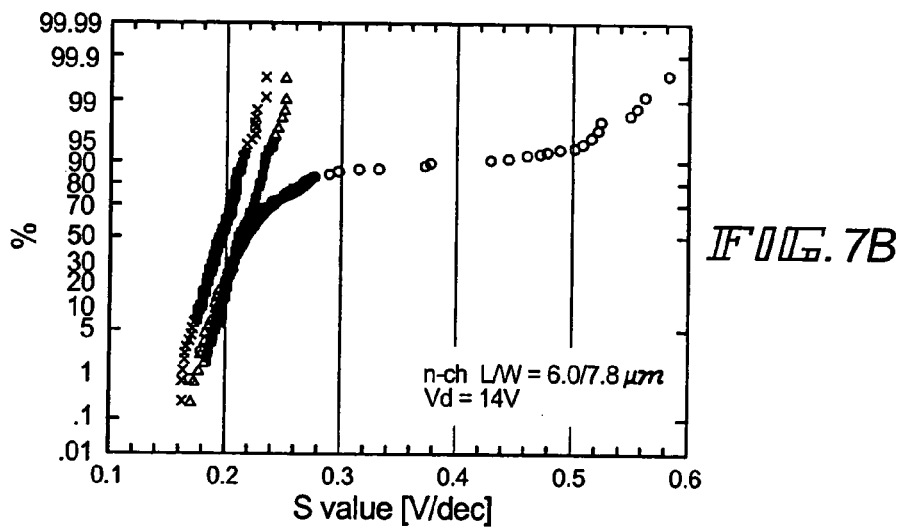
FIG. 7B is a distribution diagram of the S value with respect to heat treatment time when performing the heat treatment on an amorphous silicon film.
Figure 7C:
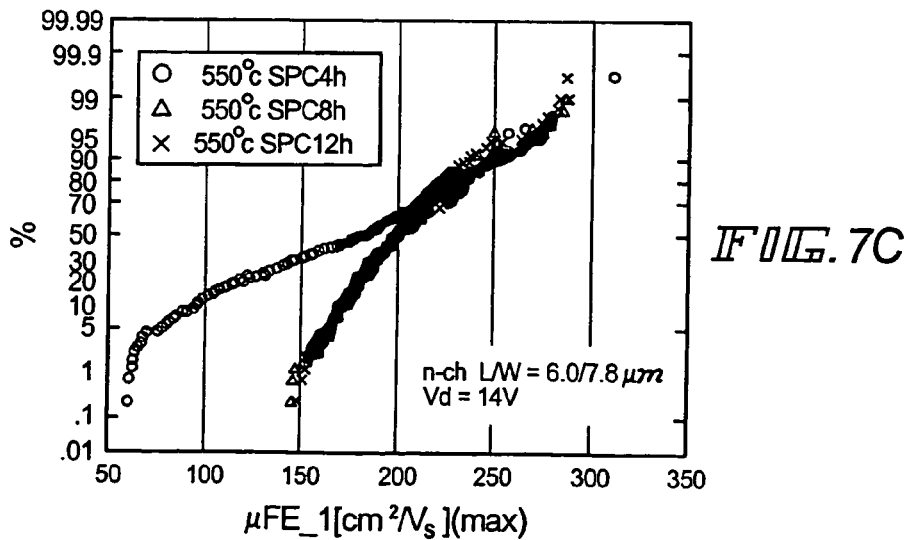
FIG. 7C is a distribution diagram of the mobility with respect to heat treatment time when performing the heat treatment on an amorphous silicon film.
Figure 8A:
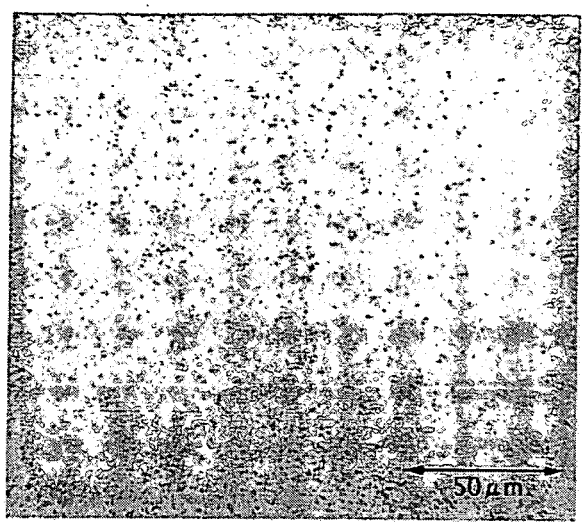
FIG. 8A is a photograph of an amorphous silicon film after conducting the heat treatment at 550° C. for 4 hours.
Figure 8B:
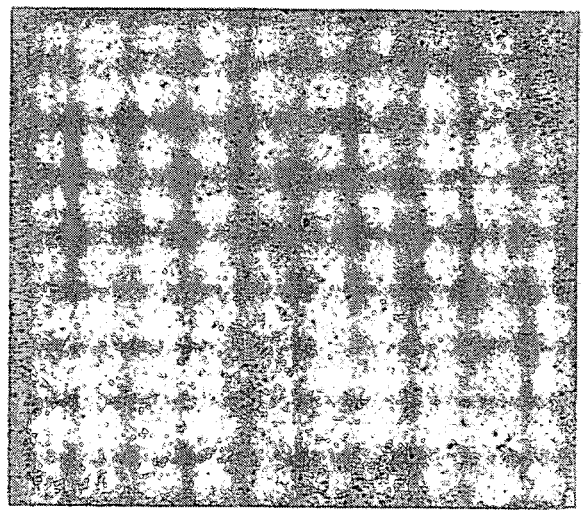
FIG. 8B is a photograph of an amorphous silicon film after conducting the heat treatment at 575° C. for 4 hours.
Figure 8C:
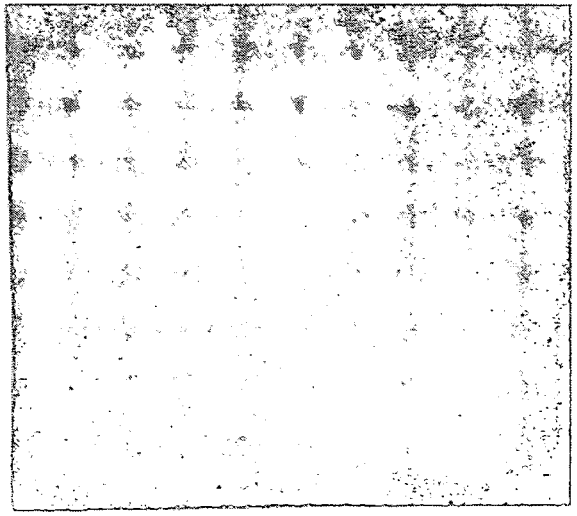
FIG. 8C is a photograph of an amorphous silicon film after conducting the heat treatment at 600° C. for 4 hours.
Figure 9A:
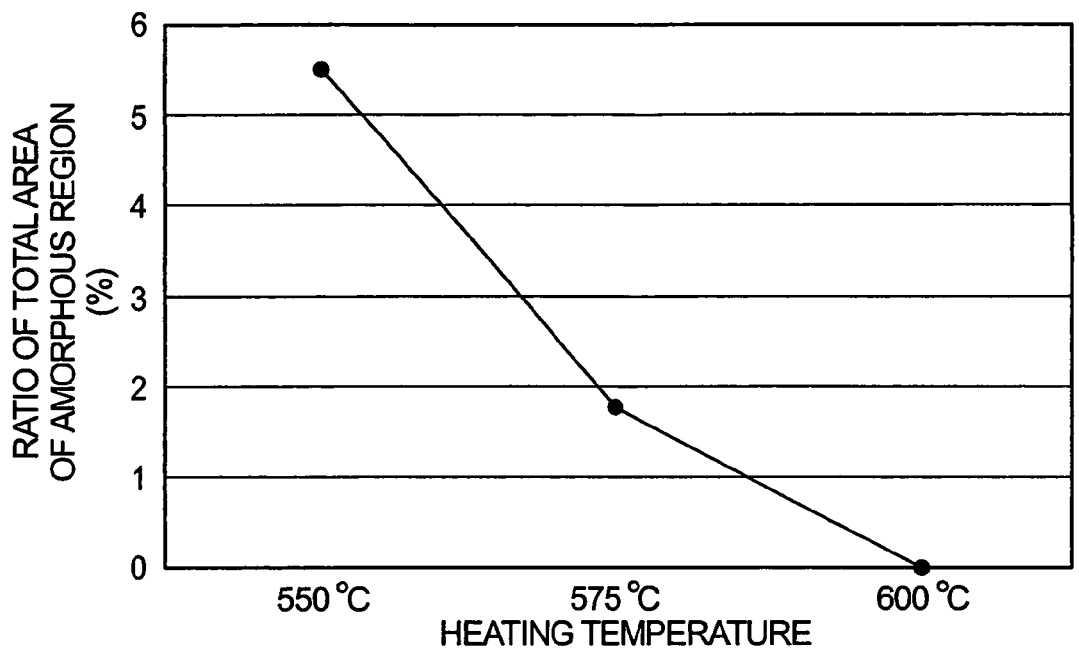
FIG. 9A shows an area ratio of each lump in an amorphous portion of FIGS. 8A to 8C.
Figure 9B:
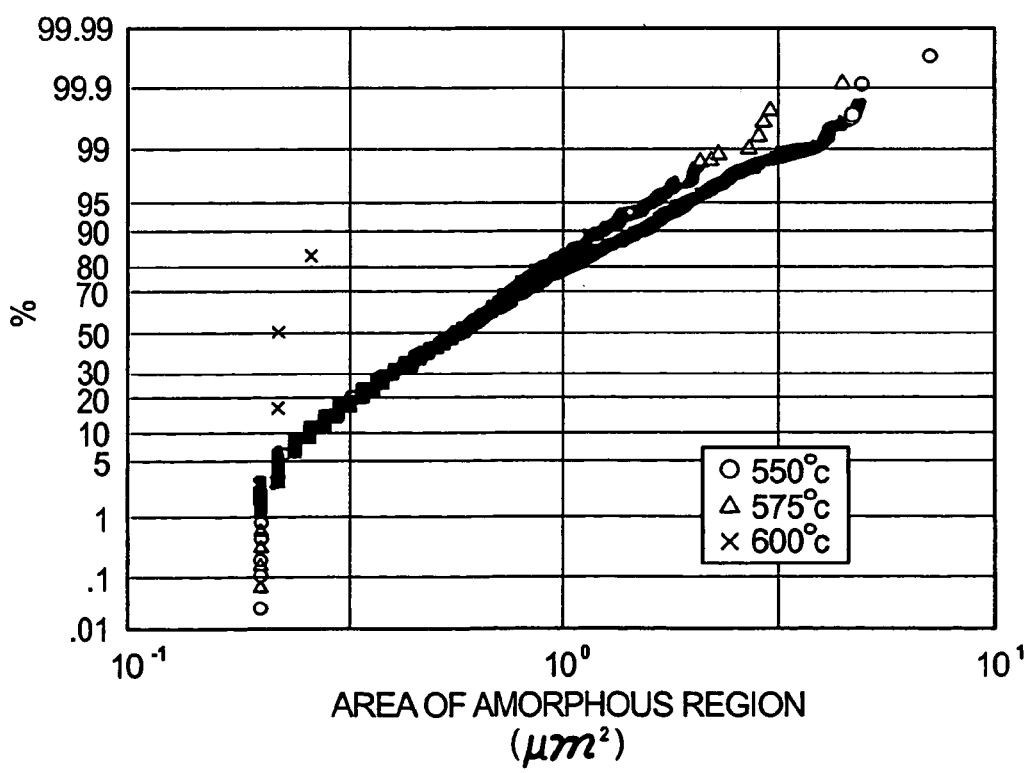
FIG. 9B is a probable statistical distribution diagram of the amorphous regions of FIGS. 8A to 8C.
Figure 11A:
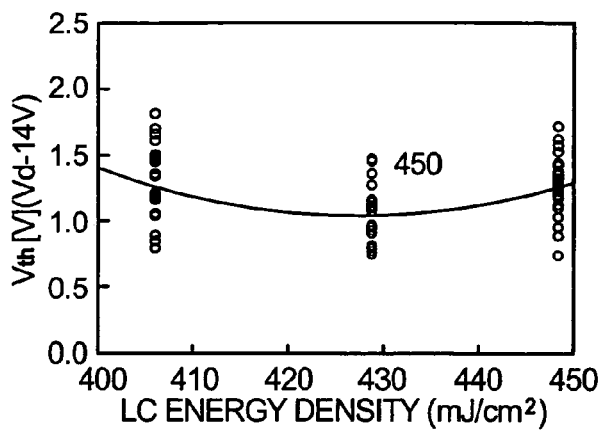
FIGS. 11A to 11D are diagrams expressing the electric characteristics of an amorphous silicon film to which the heat treatment has been performed at 600° C. for 4 hours, and to which laser annealing is performed at various laser powers.
Figure 11B:
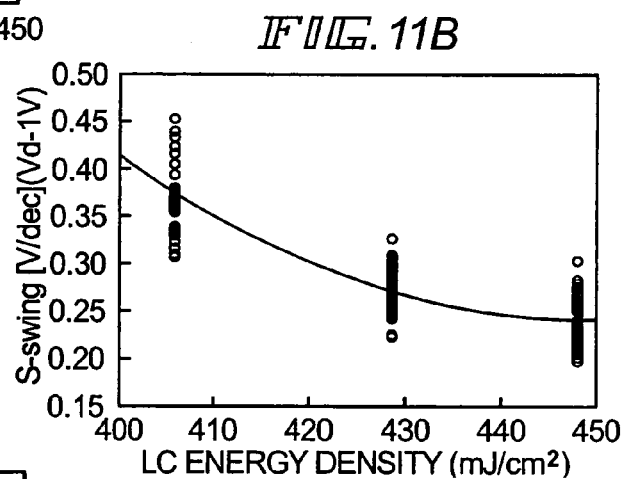
Figure 11C:
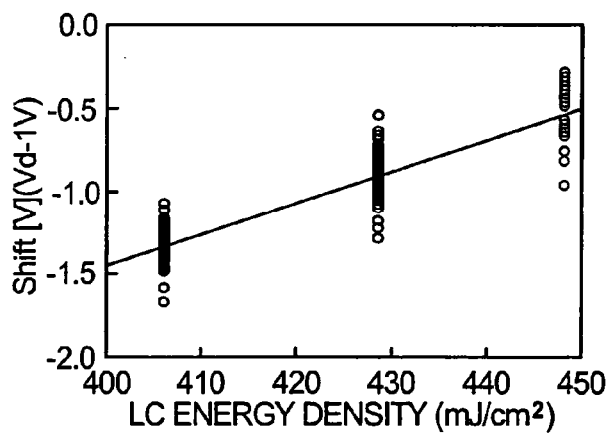
Figure 11D:
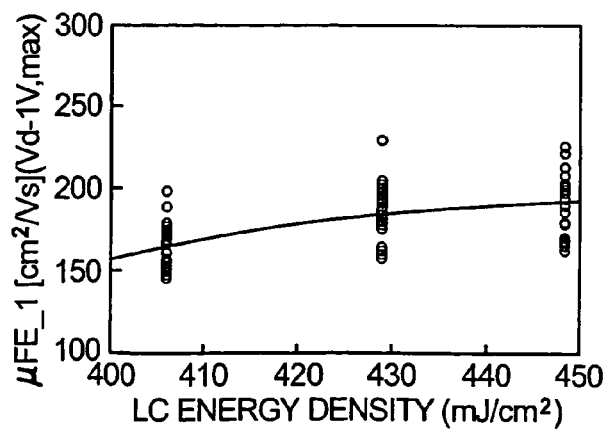
Figure 12:
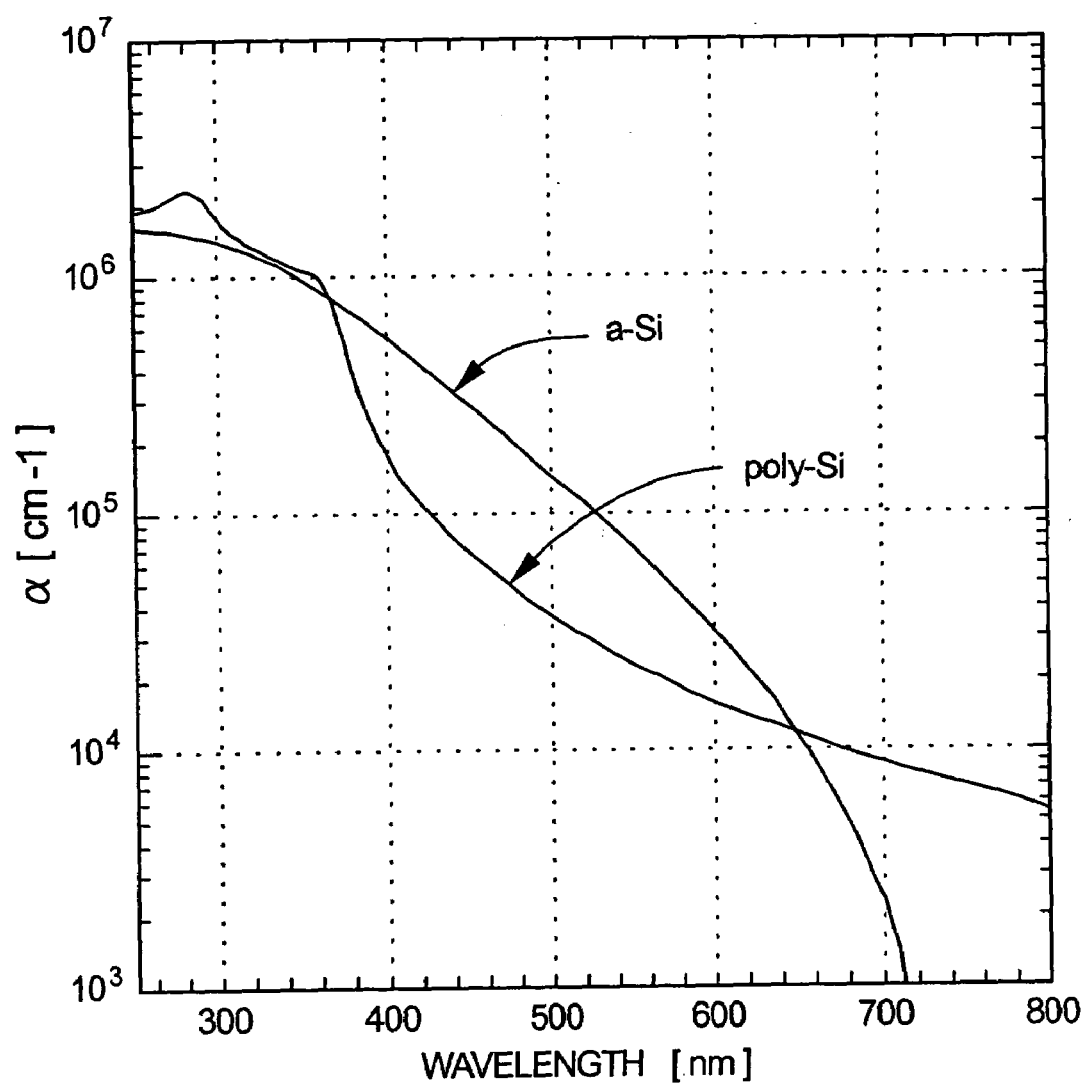
FIG. 12 is a graph showing changes of absorption coefficient of an amorphous silicon and a polycrystalline with to wave lengths.

A second harmonic of the YAG laser (wave length 532 nm) is irradiated to the polycrystalline silicon film in order to crystallize minute amorphous regions remaining in the polycrystalline silicon film. As shown in FIG. 12, since an absorption coefficient of the amorphous silicon is sufficiently larger than that of the polycrystalline silicon in the second harmonic of the YAG laser, energy can be given only to the amorphous regions contained in the polycrystalline silicon film obtained by the heat treatment. That is, the amorphous regions may be crystallized without destroying the shape of the continuous crystal regions obtained by the heat treatment.

In Embodiment 1, an example is shown, in which laser annealing with the second harmonic of the YAG is conducted to the polycrystalline silicon film using the laser beam processed into a linear shape on an irradiation surface. The optical system for processing a laser beam into a linear shape shown in FIG. 13 is used.

All mother material for the optical system are preferably quartz, for example, in order to attain high transmittivity and high laser-resistance. It is preferable that coating, by which 99% or more of transmittivity with respect to the wave length of the laser beam used (532 nm in Embodiment 1) is attained, is used.

An example of a structure of an optical system for processing the shape of a laser beam into a linear shape on an irradiation surface is shown in FIG. 13. The structure is an extremely general one, and all the optical systems in the present invention conform to the structure of FIG. 13. The structure is one in which not only the shape of the laser beam is transformed into a linear shape on the irradiation surface, but also energy homogeneity of the laser beam is achieved on the irradiation surface at the same time.

The side view of FIG. 13 is explained first. A laser beam emitted from a laser oscillator 1001 is divided in a normal direction to the movement direction of the laser beam by cylindrical lens arrays 1002a and 1002b. This direction is referred to as a vertical direction throughout this specification. The vertical direction is bent in the direction of light that is bent by a mirror when the mirror is placed in the optical system. There are four divisions with this structure. The divided laser beams are collected into a single laser beam by a cylindrical lens array 1004. It is then reflected by a mirror 1007, and once again condensed into one laser beam on an irradiation surface 1009 by a doublet cylindrical lens 1008. The doublet cylindrical lens refers to a lens composed of two cylindrical lenses. The linear laser beam is thus given with energy uniformity in the width direction and the length of the width direction determined.

The top view of FIG. 13 is explained next. The laser beam emitted from the laser oscillator 1001 is divided in a normal direction to the movement direction of the laser beam and in normal direction to the vertical direction by a cylindrical lens array 1003. This direction is referred to as a horizontal direction throughout this specification. The horizontal direction is bent in the direction of light that is bent by a mirror when the mirror is placed in the optical system. There are seven divisions with this structure. The laser beams are next made into a single beam on the irradiation surface 1009 by the cylindrical lens 1005. The linear beam is thus given with energy uniformity in the longitudinal direction and the length determined. Second harmonic of an YAG laser with large output (wave length 532 nm) or second harmonic of a glass laser (wave length 530 nm) is used when in the optical system.

As described above, the cylindrical lens arrays 1002a, 1002b and 1003 are lenses for dividing a laser beam. The uniformity of the laser beam obtained on the irradiation surface is determined based on the number of divisions or the energy distribution of the laser beam emitted from the laser oscillator.

Linear laser beams are irradiated while gradually shifted and overlapped with each other in the width direction, whereby, for example, laser annealing is conducted to the entire surface of a non-single crystal silicon film to crystallize or to improve the crystallinity.

A second harmonic (wave length 532 nm, pulse width 7 ns) of YAG generated by an nonlinear optical element is used for an oscillator. The oscillator emits a laser beam that oscillates pulses, and has an ability of emitting energy of 800 mJ per one pulse. The laser beam has a circular shape, and the size at the end of the laser beam is 9 mm in diameter (half-value width). The end of the laser beam is defined as a plane which is perpendicular to the movement direction of the laser beam immediately after the emission of the laser beam from the oscillator through this specification.

The strength of the laser beam shows Gaussian distribution which is strong as approaching the center of the laser beam The laser beam having the above size is transformed into a laser beam of 125 mm×0.4 mm having a uniform energy distribution by the optical system shown in FIG. 13.

In general, in a case of irradiating a linear laser beam to a non-single crystal silicon film, it is most appropriate that the pitch in pulses of the laser beam for overlaying is about $\frac{1}{10}$ of the short width of the linear laser beam (short width in half-value width). Thus, laser annealing can be conducted to the non-single crystal silicon film with higher uniformity. In the above example, since the short width is 0.4 mm, the laser beam is irradiated with the conditions such that the pulse frequency of the laser oscillator is 30 Hz and the scanning speed of the stage, on which the non-single crystal silicon film to be irradiated is disposed, is 1.0 mm/s. At this time, the energy density of the laser beam on the irradiation surface is 500 mJ/cm$^2$. The method described above is an extremely general one that is used to crystallize a semiconductor film using a linear beam.

A TFT is manufactured by, for example, a known method or a method described in later embodiments using the polycrystalline silicon film manufactured as described above. The TFT has good electric characteristics. In particular, the TFT is obtained which has high mobility, characteristics of small S value, and in addition, characteristics of less fluctuation.

[Embodiment 2]

In Embodiment 2, an example in which laser annealing is conducted using a second harmonic of a YVO$_4$ laser (wave length 532 nm) after a heat treatment is conducted to an amorphous silicon film, is explained. The YVO$_4$ laser has a characteristic that the quality of the laser beam is high, and M2, which is one of indexes showing quality of the laser beam, is very approximate to 1. However, since the energy of the laser beam obtained with the second harmonic of the YVO$_4$ laser is at most about 0.1 mJ per one pulse at present, there is a need to mostly focus on a spot light source. The quality of the laser beam of the YVO$_4$ laser is extremely high. Thus, a very small spot light source is attained by condensing light using an appropriate convex lens. The second harmonic of the YVO$_4$ laser is a pulse laser and the laser can oscillate pulses at a frequency of 20,000 Hz.

An example, in which the laser beam of the second harmonic of the YVO$_4$ laser is irradiated for conducting laser annealing to the polycrystalline silicon film which is processed until the heat treatment before laser annealing in the crystallization process of the amorphous silicon film shown in Embodiment 1, is explained with reference to FIG. 14.

In FIG. 14, a laser beam emitted from a laser oscillator 1401 is transformed into a laser beam with a sufficient energy density to crystallize amorphous regions by a beam expander 1402. The beam expander is for enlarging the size of a beam in general. However, in Embodiment 2, the beam expander may be used for reducing the size of a beam depending on a desired energy density. Further, the laser beam reaches a substrate 1405 through a galvanometer 1403 and an f-θ cylindrical lens 1404. The galvanometer 1403 vibrates so that the angle of the mirror of the galvanometer changes with time and the position of the laser beam on the substrate is moved in the direction indicated by an arrow 1407. The galvanometer is adjusted such that, while it vibrates in the half period, the laser beam moves from one end to the other of the substrate width. At this time, the f-θ cylindrical lens 1404 is adjusted such that the energy density of the laser beam is always constant on the substrate even if the position of the laser beam on the substrate moves. While the galvanometer vibrates in the half period, the laser beam moves from one end to the other end of the substrate width. Thus, portions which are irradiated with the laser beam are laser-annealed. Since the laser beam is oscillation of pulses, the speed of oscillation of the galvanometer is regulated so that annealing positions are not continuous intermittently. Thereafter, the stage 1406 is moved in the direction indicated by an arrow 1408, and then, the movement of the laser beam in the direction indicated by the arrow 1407 on the substrate starts again. These operations are repeated, with the result that the laser annealing can be conducted to the entire surface of the substrate. In other words, the movement of the irradiation position by the rotation of the galvanometer and the movement of the stage are repeated so that the laser beam is irradiated to the entire surface of the substrate.

As shown in FIG. 12, in the second harmonic of the YVO$_4$ laser (wave length 532 nm), since an absorption coefficient of amorphous silicon is sufficiently larger than that of polycrystalline silicon, crystallization of the amorphous regions may be performed without destroying the shape of the continuous crystal region of the polycrystalline silicon film obtained by the heat treatment.

A TFT is manufactured by, for example, a known method or the method described in later embodiments using the polycrystalline silicon film manufactured as described above. The TFT has good electric characteristics. In particular, the TFT is obtained which has high mobility, characteristics of small S value, and in addition, characteristics of less fluctuation.

[Embodiment 3]

In Embodiment 3, an example, in which laser annealing is conducted using second harmonic of a YLF laser (wave length 527 nm) after a heat treatment is performed to an amorphous silicon film, is explained. The size of the second harmonic of the YLF laser at the end of the laser beam can be set to approximately 5 mm in diameter. Therefore, it is much easier to adjust the shape or the energy density of the laser beam compared with other laser beams which is close to a spot light source. However, the energy of the laser beam obtained with the second harmonic of the YLF laser is at most about 20 mJ per one pulse at present. Thus, the size of the laser beam has to be reduced to approximately 2 mm in diameter or less on the irradiation surface in order to attain the energy density sufficient to crystallize the amorphous regions. Further, the frequency of pulse oscillation of the existing YLF laser has reached on the order of the KHz The laser beam of the second harmonic of the YLF laser is irradiated to the polycrystalline silicon film, which is processed until the heat treatment before the laser annealing in the crystallization process of the amorphous silicon film shown in Embodiment 1. The irradiation may be performed in accordance with the method shown in Embodiment 2, for example. Since the frequency of the YLF laser is, for example, on the order of 1 KHz, the speed of the vibration of the galvanometer has to be regulated according to the frequency.

As shown in FIG. 12, in the second harmonic of the YLF laser (wave length 527 nm), since an absorption coefficient of amorphous silicon is sufficiently larger than that of polycrystalline silicon, crystallization of the amorphous regions may be performed without destroying the shape of the continuous crystal region of the polycrystalline silicon film obtained by the heat treatment.

A TFT is manufactured by for example, a known method or a method described in later embodiments using the polycrystalline silicon film manufactured as described above. The TFT has good electric characteristics. In particular, the TFT is obtained which has high mobility, characteristics of small S value, and in addition, characteristics of less fluctuation.

[Embodiment 4]

In Embodiment 4, an example, in which laser annealing is conducted using an Ar laser after heat treatment is performed to an amorphous silicon film, is explained. There are two types of Ar lasers: a continuous light emission type and a pulse oscillation type. In Embodiment 4, the continuous light emission type Ar laser is used. However, the use of the pulse oscillation type Ar laser has no influence on the nature of the present invention. The advantage of using the continuous light emission type Ar laser instead of the pulse oscillation type Ar laser resides in that the uniformity of laser annealing is not lost even if the laser beam is moved at high speed. In the laser beam of the pulse oscillation type Ar laser, laser beams adjacent to each other between pulses are separated if the laser beam is moved at excessively high speed. Thus, the uniformity of laser annealing is lost. At present, since the energy of the laser beam obtained by the continuous light emission type Ar laser is about 20 W, the size of the laser beam is reduced to several tens of μm in diameter on the irradiation surface with the result that the energy sufficient to crystallize the amorphous regions is obtained.

The laser beam of the Ar laser is irradiated to the polycrystalline silicon film, which is processed until the heat treatment before the laser annealing in the crystallization process of the amorphous silicon film shown in Embodiment 1. The irradiation may be performed in accordance with the method shown in Embodiment 2, for example. Since the continuous light emission type Ar laser is used in Embodiment 4, the speed of the vibration of the galvanometer has to be regulated so that laser annealing of the polycrystalline silicon film to be irradiated may be sufficiently conducted. The reason for that is the laser energy given to the polycrystalline silicon film is not sufficient in a case where the galvanometer vibrates at a speed higher than a certain speed.

The Ar laser has a strong oscillation wave length of 488.0 nm and 514.5 nm. As shown in FIG. 12, in these wave lengths, since an absorption coefficient of amorphous silicon is sufficiently larger than that of polycrystalline silicon, crystallization of the amorphous regions may be performed without destroying the shape of the continuous crystal region of the polycrystalline silicon film obtained by the heat treatment.

A TFT is manufactured by, for example, a known method or a method described in later embodiments using the polycrystalline silicon film manufactured as described above. The TFT has good electric characteristics. In particular, the TFT is obtained which has high mobility, characteristics of small S value, and in addition, characteristics of less fluctuation.

[Embodiment 5]

A case of heating at 575° C. when crystallizing an amorphous silicon film is explained in Embodiment 5.

An $SiO_2$ film and an amorphous silicon film are formed by a method similar to that of Embodiment 1, and a solution containing an element for promoting crystallization is applied onto the amorphous silicon film. Next, heat treatment is performed for 1 hour at 500° C. in a nitrogen atmosphere, and additionally, successively 1-hour heat treatment is further performed at 575° C. in a nitrogen atmosphere. With this process, the amorphous silicon film is changed into a polycrystalline silicon film. The polycrystalline silicon film contains the amorphous regions.

The amorphous silicon film is partially crystallized by the heat treatment, and a polycrystalline silicon film is obtained in which the total area of amorphous regions contained within a region which becomes an active layer of one TFT is from 1.0% to 8.0% with respect to the area of the region which becomes the active layer of one TFT. Further, the area of each of the amorphous regions is less than or equal to 10.0 μm² after partial crystallization by the heat treatment, an area of at least one amorphous region is equal to or greater than 0.30 μm². The above-mentioned conditions for crystallization is rough standards to obtain a desired polycrystalline silicon film. An operator must optimize the conditions so that the area of the amorphous regions falls within a range indicated by the present invention.

Thereafter, the amorphous regions are crystallized with a laser annealing method described in Embodiments 1 to 4. A TFT is manufactured by, for example, a known method or a method described in later embodiments using the thus manufactured polycrystalline silicon film. The TFT has good electric characteristics. In particular, the TFT is obtained which has high mobility, characteristics of small S value, and in addition, characteristics of less fluctuation.

[Embodiment 6]

An embodiment of the present invention is explained with reference to FIGS. 15A to FIGS. 17B. In Embodiment 6, a method of simultaneously manufacturing a pixel TFT and a storage capacitor of a pixel portion, and a TFT of a driver circuit formed in the periphery of the pixel portion is explained in detail in accordance with the manufacturing processes.

In FIG. 15A, as a substrate 101, a glass substrate such as a barium borosilicate glass or an alumino borosilicate glass, typically #7059 glass or #1737 glass of Corning Corp., or a quartz substrate, or the like may be used. In the case of using a glass substrate, a heat treatment may be performed in advance at a temperature which is 10 to 20° C. lower than the glass distortion point. Then, on the surface of the substrate 101 on which TFTs are formed, a base film 102 made from an insulating film, such as a silicon oxide film, a silicon nitride film or a silicon oxynitride film, is formed in order to prevent impurity diffusion from the substrate 101. For example, a silicon oxynitride film 102a formed from $SiH_4$, $NH_3$, $N_2O$ by a plasma CVD method with a thickness of 10 to 200 nm (preferably 50 to 100 nm), and a silicon oxynitride hydride film 102b formed from $SiH_4$ and $N_2O$ similarly with a thickness of 50 to 200 nm (preferably 100 to 150 nm) are laminated. In Embodiment 6, the base film 102 is shown as a two layered structure, but a single layer of the insulating film or a lamination of two or more layers may be adopted to form the base film 102.

The silicon oxynitride film is formed with a plasma CVD method of a parallel plane plate type. The silicon oxynitride film 102a is formed with $SiH_4$ at 10 SCCM, $NH_3$ at 100 SCCM, $N_2O$ at 20 SCCM introduced into a reaction chamber, and with a substrate temperature of 325° C., a reaction pressure of 40 Pa, a discharge power density of 0.41 W/cm², and a discharge frequency of 60 MHz. On the other hand, the silicon oxynitride hydride film 102b is formed with $SiH_4$ at 5 SCCM, $N_2O$ at 120 SCCM, $H_2$ at 125 SCCM introduced into the reaction chamber, and with a substrate temperature of 400° C., a reaction pressure of 20 Pa, a discharge power density of 0.41 W/cm², and a discharge frequency of 60 MHz. These films may be formed continuously by only changing the substrate temperature and switching the reaction gas.

The silicon oxynitride film 102a thus manufactured has a density of $9.28 \times 10^{22}/cm^3$, and is dense and hard with the slow etching speed at approximately 63 nm/min by a mixture solution (manufactured by Stella Chemifa Corporation, trade name LAL500) including ammonium acid fluoride ($NH_4HF_2$) at 7.13% and ammonium fluoride ($NH_4F$) at 15.4% at 20° C. If such a film is used as the base film, it is effective to prevent diffusion of the alkali metal element from the glass substrate to the semiconductor layer to be formed thereon.

Next, a semiconductor layer 103a having an amorphous structure with a thickness of 25 to 100 nm (preferably 30 to 70 nm) is formed by a method such as a plasma CVD method or a sputtering method. As a semiconductor film having the amorphous structure, there are an amorphous semiconductor layer and a microcrystalline semiconductor layer, and therefore a compound semiconductor film having an amorphous structure such as an amorphous silicon germanium film may also be applied. In a case of forming an amorphous silicon film by a plasma CVD method, it is possible to continuously form both the base film 102 and the amorphous semiconductor layer 103a. For example, as described above, after forming the silicon oxynitride film 102a and the silicon oxynitride hydride film 102b continuously by a plasma CVD method, if the reaction gasses are switched from $SiH_4$, $N_2O$, and $H_2$ to $SiH_4$ and $H_2$, or $SiH_4$ only, continuous formation is possible without exposure to the atmosphere. As a result, it becomes possible to prevent contamination of the surface of the silicon oxynitride hydride film 102b, and therefore the characteristic fluctuation of the manufactured TFT and the variation of the threshold voltage may be reduced.

Subsequently, the crystal semiconductor layer 103b is manufactured from the amorphous semiconductor layer 103a by performing the crystallization process. As such a method, a laser annealing method or a thermal annealing method (solid-phase growth method), or a rapid thermal annealing method (RTA method) may be adopted. In a case of using a glass substrate as described above or a plastic substrate with an inferior heat resistance, it is particularly preferable to use a laser annealing method. In the RTA method, the light source such as an infrared ray lamp, a halogen lamp, a metal halide lamp, and a Xenon lamp are used. Otherwise, the crystal semiconductor layer 103b may be formed by a crystallization method using the metallic element in accordance with a technique disclosed in Japanese Patent Application Laid-open No. Hei 7-130652. In a crystallization step, first, it is preferable to release the hydrogen contained in the amorphous semiconductor layer. Therefore, a heat treatment is performed at 400 to 500° C.

for about 1 hour to make the hydrogen amount contained 5% or less of the number of all atoms contained in the amorphous semiconductor layer, and then crystallization is performed. As a result, it is preferably possible to prevent the surface of the film from becoming rough.

Further, in the process of forming the amorphous silicon film by the plasma CVD method, the amorphous silicon film is formed using $SiH_4$ and Argon (Ar) as the reaction gas, with the substrate temperature of 400 to 450° C. at the time of film formation, the hydrogen density contained in the amorphous silicon layer can be made at 5% or less of the all number of atoms contained in the amorphous semiconductor layer. In such a case, the heat treatment to release hydrogen is unnecessary.

In a case that a crystallization is performed by a laser annealing method, the excimer laser, the YAG laser, the argon laser or the like is used as the light source. In a case that an excimer laser of a pulse oscillating type is used, laser annealing is performed by processing a laser light into a linear shape. The conditions of the laser annealing are appropriately selected by an operator. For example, a laser pulse oscillation frequency is set to 30 Hz, and a laser energy density is set from 100 to 500 $mJ/cm^2$ (typically 300 to 400 $mJ/cm^2$). Then, a linear beam is irradiated over the entire surface of the substrate, the overlapping ratio of the linear beam at this time is set as 80 to 98%. Thus, as shown in FIG. 15B, the crystalline semiconductor layer 103$b$ is obtained.

Then, a resist pattern is formed using a photolithography technique with a first photomask (PM1) on the crystal semiconductor layer 103$b$, and the crystalline semiconductor layer is divided into island-shapes by dry etching to form island-like semiconductor layers 104 to 108 as shown in FIG. 15C. For the dry etching of the crystalline silicon film, a mixture gas of $CF_4$ and $O_2$ is used.

An impurity element which imparts a p-type conductivity may be added to the entire surface of the island-like semiconductor layers at a concentration of about $1\times10^{16}$ to about $5\times10^{17}/cm^3$ so as to control a threshold voltage (Vth) of the TFT. As an impurity element that imparts the p-type conductivity to the semiconductor, elements such as boron (B), aluminum (Al), gallium (Ga) of the periodic table group 13 are known. An ion injection method or an ion doping method (or an ion shower doping method) may be used as a method, the ion doping method is appropriate in order to process a substrate with a large area. The ion doping method uses a diborane ($B_2H_6$) as a source gas and a boron (B) is added thereto. Such an injection of an impurity element is not always necessary, and therefore may be omitted. However, it is a method preferably used to make the threshold voltage particularly of an n-channel TFT fall within the predetermined range.

The gate insulating film 109$a$ is formed from an insulating film containing silicon by using a plasma CVD method or a sputtering method into a film thickness of from 40 to 150 nm. In Embodiment 6, the gate insulating film 109$a$ is formed from a silicon oxynitride film into a thickness of 120 nm. A silicon oxynitride film formed by adding $O_2$ to $SiH_4$ and $N_2O$ is a suitable material because a fixed charge density is reduced in the film. Further, the silicon oxynitride film formed from $SiH_4$, $N_2O$, and $H_2$ is preferred because an interface defect density can be reduced. Of course, the gate insulating film is not limited to such a silicon oxynitride film, and other insulating films containing silicon may also be formed to have a single layer or a laminate structure. When the silicon oxide film is used, for example, it can be formed by the plasma CVD method in which TEOS (tetraethyl orthosilicate) and $O_2$ are mixed, with a reaction pressure of 40 Pa, a substrate temperature of from 300 to 400° C., and discharge at a high frequency (13.56 MHz) power density of 0.5 to 0.8 $W/cm^2$. Good characteristics as the gate insulating film can be obtained in the silicon oxide film thus manufactured by subsequent thermal annealing at 400 to 500° C.

As shown in FIG. 15D, then, a heat resistant conductive layer for forming a gate electrode is formed on the first shape gate insulating film 109$a$ into a thickness of from 200 to 400 nm (preferably 250 to 350). The heat resistant conductive layer may be formed of a single layer, or may have a laminate structure consisting of a plurality of layers such as two or three layers, optionally. As the heat resistant conductive layer in this specification, an element selected from Ta, Ti, and W, an alloy containing the above element as a component, or an alloy film combining the above elements are included therein. The heat resistant conductive layer is formed by the sputtering method or the CVD method, and therefore it is preferred to reduce the concentration of impurities contained in order to attain lowering of the resistance. Particularly, an oxygen concentration is preferably made less than or equal to 30 ppm. In Embodiment 6, a W film with a thickness of 300 nm may be formed by the sputtering method using a W target, or by the thermal CVD method using tungsten hexafluoride ($WF_6$). Whichever method is used, it is necessary to lower the resistance for use as the gate electrode, and it is desired that the resistivity of the W film is set less than or equal to 20 $\mu\Omega cm$. By making the crystal grains large, it is possible to make the W film have a lower resistivity. However, if there are many impurity elements such as oxygen within the W film, crystallization is inhibited and the resistance becomes higher. Accordingly, by forming the W film using a W target with a purity of 99.9999%, and in addition, taking sufficient consideration so that there is no mixing in of impurities from the gas phase during film formation, a resistivity from 9 to 20 $\mu\Omega cm$ can be realized when the sputtering method is used.

On the other hand, in the case that the Ta film is used as the heat resistant conductive film 111, the Ta film may be formed similarly by the sputtering method. Ar is used as the sputtering gas for the Ta film. When a suitable amount of Xe or Kr is added to the gas during sputtering, it is possible to relieve internal stress of the film to be formed, thereby being capable of preventing the film from peeling off. The resistivity of an α-phase Ta film is about 20 $\mu\Omega cm$ and can be used as the gate electrode. However, the resistivity of a β-phase Ta film is about of 180 $\mu\Omega cm$, thereby being not suitable for the gate electrode. The TaN film has a crystal structure close to the α-phase, and therefore TaN film is formed as a base of the Ta film, the α-phase Ta film can be easily obtained. In addition, although not shown, it is effective that a silicon film, into which phosphorus (P) is doped, is formed under the heat resistant conductive film 111 into thickness about from 2 to 20 nm. As the result, improvement of adhesiveness and prevention of oxidation of the conductive film formed thereon can be attained, and at the same time, it is possible to prevent a small amount of an alkaline metallic element contained in the heat resistant conductive layer 111 from diffusing into the first shape gate insulating film 109$a$. Whichever method is used, the resistivity of the heat resistant conductive layer 111 is preferably set within the range of from 10 to 50 $\mu\Omega cm$.

Masks 112 to 117 are formed from resist using a photolithography technique with a second photo mask (PM2). Then, a first etching process is performed. In Embodiment 6, an ICP (inductively coupled plasma) etching apparatus is used, and the first etching process is performed using $Cl_2$ and $CF_4$ as the etching gas, at a pressure of 1 Pa with applying an RF (13.56 MHz) power of 3.2 W/cm$^2$ to form plasma. An RF (13.56 MHz) power of 224 mW/cm$^2$ is applied to the substrate side (sample stage), therefore, a negative self bias voltage is substantially applied. Under the conditions, the etching rate of the W film is about 100 nm/min. In the first etching process, an exact required time for etching the W film is estimated based on the above etching rate, and the etching time which is increased by 20% from the above estimated etching time is used.

By the first etching process, the conductive layers 118 to 123 with a first tapered shape are formed. The angle of the tapered portion is set from 15 to 30°. However, in order to etch without any residue remaining, an over-etching process, in which the etching time is increased by a ratio of approximately 10 to 20%, may be performed. The selectivity of the silicon oxynitride film (the first shape gate insulating film 109a) with respect to the W film is 2 to 4 (typically 3), and therefore the exposed surface of the silicon oxynitride film is etched by approximately 20 to 50 nm due to the over-etching process. As a result, a second shape gate insulting film 109b is formed, in which a taper shape is formed in the vicinity of the edge portion of the conductive layer with the first taper shape.

Then, a first doping treatment is carried out to add an impurity element with one conductivity type to an island-like semiconductor layer. In Embodiment 6, a process for adding an impurity element imparting an n-type is performed. The masks 112 to 117 used for forming the conductive layers with the first tapered shape are left as they are, and an impurity imparting an n-type is added in a self-aligning manner using the conductive layers 118 to 123 as the masks by the ion doping method. In order that the impurity element imparting the n-type can reach, through the taper portion at the edge of the gate electrode and the insulating film, the semiconductor layer that locates under them, the condition of the ion doping method is such that a dosage is $1\times10^{13}$ to $5\times10^{14}$ atoms/cm$^2$, and an acceleration voltage is 80 to 160 kV. As the impurity element which gives the n-type, an element belonging to group 15, typically phosphorus (P) or arsenic (As) is used. In Embodiment 6, phosphorus (P) is used. By the ion doping method, an impurity element imparting n-type is added to the first impurity regions 124, 126, 128, 130, and 132 in the concentration range of $1\times10^{20}$ to $1\times10^{21}$ atoms/cm$^3$, and to the second impurity regions (A) 125, 127, 129, 131, and 133 formed below the taper portion in the concentration range of $1\times10^{17}$ to $1\times10^{20}$ atoms/cm$^3$ though it is not uniform within the region.

In this process, in the second impurity regions (A) 125, 127, 129, 131, and 133, a change in the concentration of the impurity element imparting n-type, containing an overlapping portion with the first shape conductive layers 118 to 123, reflects the change in film thickness of the taper portion. In other words, the concentrations of phosphorus (P) to be added to the second impurity regions (A) 125, 127, 129, 131, and 133 become gradually lower from the edge portion of the conductive layer toward the inside in the overlapping portion.

A second etching process is performed next, as shown in FIG. 16B. The ICP etching device is used similarly for the second etching process, and a mixture gas of $CF_4$ and $Cl_2$ is used as the etching gas. The etching is performed under the conditions of an RF power of 3.2 W/cm$^2$ (13.56 MHz), a bias voltage of 45 mW/cm$^2$ (13.56 MHz), and at a pressure of 1.0 Pa. Conductive layers 140 to 145 with a second shape are formed under the above conditions. A taper portion at the edge portion is formed, in which the thickness thereof is gradually increased from the edge portion toward the inside. Compared with the first etching process, an isotropic etching rate is increased as the bias voltage applied on the substrate side is lowered, and therefore an angle of the taper portion is from 30 to 60°. Further, the surface of the second shape gate insulating film 109b is etched by about 40 nm, and the third shape gate insulating film 109c is newly formed.

Then, an impurity imparting n-type is doped with a high acceleration voltage under the condition that a dosage is made lower than that of the first doping. For example, an acceleration voltage is made 70 to 120 kV and the dosage is $1\times10^{13}$/cm$^2$ so that the impurity concentration of the region overlapping with the second shape conductive layers 140 to 145 becomes $1\times10^{16}$ to $1\times10^{18}$/cm$^2$. In this manner, the second impurity regions 146 to 150 are formed.

Then, impurity regions 156 and 157 with a conductivity, which is reverse to the one conductivity type, are formed in island-like semiconductor layers 104 and 106 for forming p-channel TFTs. In this case, also, an impurity element imparting p-type is added using the second shape conductive layers 140 and 142 using as masks to form the impurity regions in a self-aligning manner. At this time, whole surfaces of island-like semiconductor layers 105, 107 and 108 for forming n-channel TFTs are covered with resist masks 151 to 153 formed using a third photomask (PM3). The impurity regions 156 and 157 formed in this process is formed by the ion doping method using diborane ($B_2H_6$). The concentration of the impurity element imparting the p-type in the impurity regions 156 and 157 is made $2\times10^{20}$ to $2\times10^{21}$/cm$^3$.

The impurity regions 156 and 157 may be divided into three regions containing an impurity element imparting an n-type. Third impurity regions 156a and 157a contain the impurity element imparting the n-type in a concentration of $1\times10^{20}$ to $1\times10^{21}$/cm$^3$, fourth impurity regions (A) 156b and 157b contain the impurity element imparting the n-type in a concentration of $1\times10^{17}$ to $1\times10^{20}$/cm$^3$; and fourth impurity regions (B) 156c and 157c contain the impurity element imparting the n-type in a concentration of $1\times10^{16}$ to $5\times10^{18}$/cm$^3$. However, the concentration of the impurity element imparting the p-type in the impurity regions 156b, 156c, 157b, and 157c is set equal to or greater than $1\times10^{19}$/c$^3$, and the concentration of the impurity element imparting the p-type in the third impurity regions 156a and 157a is set as 1.5 to 3 times thereof. As a result, the third impurity regions function as source and drain regions of the p-channel TFT. Besides, the fourth impurity regions (B) 156c and 157c are formed partially overlapping with the conductive layers 140 and 142 with the second taper shape.

Thereafter, as shown in FIG. 17A, a first interlayer insulating film 158 is formed on the gate electrode and the gate insulating film. The first interlayer insulating film may be formed of a silicon oxide film, a silicon oxynitride film, a silicon nitride film or a laminate film that is a combination thereof. Whichever is used, the first interlayer insulating film is formed from inorganic insulating materials. The film thickness of the first interlayer insulating film 158 is set from 100 to 200 nm. Here, in the case where a silicon oxide film is used, the film formation is performed by the plasma CVD method under the conditions that TEOS (tetraethyl orthosilicate) and $O_2$ are mixed with each other, a reaction pressure is made 40 Pa, a substrate temperature is made 300 to 400° C., and discharge is made at a high frequency (13.56 MHz) with a power density of 0.5 to 0.8 W/cm$^2$. Besides, in the case where a silicon oxynitride film is used, a silicon oxynitride film formed from $SiH_4$, $N_2O$, and $NH_3$, or a silicon oxynitride film formed from SiH$_4$ and N$_2$O, by the plasma CVD method, may be used for the formation. The manufacturing conditions in this case are such that a reaction pressure is 20 to 200 Pa, a substrate temperature is 300 to 400° C., and a high frequency (60 MHz) power density of 0.1 to 1.0 W/cm$^2$ is applied. Also, a silicon oxynitride hydride film formed from SiH$_4$, N$_2$O, and H$_2$ may be applied thereto. The silicon nitride film may be formed from SiH$_4$, and NH$_3$ similarly by the plasma CVD method.

Then, a process of activating the impurity elements imparting the n-type or the p-type, which are added in each concentration, is carried out. The thermal annealing method using an annealing furnace is used in this process. In addition, the laser annealing method, or the rapid thermal annealing (RTA) method can be applied to this process. Thermal annealing is performed at 400 to 700° C., typically between 500 and 600° C., in a nitrogen atmosphere in which a concentration of oxygen is equal to or less than 1 ppm, preferably equal to or less than 0.1 ppm. In Embodiment 6, heat treatment at 550° C. for 4 hours is conducted. Besides, in the case of using a plastic substrate with a low heat resistance temperature for the substrate 101, the laser annealing method is preferred to be used.

Successively to the activation process, a hydrogenation process of the island-like semiconductor layers is performed by changing the atmosphere gas and by performing heat treatment at 300 to 450° C. for 1 to 12 hours in an atmosphere containing between 3 and 100% hydrogen. This is a process for terminating dangling bonds of $10^{16}$ to $10^{18}$/cm$^3$ in the semiconductor layers by thermally excited hydrogen. Plasma hydrogenation (using hydrogen which is excited by the plasma) may also be used as another means of hydrogenation. Whichever method is used, it is desired that the defect density in the semiconductor layers 104 to 108 is made less than or equal to $10^{16}$/cm$^3$. Therefore, hydrogen corresponding to approximately 0.01 to 0.1% of the number of all atoms contained in the island-like semiconductor layers may be given thereto.

A second interlayer insulating film 159 made of organic resin is then formed into a thickness of 1.0 to 1.5 μm. Polyimide, acrylic, polyamide, polyimideamide, or BCB (benzocyclobutene) may be used as the organic resin. Here, polyimide, which is thermally polymerized after application onto a substrate, is used and baked at 300° C. to form the second interlayer insulating film 159.

As described above, the second interlayer insulating film is formed from the organic insulating material, thereby being capable of leveling the surface thereof satisfactorily. In addition, organic resin materials generally have low dielectric constant, thereby being capable of reducing a parasitic capacitor. However, these organic insulating materials are hygroscopic, thereby being not suitable as a protective film. Accordingly, it is preferable to use the organic insulating materials together with a silicon oxide film, a silicon oxynitride film, a silicon nitride film, or the like, formed as the first interlayer insulating film 158.

Thereafter, a resist mask with a predetermined pattern is formed using the fourth photo mask (PM4). Contact holes are then formed in the respective island-like semiconductor layers, which reach the impurity regions to be the source or the drain regions. The formation of the contact holes is conducted by the dry etching method. In this case, a mixture gas of CF$_4$, O$_2$ and He is used as the etching gas, and the second interlayer insulating film 159 formed from an organic resin material is first etched. Then the first interlayer insulating film 158 is successively etched by substituting the etching gas to CF$_4$ and O$_2$. In addition, in order to increase the selective ratio to the island-like semiconductor layer, the etching gas is changed over to CHF$_3$ to etch the gate insulating film 109c. As the result, it is possible to form contact holes.

Then, a conductive metallic film is formed by the sputtering method or the vacuum evaporation method, a resist mask pattern is formed using the fifth photo mask (PM5), and source wirings 160 to 164 and drain wirings 165 to 168 are formed. A pixel electrode 169 is formed together with the drain wirings. A pixel electrode 171 represents the pixel electrode belonging to the adjacent pixel. In Embodiment 6, Ti films are formed from into a thickness of 150 nm although not shown, contact with the source or the drain regions in the island-like semiconductor layers is formed, an aluminum (Al) films are formed with a thickness of 300 to 400 nm (shown as 160a to 169a in FIG. 17B) to overlap on the Ti films, and the transparent conductive films are formed into 80 to 120 nm (indicated by 160b to 169b in FIG. 17B). For the transparent conductive films, indium zinc oxide alloy (In$_2$O$_3$—ZnO) and zinc oxide (ZnO) are suitable. In addition, in order to enhance the transmissivity or the conductivity of visible light, zinc oxide (ZnO:Ga) in which gallium (Ga) is added is preferably used.

In this way, with the five photo masks, it is possible to complete the TFTs of the driver circuit and the pixel TFT of the display portion on the same substrate. A first p-channel TFT 200, a first n-channel TFT 201, a second p-channel TFT 202 and a second n-channel TFT 203 are formed in the driver circuit, and a pixel TFT 204 and a storage capacitor 205 are formed in the pixel portion. In the present specification, for convenience, such a substrate is called an active matrix substrate.

The first p-channel TFT 200 in the driver circuit has a structure having: the conductive layer having the second taper shape functioning as a gate electrode 220, an island-like semiconductor layer 104 having a channel forming region 206 and a third impurity region 207a functioning as a source or drain region, a fourth impurity region (A) 207b forming an LDD region not overlapping the gate electrode 220, and a fourth impurity region (B) 207c forming an LDD region partially overlapping the gate electrode 220.

The first n-channel TFT 201 has a structure including: the second taper shape conductive layer functioning as a gate electrode 221; an island-like semiconductor layer 105 having a channel forming region 208 and a first impurity region 209a functioning as a source or drain region; a second impurity region (A) 209b forming an LDD region not overlapping the gate electrode 221; and a second impurity region (B) 209c forming an LDD region partially overlapping with the gate electrode 221. The length of the portion where the second impurity region (B) 209c overlapping the gate electrode 221 is set 0.3 to 0.3 μm with respect to the channel length of 2 to 7 μm. The above length is controlled based on the thickness of the gate electrode 221 and an angle of the taper portion. In the n-channel TFT, such LDD regions are formed so that high electric field generated in the vicinity of the drain region is relieved, thereby being capable of preventing hot carriers from generating and the deterioration of the TFT.

The second p-channel TFT 202 of the driver circuit takes a structure, similarly, including: the second taper shape conductive layer functioning as a gate electrode 222; an island-like semiconductor layer 106 having a channel forming region 210 and a third impurity region 211a functioning as a source or drain region; a fourth impurity region (A) 211b forming an LDD region not overlapping the gate electrode 222; and a fourth impurity region (B) 211*c* forming an LDD region partially overlapping with the gate electrode 222.

The second n-channel TFT 203 of the driver circuit takes a structure including: the second taper shape conductive layer functioning as a gate electrode 223; aisland-like semiconductor layer 107 having a channel forming region 212 and a third impurity region 213*a* functioning as a source or drain region; a second impurity region (A) 213*b* forming an LDD region not overlapping the gate electrode 223; and a second impurity region (B) 213*c* forming an LDD region partially overlapping with the gate electrode 223. Similar to the second n-channel TFT 201, the length of the portion where the second impurity region (B) 213*c* overlapping the gate electrode 223 is set 0.1 to 0.3 µm.

The driver circuit is composed of a shift resistor circuit, a logic circuit such as a buffer circuit, a sampling circuit such as an analog switch, and the like. In FIG. 17B, the TFT forming those circuits is shown as a single gate structure in which a single gate electrode is formed between a pair of source and drain. However, a multi sate structure may be employed in which a plurality of electrodes are formed between the pair of source and drain.

The pixel electrode 204 takes a structure including: the second taper shape conductive layer functioning as a gate electrode 224; an island-like semiconductor layer 108 having a channel forming regions 214*a*, 214*b* and a first impurity region 215*a* functioning as a source or drain region; a second impurity region (A) 215*b* forming an LDD region not overlapping the gate electrode 224; and a second impurity region (B) 215*c* forming an LDD region partially overlapping with the gate electrode 224. The length of the portion where the second impurity region (B) 215*c* overlapping the gate electrode 224 is set 0.1 to 0.3 µm. Further, a storage capacitor 205 is formed from: a semiconductor layer, which extends from the first impurity region 217, and has the second impurity region (A) 219*a*, the second impurity region (B) 219*b*, and a region 218 to which no impurity element imparting the conductivity type is doped; the insulating layer formed in the same layer as the third shape gate insulating film; and a capacitance wiring 225 formed from the second taper shape conductive layer.

Figure 23:
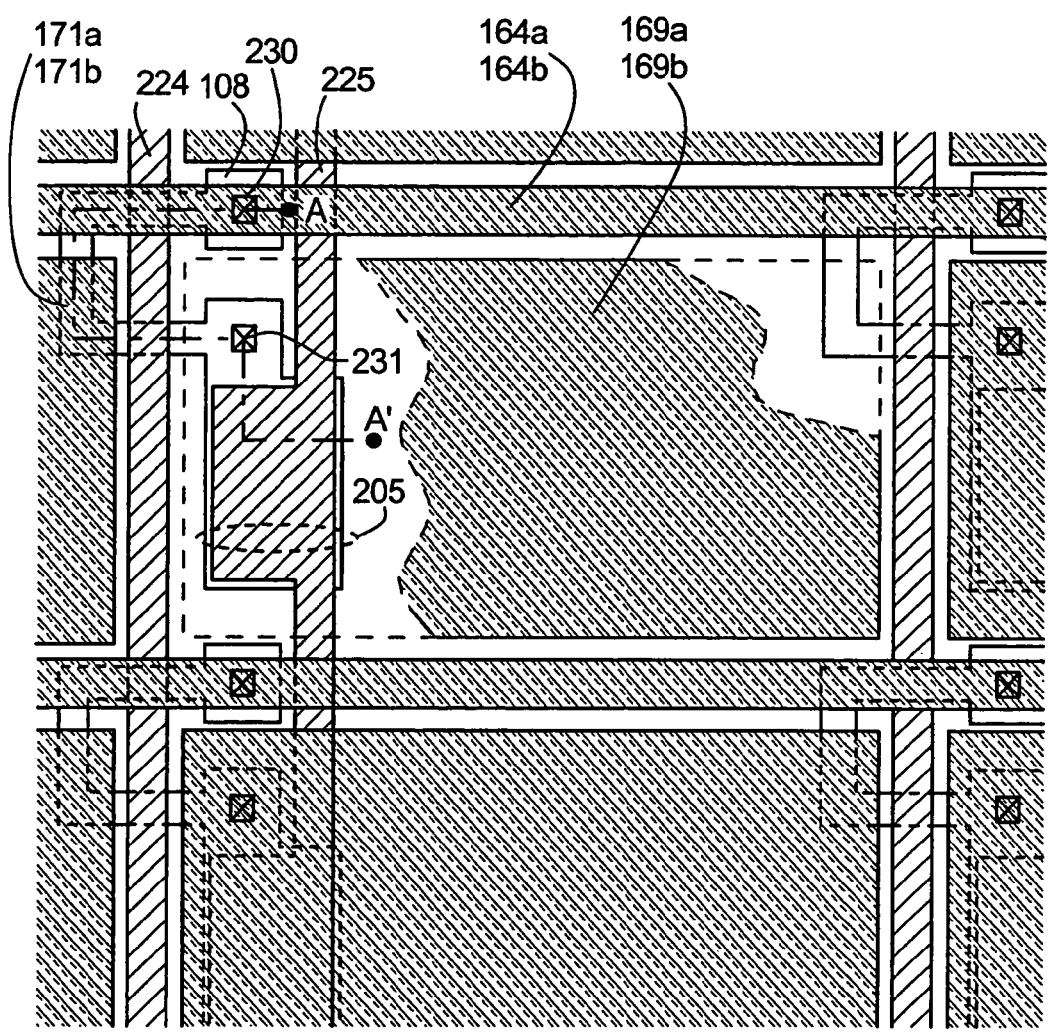
FIG. 23 is a top view of a pixel of a pixel portion.

FIG. 23 is a top view showing approximately one pixel portion in the pixel portion. The cross-sectional view of the pixel portion shown in FIG. 17B corresponds to the cross-section taken along the ling of A–A'. In the pixel TFT 204, the gate electrode 224 intersects with the island-like semiconductor layer 108 under the gate insulating film (not shown) via the same. Further, the gate electrode 224 extends over the plurality of island-like semiconductor layer and serves as the gate wirings. Although not shown in the figure, the source regions, drain regions, and LDD regions which were described with reference to FIG. 17B, are formed in the island-like semiconductor layer. Further, reference numeral 230 denotes a contact portion of the source wiring 164 and the source region 215*a*, and reference numeral 231 is a contact portion of the pixel electrode 169 and the drain region 217. The storage capacitor 205 is formed such that the semiconductor layer extending from the drain region 217 of the pixel TFT 204 overlaps the capacitance wiring 225 via the gate insulating film. In this structure, an impurity element that aims to control the valence electron is not added to the semiconductor layer 218.

The above-mentioned structure optimizes the structures of the TFTs constructing the respective circuits based on the specification which the pixel TFT and the driver circuit require, whereby enabling the operational performance and the reliability of the semiconductor device to be enhanced. In addition, the gate electrode is formed from the conductive materials having heat resistance, whereby facilitating the crystallization of the LDD regions, source regions, and drain regions. Furthermore, when the LDD region which overlaps with the gate electrode via the gate insulating film is formed, the LDD region is formed using impurity elements with concentration gradient, which is added for the purpose of controlling the conductive type, with the result that the enhancement of an electric field reliving effect, particularly in the vicinity of the drain region, can be expected.

Figure 21A:
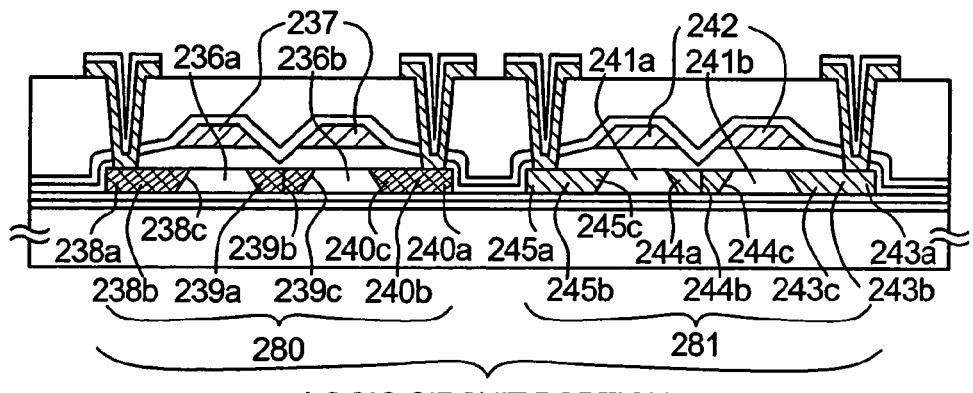
FIGS. 21A and 21B are cross-sectional views showing the structure of the TFT of the driver circuit.

In the case of an active matrix liquid crystal display device, the first p-channel TFT 200 and the first n-channel TFT 201 are used to form the shift resistor circuit, buffer circuit, level shifter circuit, and the like. In FIG. 17B, these circuits are represented as a logic circuit portion. The second impurity region (B) 209*c* of the first n-channel TFT 201 takes a structure in which an attention is paid on the countermeasure to the hot carriers. Further, in order to enhance the pressure resistance to thereby stabilize the operation, as shown in FIG. 21A, the TFT in the logic circuit portion may be formed from a first p-channel TFT 280 and a first n-channel TFT 282. This TFT has a double gate structure having two gate electrodes provided between a pair of source and drain, and these TFTs may similarly be formed using the processes in accordance with Embodiment 6. The first p-channel TFT 280 takes a structure including: an island-like semiconductor layer having channel forming regions 236*a*, 236*b*; third impurity regions 238*a*, 239*a*, 240*a* functioning as the source or drain regions: fourth impurity regions (A) 238*b*, 239*b*, 240*b* forming LDD regions; and fourth impurity regions (B) 238*c*, 239*c*, 240*c*, forming LDD regions partially overlapping with a gate electrode 237. The first n-channel TFT 281 takes a structure including: an island-like semiconductor layer having channel forming regions 241*a*, 241*b*; first impurity regions 243*a*, 244*a*, 245*a* functioning as the source or drain regions: second impurity regions (A) 243*b*, 244*b*, 245*b* forming LDD regions; and second impurity regions (B) 243*c*, 244*c*, 245*c*, forming LDD regions partially overlapping with a gate electrode 242. The channel length is set between 3 and 7 µm, and the length of the LDD region in the channel length direction overlapping with the gate electrode is set between 0.1 and 0.3 µm.

Besides, as a sampling circuit constructed of an analog switch, the second p-channel TFT 202 and the second n-channel TFT 203 may be adopted. An attention is paid on the hot carrier countermeasures and low off current operation, and therefore the TFTs for this circuit may be formed from a second p-channel TFT 282 and a second n-channel TFT 283. This second p-channel TFT 282 has a triple gate structure in which three gate electrodes are formed between a pair of source and drain, and these TFTs may similarly be formed using the processes in accordance with Embodiment 6. The second p-channel TFT 282 takes a structure including: an island-like semiconductor layer having channel forming regions 246*a*, 234*b*, 246*c*; third impurity regions 249*a*, 250*a*, 252*a*, 252*a* functioning as the source or drain regions: fourth impurity regions (A) 249*b*, 250*b*, 251*b*, 252*b* forming LDD regions; and fourth impurity regions (B) 249*c*, 250*c*, 251*c*, 252*c* forming LDD regions partially overlapping with a gate electrode 247. The second n-channel TFT 283 takes a structure including: an island-like semiconductor layer having channel forming regions 253*a*, 253*b*; first impurity regions 255*a*, 256*a*, 257*a* functioning as the source or drain regions: second impurity regions (A) 255*b*, 256*b*, 257*b* forming LDD regions; and second impurity regions (B) 255*c*, 256*c*, 257*c*, forming LDD regions partially overlapping with a gate electrode 254. The channel length is set between 3 and 7 μm, and the length of the LDD region in the channel length direction overlapping with the gate electrode is set between 0.1 and 0.3 μm.

Which of the single gate structure or the multi gate structure having a plurality of electrodes formed between a pair of source and drain, is used as the structure of the gate electrode of the TFT may be appropriately selected by an operator in accordance with the characteristics of the circuit. A reflection type liquid crystal device can be manufactured by using the active matrix substrate completed in accordance with Embodiment 6.

[Embodiment 7]

In Embodiment 6, an example is described in which heat resistant conductive materials such as W and Ta are used as the material of the gate electrode. The reason why such materials are used resides in that the impurity element, which is added to the semiconductor layer after the formation of the gate electrode for the purpose of controlling the conductive type, has to be activated by thermal annealing at 400 to 700° C., and therefore it is necessary for the gate electrode to have a heat resistance to carry out the process. However, such heat resistant conductive material has a surface resistance of about 10 Ω, thereby being not suited for the display device having a screen size of 4 inches or more. If the gate wiring connecting to the gate electrode is formed from the same materials, the drawing length of the wiring is inevitably long. As a result, it becomes difficult to disregard the problem of wiring delay due to influence of the wiring resistance.

In the case where the pixel density is VGA, for example, 480 gate wirings and 640 source wirings are formed, and in the case of XGA, 768 gate wirings and 1,024 source wirings are formed. The length of the diagonal line of the screen in the display portion is 340 mm in case of 13 inches-size, and in case of 18 inches-size, the length is 460 mm. In Embodiment 7, as the method for realizing such liquid crystal display devices, a method in which the gate wiring is formed from low resistant conductive materials such as Al and copper (Cu) will be described with reference to FIGS. 18A and 18B.

First, processes shown in FIGS. 15A to 16C are conducted as in Embodiment 6. Then, for controlling the conductive type, a process for activating impurity elements added to the respective island-like semiconductor layers are performed. This process is performed by the thermal annealing method using furnace anneal. In addition, the laser annealing method, or the rapid thermal anneal method (RTA method) may be adopted for the process. In the thermal annealing method, heat treatment is performed in a nitrogen atmosphere with a concentration of oxygen which is less than or equal to 1 ppm, preferably less than or equal to 0.1 ppm, at 400 to 700° C., typically 500 to 500° C., 500° C. for 4 hours in Embodiment 7.

Figure 18A:
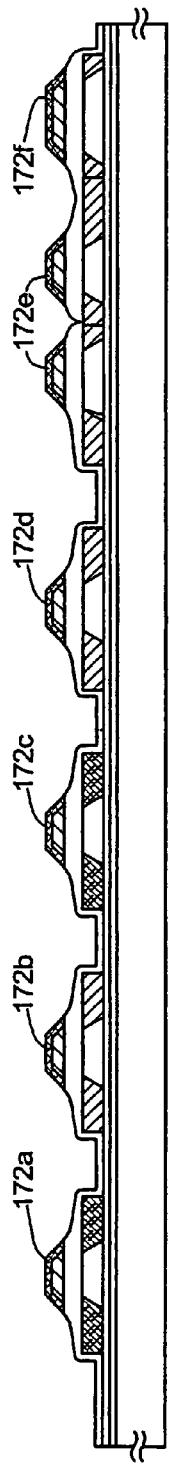
FIGS. 18A to 18C are cross-sectional views showing a manufacturing process of the pixel TFT and the TFT of the driver circuit.

In the heat treatment, conductive layers 172*a* to 172*f* are formed on a second taper shape conductive layers 140 to 145 with a thickness of 5 to 80 nm from the surface thereof. If the second taper shape conductive layer is W, for example, tungsten nitride is formed, and in the case of Ta, tantalum nitride is formed. Further, heat treatment is performed in an atmosphere containing 3 to 100% of hydrogen at 300 to 450° C. for 1 to 12 hours, and a hydrogenation process of the island-like semiconductor layer is performed. This is a process for terminating dangling bonds in the semiconductor layers by thermally excited hydrogen. Plasma hydrogenation (using hydrogen, which is excited by plasma) may also be used as another means of hydrogenation (FIG. 18A).

Figure 18B:
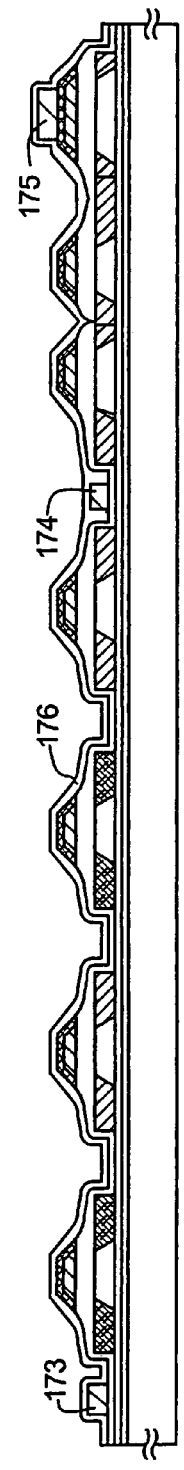

After the activation and hydrogenation process, gate wirings are formed from the low resistant conductive materials. The low resistant conductive materials contain as the main component Al or Cu, and the gate wirings are formed from the low resistant conductive layer made of such materials. Al film, for example, containing 0.1 to 2% by weight of Ti is formed on an entire surface as the low resistant conductive film (not shown). The low resistant conductive layer is formed into a thickness of from 200 nm to 400 nm (preferably 250 to 350 nm). A predetermined resist pattern is then formed, and an etching process is performed to form gate wirings 173 and 174. At this time, a capacitance wiring 175 connecting the storage capacitor is also formed in the pixel portion using the same material. If the low resistant conductive layer is a material containing Al as the main component, the etching process is performed by wet etching using a phosphoric based etching solution, with the result that the gate wiring may be formed while keeping the selective processibility to the base. A first interlayer insulating film 176 is formed in a similar manner to Embodiment 6 (FIG. 18B).

Figure 19A:
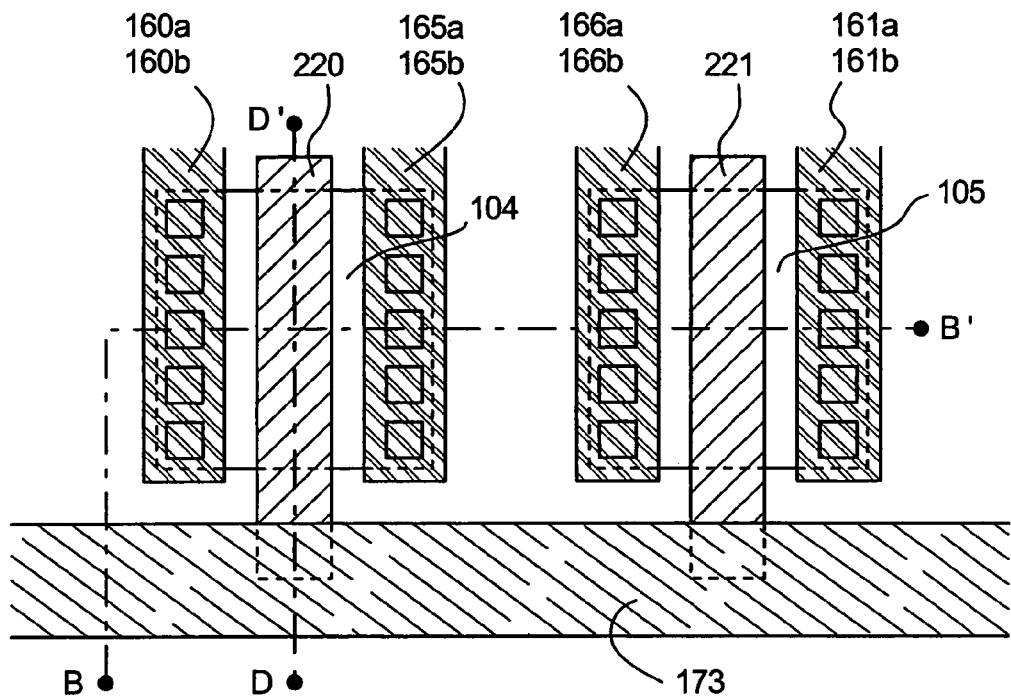
FIGS. 19A and 19B are top views showing the structures of the TFT of the driver circuit and the pixel TFT.
Figure 19B:
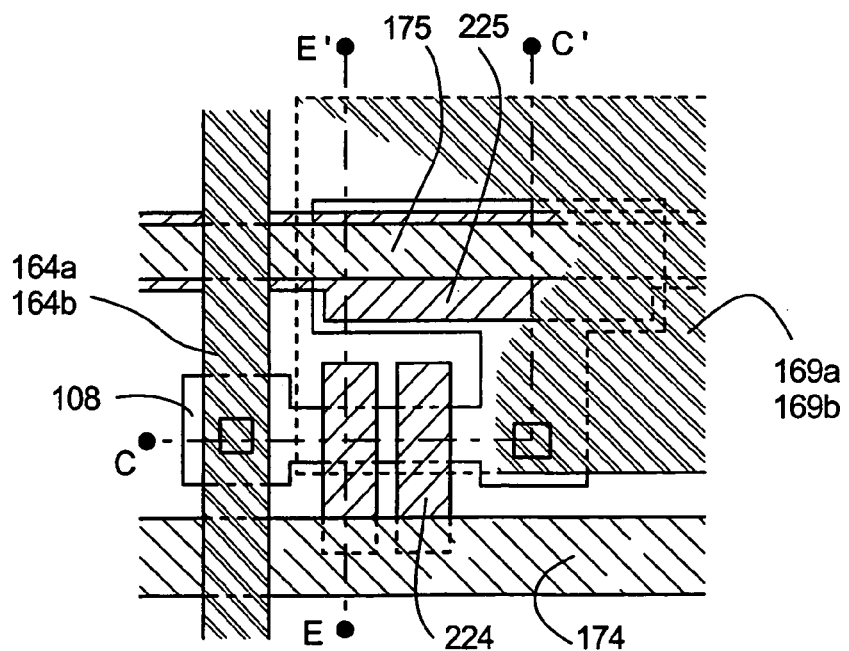
Figure 20A:
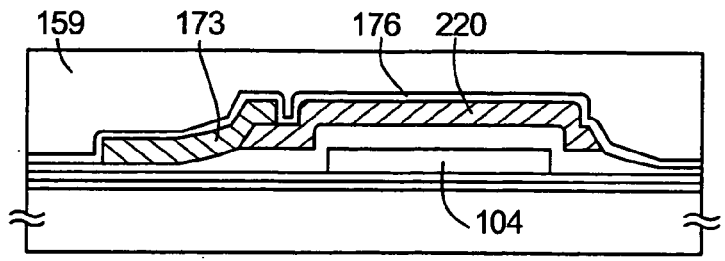
FIGS. 20A and 20B are cross-sectional views showing the structures of the TFT of the driver circuit and the pixel TFT.
Figure 20B:
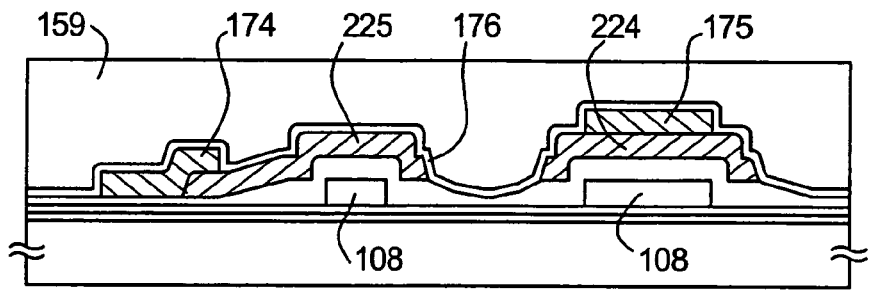

Thereafter, similar to Embodiment 6, a second interlayer insulating film 159, source wirings 160 to 164, drain wirings 165 to 168, pixel electrodes 169, 171 are formed to complete the active matrix substrate. FIGS. 19A and 19B show the top views of this state, and the cross-sections taken along the lines B–B' of FIG. 19A and C–C' of FIG. 19B correspond the cross-sections taken along the line B–B' and C–C' of FIG. 18C, respectively. In FIGS. 19A and 19B, the gate insulating film, the first interlayer insulating film, and the second interlayer insulating film are omitted. However, source wirings 160, 161, 164, drain wirings 165 and 166, and a pixel electrode 169 are connected via contact holes to the source and drain regions (not shown) in an island-like semiconductor layers 104, 105, 108. Besides, cross-sectional views taken along the line of D–D' of FIG. 19A and E–E' of FIG. 19B are shown in FIGS. 20A and 20B, respectively. The gate wirings 173 and 174 are formed so as to overlap with gate electrodes 220 and 225, respectively, at the outside of the island-like semiconductor layers 104 and 108, so the gate electrodes and the low resistant conductive layers are electrically communicated, not through the contact holes. Like this, the gate wirings are formed from the low resistant conductive materials, with the result that the wiring resistance may be sufficiently lowered. Therefore, the gate wiring thus formed may be adopted to the display device having a pixel portion (screen size) of 4 inches-size or more.

[Embodiment 8]

The active matrix substrate manufactured in Embodiment 6 may be applied to a reflection type display device just as it is. On the other hand, in the case that a transmission type liquid crystal display device is formed, a pixel electrode disposed in each pixel of a pixel portion may be formed of a transparent electrode. In Embodiment 8, a manufacturing method of an active matrix substrate that corresponds to a transmission type liquid crystal display device is explained with reference to FIGS. 22A to 22D.

Figure 22A:
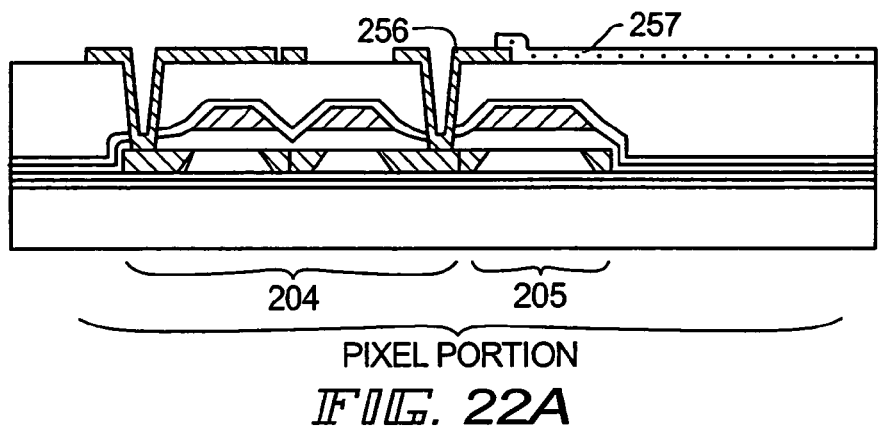
FIGS. 22A to 22D are cross-sectional views showing the structure of the pixel TFT.
Figure 22B:
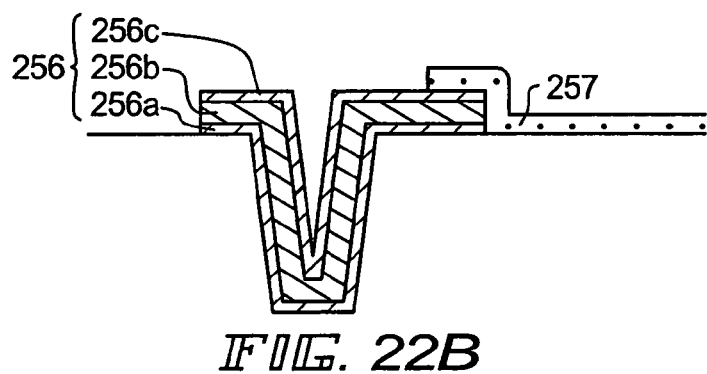

The active matrix substrate is manufactured as in Embodiment 6. In FIG. 22A, a source wiring and a drain wiring are formed from a conductive metallic film by sputtering or vacuum evaporation. This structure is described in detail in FIG. 22B taking a drain wiring 256 as an example. A Ti film 256*a* is formed with a thickness of 50 to 150 nm, and contact with a source or drain region in an island-like semiconductor layer is formed. An Al film 256b is formed with a thickness of 300 to 400 nm while overlapping with the Ti film 256a, and further, an Ti film 256c or a titanium nitride (TiN) film is formed with a thickness of 100 to 200 nm, thereby forming a three-layer structure. Thereafter, a transparent conductive film is formed on the entire surface, and a pixel electrode 257 is formed by patterning process or etching process using a photo mask. A pixel electrode 257 is formed on a second interlayer insulating film formed from organic resin material, and has a portion that overlaps with the drain wiring 256 of a pixel TFT 204 not through the contact hole, forming an electrical connection.

Figure 22C:
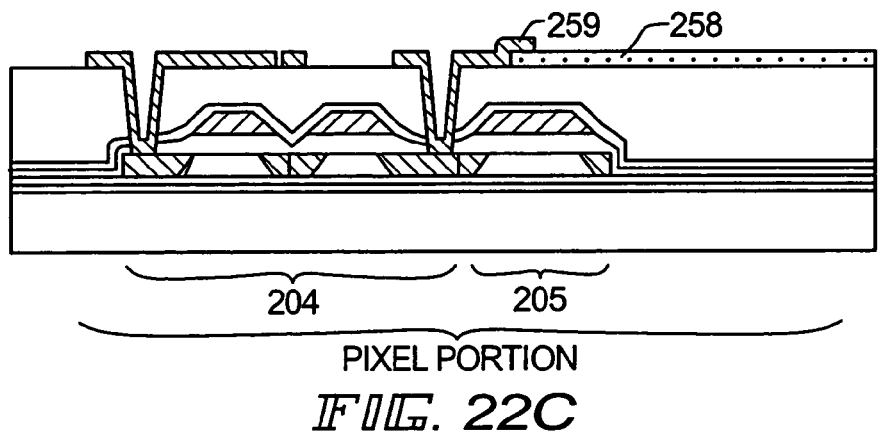
Figure 22D:
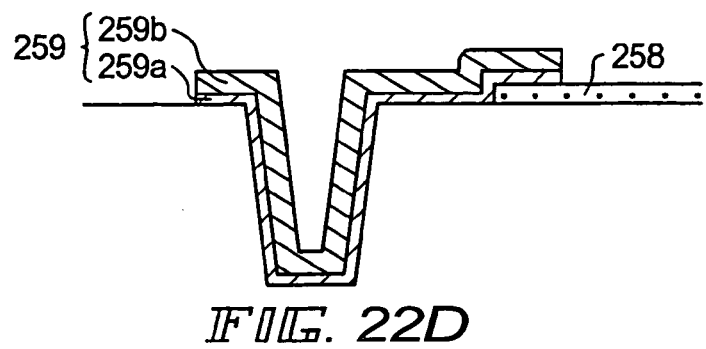

FIG. 22C is an example, in which a transparent conductive film is formed on the second interlayer insulating film first, a pixel electrode 258 is formed by patterning process and etching process, and thereafter, a connecting portion is formed such that a drain wiring 259 is connected to the pixel electrode 258 not through a contact hole. The drain wiring 259 is disposed as shown in FIG. 22D such that a Ti film 259a is formed with a thickness of 50 to 150 nm, contact with a source or drain region in an island-like semiconductor layer is formed, and an Al film 259b is formed with a thickness of 300 to 400 nm on the Ti film 259a. With this structure, the pixel electrode 258 comes in contact with only the Ti film 259a that forms the drain wiring 259. As a result, it can be positively prevented that a transparent conductive film material has a direct contact with Al to react with each other.

The transparent conductive film is formed from indium oxide ($In_2O_3$), indium oxide-tin oxide alloy ($In_2O_3$—$SnO_2$; ITO), or the like by sputtering or a vacuum evaporation method. The etching process for such a material is performed with a hydrochloric acid-based solution. However, since a residue is generated easily in etching ITO, indium oxide-zinc oxide alloy ($In_2O_3$—ZnO) may be used in order to improve etching workability. Indium oxide-zinc oxide alloy is excellent not only in surface levelness but also in heat-stability with respect to ITO. Thus, in the structures of FIGS. 29A, it can be prevented that the Al film 256b comes in contact with the pixel electrode 257 to generate erosion. Zinc oxide (ZnO) is also a suitable material. Further, zinc oxide to which gallium is added (ZnO:Ga) for increasing transmissivity of visible light or conductivity may be used.

In Embodiment 6, the active matrix substrate for manufacturing a reflection type liquid crystal display device is manufactured by five photo masks. However, if one photo mask is further added (six in total), the active matrix substrate corresponding to a transmission type liquid crystal display device can be completed. In Embodiment 8, the process similar to that in Embodiment 6 is explained. Such a structure may be applied to the active matrix substrate as shown in Embodiment 7.

[Embodiment 9]

Figure 24A:
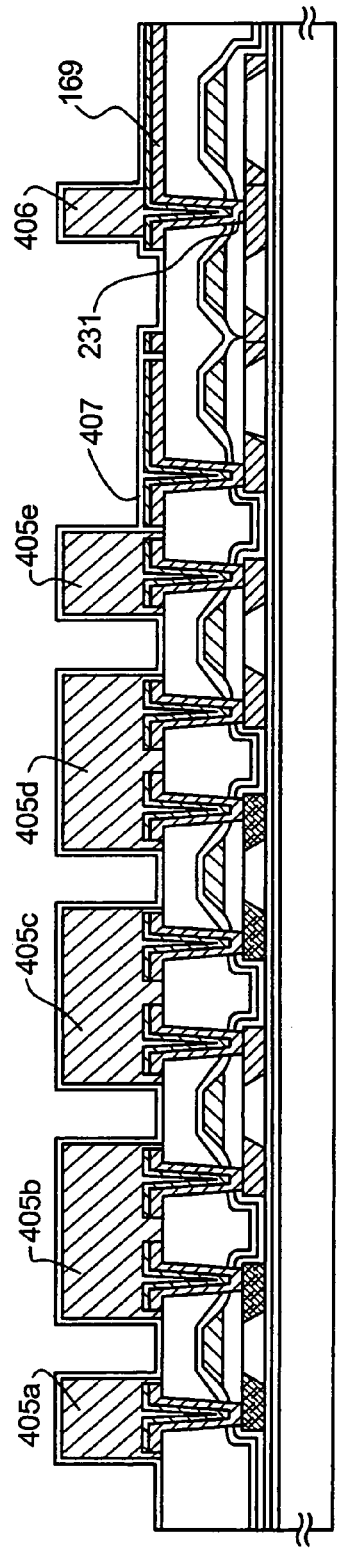
FIG. 24 are cross-sectional views showing a manufacturing process of an active matrix liquid crystal display device.

In Embodiment 9, a process for manufacturing an active matrix liquid crystal display device from the active matrix substrate manufactured in Embodiment 6 is explained. First, as shown in FIG. 24A, a spacer consisting of a columnar spacer is formed on the active matrix substrate in the state of FIG. 17B. Here, a method of forming a resin film on the entire surface of the substrate and thereafter patterning the resin film is adopted for forming the spacer although a method of scattering grains of several µm may be adopted. There is no limit on the material for such a spacer. However, for example, NN 700 manufactured by JSR Co. is used for application by a spinner, and then, a predetermined pattern of the spacer is formed by an exposure and a developing process. Further, heating is conducted at 150 to 200° C. using a clean oven to harden the spacer. The spacer manufactured in this way may be made in a different shape depending on the conditions for the exposure and the developing process. However, if the spacer is preferably made into a columnar shape with a flat top portion, the mechanical strength as a liquid crystal display panel can be ensured when the substrate and an opposing substrate are bonded with each other. The shape of the spacer is not limited to a specific one such as cone or pyramid. Specifically, when the conical shape is adopted for the spacer, for example, the height is set to 1.2 to 5 µm, the average radius is set to 5 to 7 µm, and the ratio of the average radius to the radius of the bottom portion is set to a ratio of 1 to 1.5. At this time, the taper angle of the side surface is set as ±15° or less.

The arrangement of the spacer is arbitrarily determined, but as shown in FIG. 24A, it is preferable that a columnar spacer 406 is formed so as to overlap with and cover a contact portion 231 of a pixel electrode 169 in the pixel portion. Since the contact portion 231 loses the levelness, and the liquid crystal is not oriented well in this portion, the columnar spacer 406 is formed such that the contact portion 231 is filled with resin for the spacer, thereby preventing discrimination and the like. Further, spacers 405a to 405e are formed on TFTs of a driver circuit. These spacers may be formed on the entire surface of the driver circuit portion, and may be formed so as to cover the source wiring and drain wiring as shown in FIG. 24A.

Thereafter, an orientation film 407 is formed. A polyimide resin is generally used for the orientation film of a liquid crystal display element. After the orientation film is formed, rubbing process is conducted so that liquid crystal molecules orient with a certain pre-tilt angle. It is set that the length of the region to which rubbing process is not conducted is less that or equal to 2 µm in the rubbing direction from the end portion of the columnar spacer 406 disposed in the pixel portion. Further, generation of static electricity often becomes a problem in the rubbing process. However, there may be obtained the effect that a TFT is protected against static electricity by the spacers 405a to 405e formed on the TFTs of the driver circuit. In addition, although not explained in the figure, such a structure may be taken that the spacers 406 and 405a to 405e are formed after the orientation film 407 is formed.

Figure 24B:
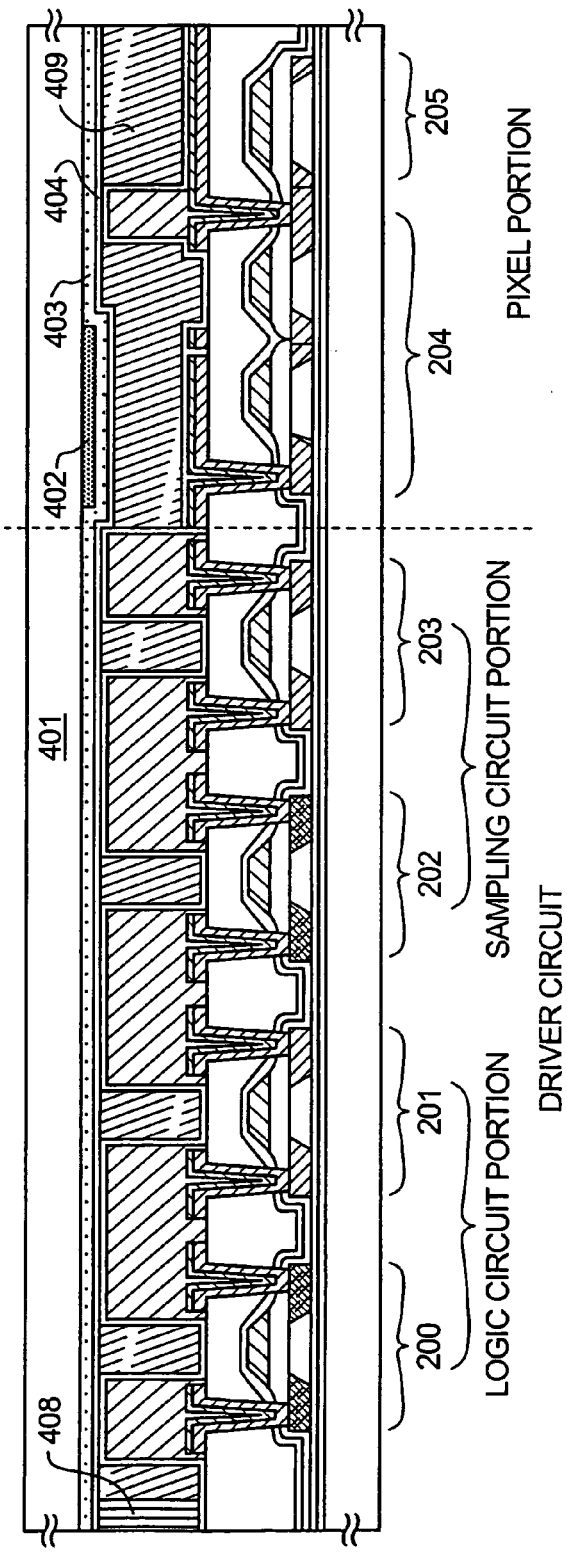

On the opposing substrate 401, a light shielding film 402, a transparent conductivity film 403 and an orientation film 404 are formed. The light shielding film 402 is formed from a film such as a Ti film, a Cr film or an AL film with a thickness of 150 to 300 nm. Then, the active matrix substrate on which the pixel portion and the driver circuit are formed and the opposing substrate are bonded together by a sealing agent 408. The sealing agent 408 is mixed with a filler (not shown), and with this filler and the spacers 406 and 405a to 405e, two substrates are bonded together with a uniform gap. Thereafter, a liquid crystal material 409 is injected between both substrates. As the liquid crystal material, known liquid crystal materials may be used. For example, not only the TN liquid crystal, but also a non-threshold antiferroelectric mixed liquid crystal showing an electro optical response property, in which the transmittivity with respect to an electric field continuously changes, may be used. This non-threshold antiferroelectric mixed liquid crystal may be one showing a V-shaped electro optical response property. In this way, an active matrix liquid crystal display device shown in FIG. 24B is completed.

Figure 25:
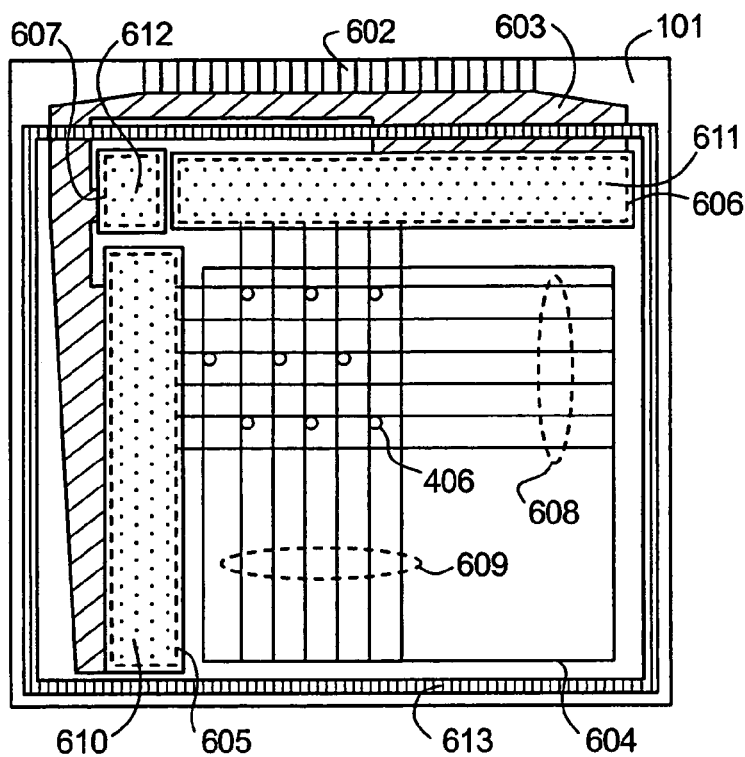
FIG. 25 is a top view explaining an arrangement of an input/output terminal, wirings, circuit arrangements, spacers, and an arrangement of sealing agents.

FIG. 25 shows a top view of an active matrix substrate and a top view of the positional relationships of the pixel portion and the driver circuit portion, and the spacer and sealing agent. On the glass substrate 101 described in Embodiment 6, a scanning signal driver circuit 605 and an image signal driver circuit 606 are provided as the driver circuit in the periphery of a pixel portion 604. Further, a signal processing circuit 607 such as a CPU and a memory may be provided. Then, these driver circuits are connected with the external input/output terminal 602 by the connecting wiring 603. In the pixel portion 604, the gate wiring group 608 extending from the scanning signal driver circuit 605 and the source wiring group 609 extending from the image signal driver circuit 606, crossover in matrix to form a pixel. Each pixel is provided with the pixel TFT 204 and the storage capacitor 205.

The columnar spacer 406 provided in the pixel portion in FIG. 24A may be provided in all pixels, but as shown in FIG. 25 may be provided every few to every tens of pixels arranged in matrix. Namely, it is possible for the ratio of the number of spacers to all the pixels constructing the pixel portion to be 20 to 100%. Further, the spacers 405a to 405e formed in the driver circuit portion may be provided to cover the entire surface or may be provided in accordance with the positions of the source and drain wiring of each TFT. In FIG. 25, positions of spacers provided in the driver circuit portion is shown by 610 to 612. Then, the sealing agent 619 shown in FIG. 25, is outside of the pixel portion 604 and the scanning signal driver circuit 605, the image signal driver circuit 606 and another signal processing circuit 607, which are on the substrate 101, and inner side than the external input/output terminal 602.

Figure 26:
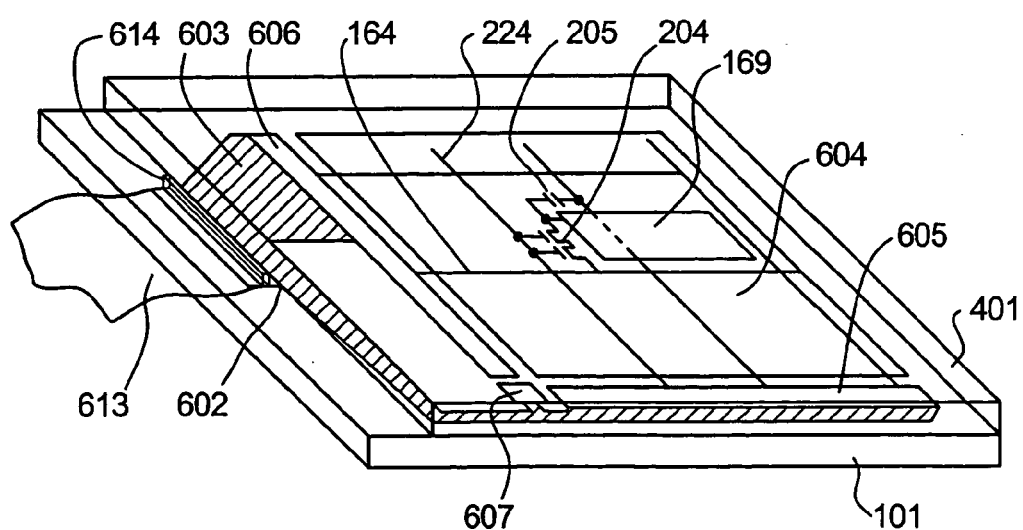
FIG. 26 is a perspective view showing the structure of the liquid crystal display device.

The structure of the active matrix liquid crystal apparatus is explained by using the perspective view shown in FIG. 26. The active matrix substrate in FIG. 26 is constructed by the pixel portion 604, the scanning signal driver circuit 605, the image signal driver circuit 606 and another signal processing circuit 607, formed on the glass substrate 101. The pixel portion 604 is provided with the TFT 204 and the storage capacitor 205, and the driver circuit provided in the periphery of the pixel portion is constructed with the CMOS circuit as the basis. From the scanning signal driver circuit 605 and the image signal driver circuit 606 respectively, gate wiring (when it is formed continuously with the gate electrode, it corresponds to 224 of FIG. 17B) and a source wiring 164 are extended to the pixel portion 604, and connected to the pixel TFT 204. Further, the flexible print wiring plate (flexible printed circuit; FPC) 613 is connected to the external input terminal 602 to be used for input of such as an image signal. The connection wiring 603 is connected to the respective driver circuits. Further, on the opposing substrate 401, the shielding film and the transparent electrode (not shown) are provided.

A liquid crystal display device with the above structure may be formed using the active matrix substrate shown in Embodiments 6 to 8. If the active matrix substrate described in Embodiment 6 is used, a reflection type liquid crystal display device may be obtained, and if the active matrix substrate described in Embodiment 8 is used, a transmission type liquid crystal display device may be obtained.

[Embodiment 10]

Figure 27:
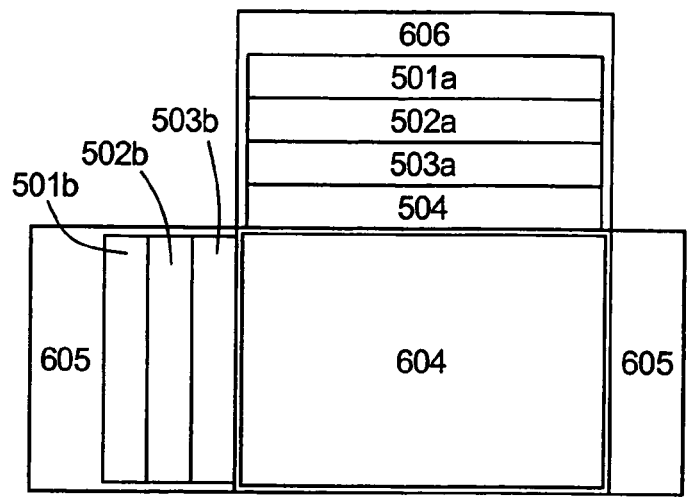
FIG. 27 is a block diagram explaining a circuit configuration of the active matrix display device.

FIG. 27 shows one example of a circuit structure of an active matrix substrate shown in Embodiments 6 to 8, and shows a circuit structure of a direct-vision type display device. This active matrix substrate consists of an image signal driver circuit 606, scanning signal driver circuits (A) and (B) 605 and a pixel portion 604. Note that, the driver circuit shown in this specification is a generic term including the image signal driver circuit 606 and the scanning signal driver circuit 605.

The image signal driver circuit 606 includes a shift register circuit 501a, a level shifter circuit 502a, a buffer circuit 503a and a sampling circuit 504. Further, scanning signal driver circuits (A) and (B) 185 include a shift register circuit 501b, a level shifter 502b, and a buffer circuit 503b.

The shift register 501a and 501b have a driving voltage of from 5 to 16 V (typically 10 V) and the TFT of the CMOS circuit forming this circuit may be formed of the first p-channel TFT 200 and the first n-channel TFT 201 shown in FIG. 17B. Further, the driving voltages of the level shifter circuits 502a and 502b and the buffer circuits 503a and 503b are as high as 14 to 16 V, so that it is preferable to have a multi-gate TFT structure as shown in FIG. 21A. If a TFT is formed with a multi-gate structure, the withstand voltage increases to thereby have an effect in improving the reliability of the circuits.

Figure 21B:
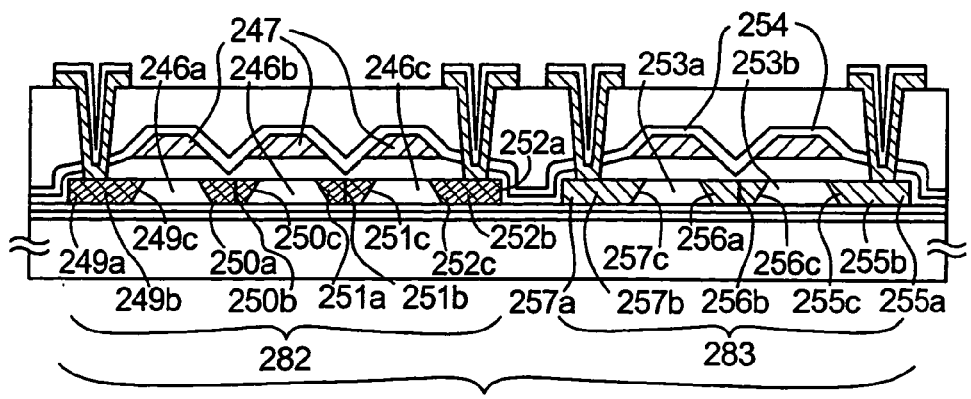

A sampling circuit 504 is formed of analog switches with the driving voltage of 14 to 16 V. Since driving is performed with inverting the polarity alternately, and it is necessary to reduce the off current value, it is preferable to form the sampling circuit 504 with the second p-channel TFT 202 and the second n-channel TFT 203 shown in FIG. 17A. To reduce the off current value effectively, the sampling circuit 504 may be formed by the second p-channel TFT 282 and the second n-channel TFT 283 shown in FIG. 21B.

The pixel portion has a driving voltage of from 14 to 16 V, and it is required to reduce the off current value more than the sampling circuit from the viewpoint of lowering the power consumption. Therefore the multi-gate structure of the pixel TFT 204 shown in FIG. 17B is considered as the basis.

The structure of Embodiment 10 may be realized easily by manufacturing a TFT according to the processes shown in Embodiments 6 to 8. In Embodiment 10, only the structures of the pixel portion and the driver circuit are shown, but in accordance to the processes of Embodiments 6 to 8, it is possible to form on the same substrate a signal dividing circuit, a subharmonic circuit, a D/A converter, a χ correction circuit, an operational amplifier circuit, and further a signal processing circuit such as a memory circuit or an arithmetic process circuit, or a logical circuit. In this way, a semiconductor device including a pixel portion and a driver circuit on the same substrate, for example a liquid crystal display device having a signal control circuit and a pixel portion, may be realized.

[Embodiment 11]

Figure 28A:
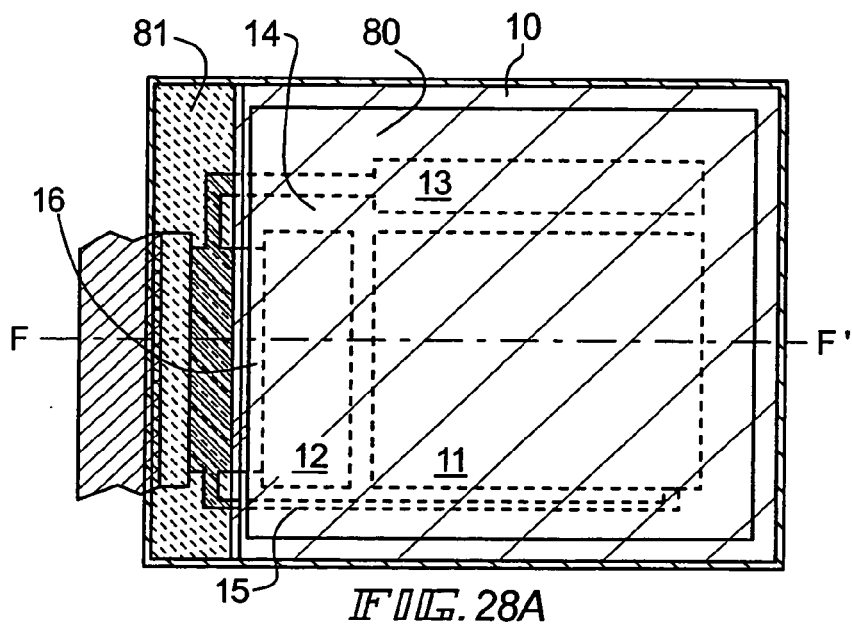
FIGS. 28A and 28B are a top view and a cross-sectional view showing the structure of a light-emitting device.

In Embodiment 11, as an example of a light-emitting device using an active matrix substrate, the manufacturing example of which is described in the above-mentioned embodiments, an example of manufacturing a self-light-emitting type display panel (hereinafter referred as EL display device) using an El material (EL: electro luminescence) will be described. FIG. 28A is a top view of the EL display panel in accordance with the present invention. In FIG. 28A, reference numeral 10 denotes a substrate; 11, a pixel portion; 12, a source side driver circuit; and 13, a gate side driver circuit, and the respective driver circuits reach an FPC 17 through wirings 14 to 16 to be connected to external equipment.

The light-emitting device, also called a light emitting diode, is a device using a layer containing an organic compound (light-emitting element) as a light source, in which luminescence (Electro Luminescence) generated by application of an electric field is obtained. Luminescence in an organic compound includes light emission (fluorescence) generated when a single excited state returns to a ground state and light emission (phosphorescence) generated when a triplet excited state returns to the ground state.

Figure 28B:
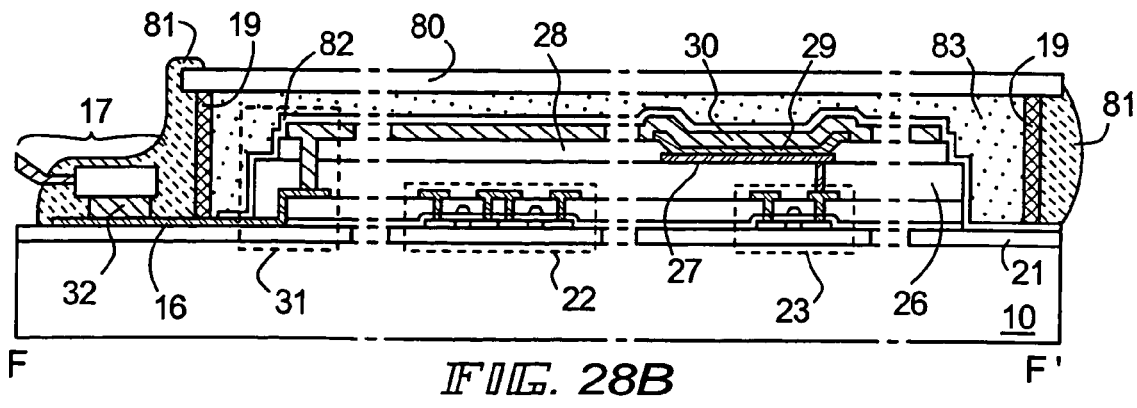

FIG. 28B is a cross sectional view taken along the line of A–A' of FIG. 28A. In this case, an opposing plate 80 is provided at least over the pixel portion, preferably both over the driver circuit and the pixel portion. The opposing plate 80 is bonded together by a sealing agent 19 with the active matrix substrate on which TFTs and the EL layer are formed. In the sealing agent 19, filler (not shown) is mixed. As a result, two substrates are bonded together with a substantially uniform gap therebetween by the merit of the filler. In addition, a structure is taken, in which an outside of the sealing agent 19 and the top and periphery of the FPC 17 are air-tightly sealed by an sealant 81. The sealant 81 may uses the material such as a silicon resin, an epoxy resin, phenol resin, or butyl rubber.

Like this, if the active matrix substrate 10 and the opposing substrate 80 are bonded together by the sealing agent 19, the gap is formed therebetween. In the gap, a filler 83 is charged thereinto. The filler 83 also has an effect to bond the opposing substrate 80. The filler 83 may use PVC (polyvinyl chloride), the epoxy resin, the silicon resin. PVB (polyvinyl butyl), EVA (ethylene vinyl acetate), or the like. Besides, the EL layer is weak in moisture such as water, thereby easily degrading. Therefore, if a drying agent such as barium oxide is mixed in the filler 83, a moisture-absorption effect can be retained, which is preferable. Further, a structure is taken, in which a passivation film 82 formed from a silicon nitride film or a silicon oxynitride film is formed on the EL layer, to thereby protect corrosion caused by an alkaline element contained in the filler 83.

As the opposing plate 80, a glass plate, an aluminum plate, a stainless plate, an FRP (Fiberglass-Reinforced Plastics) plate, a PVF (polyvinyl fluoride) film, a Mylar film (a trade name of Dupont), a polyester film, an acrylic film, an acrylic plate, or the like can be used. Besides, a sheet having a structure in which an aluminum foil of several tens μm is sandwiched between PVF films or Mylar films may be used to enhance the moisture resistance. In this manner, the EL element is made into an air-tight state, thereby being protected from exposing to the air.

Also, in FIG. 28B, on the base film 21 on the substrate 10, a driver circuit TFT 22 (It is to be noted that a CMOS circuit is illustrated here, in which an n-channel TFT and a p-channel TFT are combined.) and a pixel TFT 23 (It is to be noted that only a TFT for controlling a current flown into the EL element is illustrated here.) are formed. Of those TFTs, particularly in the n-channel TFT, an LDD region with a structure described in Embodiment 11 is provided to prevent lowering of ON current due to a hot carrier effect, and to prevent lowering of characteristics caused by a V-th shift or a bias stress.

For example, as the driver TFT 22, p-channel TFTs 200, 202 and n-channel TFTs 201, 203, which are shown in FIG. 17B, may be used. Further, the pixel TFT 204 shown in FIG. 17B or a p-channel TFT with a similar structure to the pixel TFT 204 may be used as the pixel TFT 23.

Figure 18C:
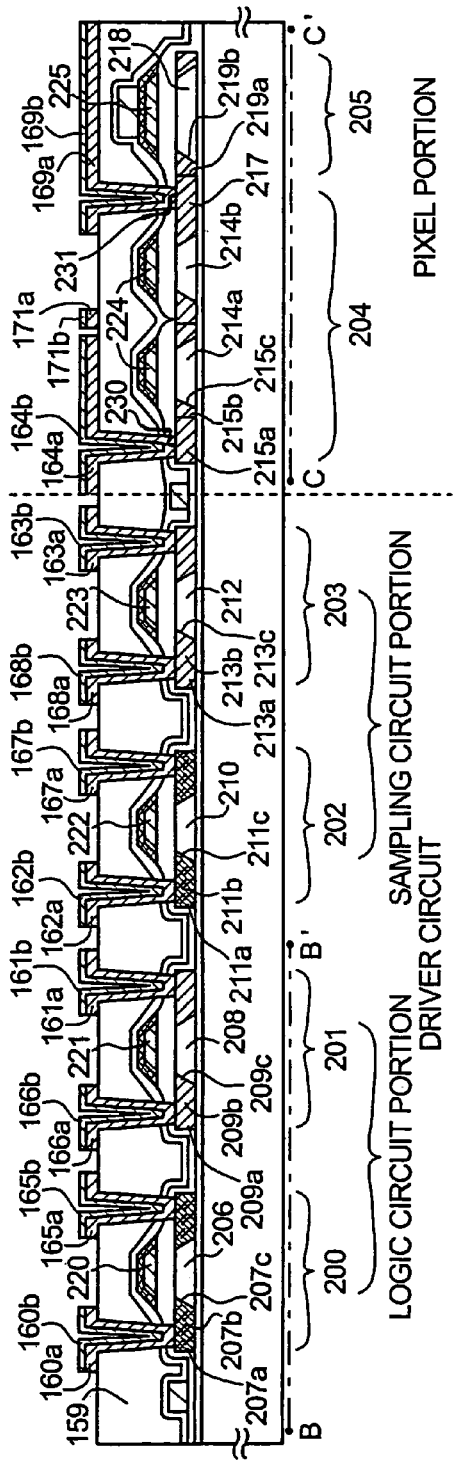

In order to form an EL display device from the active matrix substrate which is a state shown in FIG. 17B or FIG. 18C, an interlayer insulating film (leveling film) 26 made of resin material is formed on the source wiring and the drain wiring, and a pixel electrode 27 electrically connected to a drain of the pixel portion TFT 23 and made of a transparent conductive film is formed thereon. As the transparent conductive film, a compound (called ITO) of indium oxide and tin oxide or a compound of indium oxide and zinc oxide may be used. After the pixel electrode 27 is formed, then an insulating film 28 is formed, and an opening portion is formed on the pixel electrode 27.

Next, an EL layer 29 is formed. As the EL layer 29, a laminate structure by freely combining well-known EL materials (hole injecting layer, hole transporting layer, light emitting layer, electron transporting layer, and electron injecting layer), or a single layer structure may be adopted. A well-known technique may be used to determine the structure. The EL material includes a low molecular material and a high molecular (polymer) material. In the case where the low molecular material is used, an evaporation method is used. In the case where the high molecular material is used, it is possible to use a simple method such as a spin coating method, a printing method or an ink jet method.

The EL layer is formed by an evaporation method, an ink-jet method or a dispenser method using a shadow mask. Whichever method is used, color display becomes possible by forming light-emitting layers (red light-emitting layer, green light-emitting layer, and blue light-emitting layer), each of which can emit light with a different wave length for each pixel. In addition, there are a system in which a color conversion layer (CCM) and a color filter are combined, and a system in which a white light-emitting layer and a color filter are combined, and either system may be used. Of course, an EL display device which emits monochromatic light may be used.

After the EL layer 29 is formed, a cathode 30 is formed thereon. It is desirable to remove moisture and oxygen existing in the interface between the cathode 30 and the EL layer 29 to the utmost. Thus, it is necessary to make such contrivance that the EL layer 29 and the cathode 30 are continuously formed in vacuum, or the EL layer 29 is formed in an inert gas atmosphere and the cathode 30 is formed without releasing to the atmosphere. In Embodiment 11, a film formation apparatus of a multi-chamber system (cluster tool system) is used, so that the foregoing film formation is made possible.

Note that, in this embodiment, a laminate structure of a LiF (lithium fluoride) film and an Al (aluminum) film is used for the cathode 30. Specifically, the LiF (lithium fluoride) film having a thickness of 1 nm is formed on the EL layer 29 by the evaporation method, and the aluminum film having a thickness of 300 nm is formed thereon. Of course, a MgAg electrode which is a well-known cathode material may be used. The cathode 30 is connected to the wiring 16 in a region designated by reference numeral 31. The wiring 16 is a power supply line for giving a predetermined voltage to the cathode 30, and is connected to the FPC 17 through an anisotropic conductive paste material 32.

For the purpose of electrically connecting the cathode 30 the wiring 16 in the region denoted by reference numeral 31, it is necessary to form contact holes in the interlayer insulating film 26 and the insulating film 28. These may be formed at the time of etching the interlayer insulating film 26 (at the time of forming the contact hole for the pixel electrode) and at the time of etching the insulating film 28 (at the time of forming the opening portion before formation of the EL layer). When the insulating film 28 is etched, the interlayer insulating film 26 may be etched together. In this case, if the interlayer insulating film 26 and the insulating film 28 are made of the same resin material, the shape of the contact hole can be made excellent.

Besides, a wiring line 16 is electrically connected to an FPC 17 through a gap between the sealing agent 19 and a substrate 10. Note that although description is made of the wiring 16 here, other wirings 14 and 15 are also electrically connected to the FPC 17 under the sealing agent 19 in the same manner.

Figure 30A:
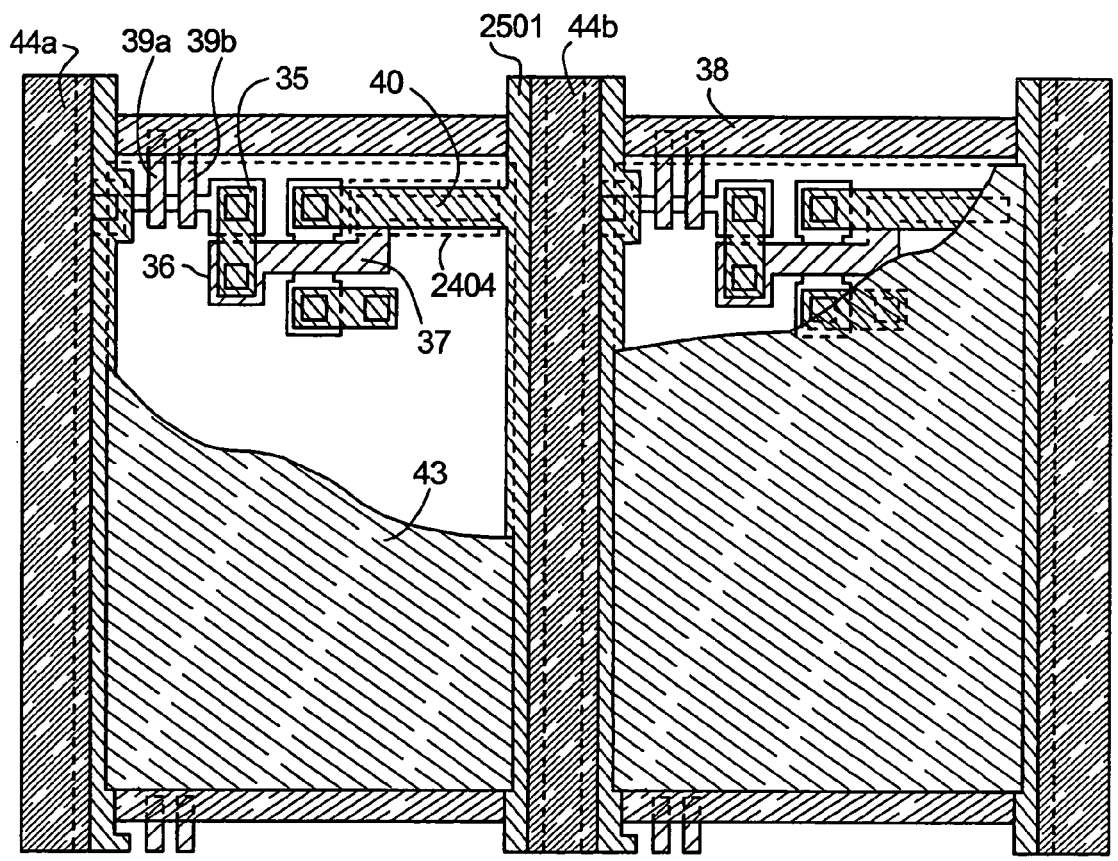
FIGS. 30A and 30B are a top view and a circuit diagram of the pixel portion of the light-emitting device.
Figure 30B:
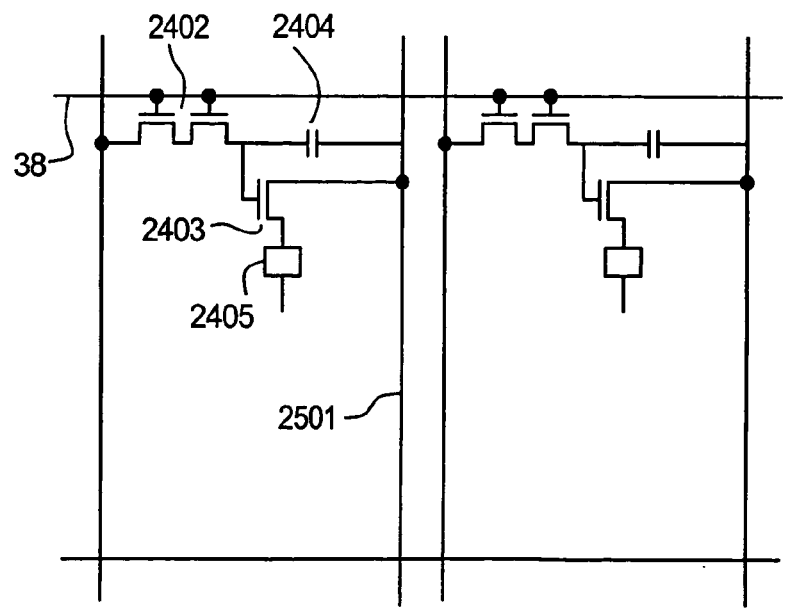

Here, a more detailed sectional structure of a pixel portion is shown in FIGS. 29A or 29B, its upper structure is shown in FIG. 30A, and its circuit diagram is shown in FIG. 30B. In FIG. 29A, a switching TFT 2402 formed on a substrate 2401 has the same structure as the pixel TFT 204 of Embodiment 6 shown in FIG. 17B. By adopting a double gate structure, two TFTs are essentially connected in series with each other, and there is a merit that an off current value can be reduced. Note that, although the double gate structure is adopted in Embodiment 11, a triple gate structure or a multi-gate structure having more gates may be adopted.

Further, a current controlling TFT 2403 is formed using an n-channel TFT 201 shown in FIG. 17B. At this time, a drain wiring 35 of the switching TFT 2402 is electrically connected to a gate electrode 37 of the current controlling TFT via a wiring 36. A wiring designated by 38 is a gate wiring for electrically connecting gate electrodes 39a and 39b of the switching TFT 2402.

At this time, it has a very important meaning that the current controlling TFT 2403 has a structure of the present invention. The current controlling TFT 2403 is an element for controlling the amount of current flowing through an EL element, and therefore a large current flows therein, thereby being an element having a high risk of deterioration due to heat or hot carriers. Thus, an LDD region, which partially overlaps with a gate electrode is provided in the current controlling TFT so that the deterioration of the TFT can be protected, resulting in enhancing the stability of its operation.

Also, in Embodiment 11, although the current controlling TFT 2403 is shown as a single gate structure, a multi-gate structure in which a plurality of TFTs are connected in series with each other may be adopted. In addition, such a structure may be adopted that a plurality of TFTs are connected in parallel with each other to essentially divide a channel forming region into plural portions, so that radiation of heat can be made at high efficiency. Such structure is effective as a countermeasure against deterioration due to heat.

Further, as shown in FIG. 30A, the wiring which becomes the gate electrode 37 of the current controlling TFT 2403 overlaps with a drain wirings 40 of the current controlling TFT 2403 through an insulating film in a region designated by 2404. At this time, a capacitor is formed in the region 2404. This capacitor 2404 functions as a capacitor for holding voltage applied to the gate of the current controlling TFT 2403. Note that, the drain wiring 40 is connected to a current supply line (power source line) 2501 and a constant voltage is always applied thereto.

A first passivation film 41 is provided on the switching TFT 2402 and the current controlling TFT 2403, and a leveling film 42 made of a resin insulating film is formed on top. It is very important to level a step portion due to the TFT using the leveling film 42. Since an EL layer formed later is very thin, there is a case of occurring poor light emission due to the existence of the step. Thus, it is desirable to conduct leveling prior to formation of a pixel electrode so that the EL layer can be formed as level as possible.

Besides, reference numeral 43 designates a pixel electrode (cathode of the EL element) made of a conductive film with high reflectivity, and is electrically connected to the drain of the current controlling TFT 2403. As the pixel electrode 43, it is preferable to use a conductive film with low resistance, such as an aluminum alloy film, a copper alloy film or a silver alloy film, or a lamination film thereof. Of course, a laminate structure with another conductive film may be adopted. In addition, a light emitting layer 45 is formed in a groove (corresponding to a pixel) formed by banks 44a and 44b made of insulating films (preferably resin). Note that, in this case, although only one pixel is shown, light-emitting layers corresponding to respective colors of R (red), G (green) and B (blue) may be separately formed. As an organic EL material used for the light-emitting layer, π-conjugated polymer material is used. As a typical polymer material, polyparaphenylene vinylene (PPV) based. polyvinylcarbazole (PVK) based, polyfluorene based and the like are enumerated. Note that, though various types exis as the PPV organic EL material, for example, a material as disclosed in "H. Shenk, H. Becker, O. Gelsen, E. Kluge, W. Kreuder, and H. Spreitzer, "Polymers for Light Emitting Diodes", Euro Display, Proceedings, 1999, p. 33–37" or Japanese Patent Application Laid-open No. Hei 10-92576 may be used.

As a specific light-emitting layer, it is appropriate that cyanopolyphenylenevinylene is used for a light-emitting layer to emit red light, polyphenylenevinylene is used for a light-emitting layer to emit green light, and polyphenylenevinylene or polyalkylphenylene is used for a light-emitting layer to emit blue light. It is appropriate that the film thickness is set from 30 to 150 nm (preferably 40 to 100 nm). However, the above examples are only examples of the organic EL material which can be used for the light-emitting layer, and it is not necessary to limit the to them. The EL layer (the layer for light emission and movement of carriers for the light emission) may be formed by freely combining a light-emitting layer, a charge-transporting layer and a charge-injecting layer. For example, although Embodiment 11, shows the example in which the polymer based material is used for the light-emitting layer, a low molecular organic EL material may be used. It is also possible to use an inoraunic material, such as silicon carbide, as the charge-transporting layer or the charge-injecting layer. As the organic EL material or inorganic material, known materials can be used.

Embodiment 11 adopts the EL layer of a laminate structure in which a hole-injecting layer 46 made of PEDOT (polythiophene) or PAni (polyaniline) is provided on the light-emitting layer 45. An anode 47 made of a transparent conductive film is provided on the hole-injecting layer 46. In Embodiment 11, since light generated in the light-emitting layer 45 is radiated to an upper surface side (to the upper side of the TFT), the anode 47 must be translucent. As the transparent conductive film, a compound of indium oxide and tin oxide or a compound of indium oxide and zinc oxide can be used. However, since the anode 47 is formed after the light-emitting layer and the hole-injecting layer which have low heat resistance are formed, it is preferable to be able to form the anode 47 at temperature as low as possible.

At the time when the anode 47 has been formed, an EL element 2405 is completed. Note that, the EL element 2405 here indicates a capacitor formed of the pixel electrode (cathode) 43, the light-emitting layer 45, the hole-injecting layer 46 and the anode 47. As shown in FIG. 30A, since the pixel electrode 43 is almost coincident with the area of the pixel, the whole pixel functions as the EL element. Thus, the utilization efficiency of light emission is very high, and it becomes possible to display an bright image.

By the way, in Embodiment 11, a second passivation film 48 is further provided on the anode 47. As the second passivation film 48, a silicon nitride film or an oxynitride silicon film is desirable. It is an object to insulate the EL element from the outside, in order to both prevent deterioration due to oxidation of the organic EL material and to suppress degassing from the organic EL material. As the result, the reliability of the EL display device is raised.

As described above, the EL display panel according to the present invention includes the pixel portion made of the pixel of the structure as shown in FIGS. 30A and 30B, and includes the switching TFT with a sufficiently low off current value and the current controlling TFT which is resistant to hot carrier injection. Thus, it is possible to obtain the EL display panel which has high reliability and is capable of displaying an excellent image.

FIG. 29B shows an example in which the structure of the EL layer is reversed. A current controlling TFT 2601 is formed using a p-channel TFT 200 shown in FIG. 17B. With respect to the manufacturing process thereof, reference may be made to Embodiment 6. In Embodiment 11, a transparent conductive film is used as a pixel electrode (anode) 50. Specifically, a conductive film made of a compound of indium oxide and zinc oxide is used. Of course, a conductive film made of a compound of indium oxide and tin oxide may be used.

After banks 51a and 51b made of insulating films are formed, a light-emitting layer 52 made of polyvinylcarbazole is formed by solution application. An electron-injecting layer 53 made of potassium acetylacetonate (expressed as acacK), and a cathode 54 made of aluminum alloy are formed thereon. In this case, the cathode 54 functions also as a passivation film. In this way, an EL element 2602 is formed. In Embodiment 11, light generated in the light-emitting layer 52 is radiated, as indicated by an arrow, toward the substrate on which TFTs are formed. It is preferred that a current controlling TFT 2601 is formed using a p-channel TFT in the case of employing the structure as shown in FIG. 29B.

Note that, the structure of Embodiment 11 can be freely combined with the structure of TFTs in Embodiments 6 and 7. Further, it is effective to use the EL display panel according to Embodiment 11 as a display portion of an electronic equipment in Embodiment 13.

[Embodiment 12]

In Embodiment 12, an example of a case where a pixel is made to have a structure different from the circuit diagram shown in FIG. 30B will be described with reference to FIGS. 31A to 31C. Note that, in Embodiment 12, reference numeral 2701 designates a source wiring of a switching TFT 2702; 2703, a gate wiring of the switching TFT 2702; 2704, a current controlling TFT; 2705, a capacitor; 2706, 2708, current supply lines; and 2707, an EL element.

Figure 31A:
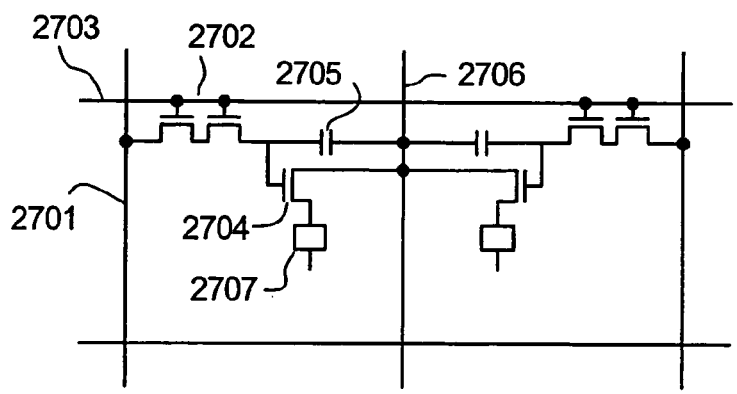
FIGS. 31A to 31C are examples of circuit diagrams of the pixel portion of the light-emitting device.

FIG. 31A shows an example in which the current supply line 2706 is made common between two pixels. That is, it is characterized in that the two pixels are formed to become axisymmetric with respect to the current supply line 2706 as a center. In this case, since the number of power supply lines can be decreased, the pixel portion can be made further fine.

Figure 31B:
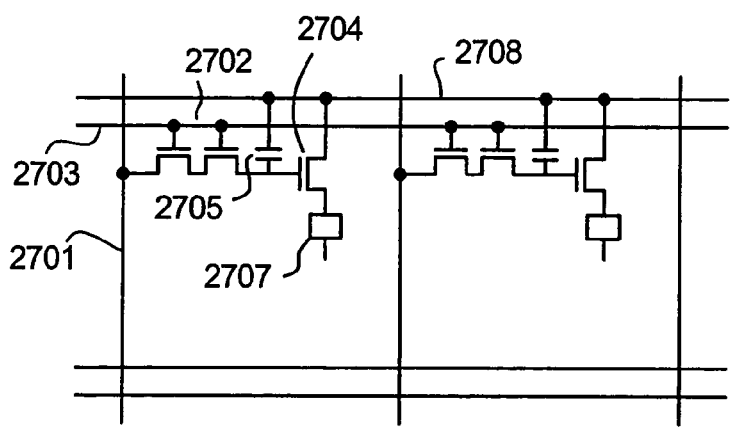

FIG. 31B shows an example in which the current supply line 2708 is provided in parallel with the gate wiring 2703. Note that, although FIG. 31B shows the structure in which the current supply line 2708 does not overlap with the gate wiring 2703, if both are wirings formed in different layers, they can be provided so that they overlap with each other through an insulating film. In this case, since an occupied area can be made common to the power supply line 2708 and the gate wiring 2703, the pixel portion can be further made fine.

Figure 31C:
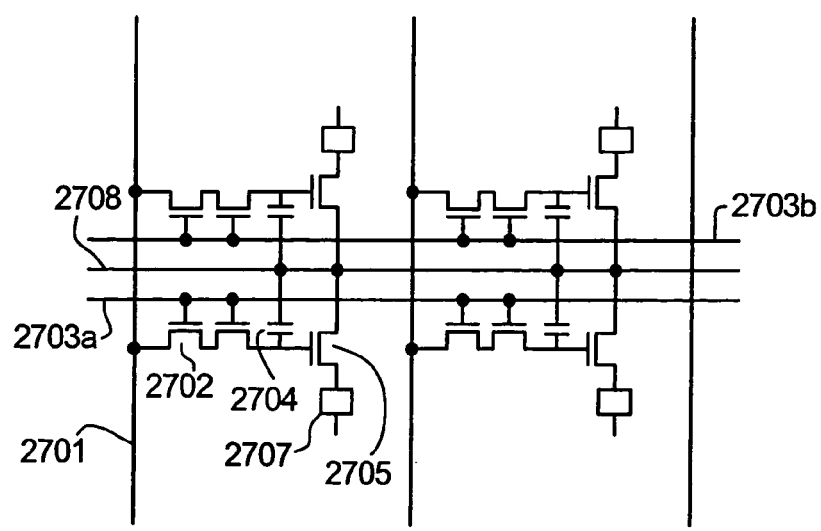

The structure of FIG. 31C is characterized in that the current supply line 2708 is provided in parallel with gate wirings 2703a and 2703b similarly to the structure of FIG. 31B, and further, two pixels are formed so that they become axisymmetric with respect to the current supply line 2708 as the center. Besides, it is also effective to provide the current supply line 2708 in such a manner that it overlaps with either one of the gate wirings 2703a and 2703b. In this case, since the number of power supply lines can be decreased, the pixel portion can be made further fine. Although FIGS. 31A and 31B show the structure in which the capacitor 2404 is provided to hold the voltage applied to the gate of the current controlling TFT 2403, the capacitor 2404 can also be omitted.

Since an n-channel TFT of the present invention, as shown in FIG. 29A, is used as the current controlling TFT 2403, it includes the LDD region provided so as to overlap with the gate electrode through the gate insulating film. Although a parasitic capacitance generally called a gate capacitance is formed in this overlapping region. Embodiment 12 is characterized in that this parasitic capacitance is positively used instead of the capacitor 2404. Since the capacitance of this parasitic capacitance is changed by the overlapping area of the gate electrode with the LDD region, it is determined by the length of the LDD region contained in the overlapping region. Also in the structures shown in FIGS. 31A. 31B and 31C, the capacitor 2705 can be similarly omitted.

Note that, the structure of this embodiment can be freely combined with the structure of Embodiments 6 to 11. Besides, it is effective to use the EL display panel having the pixel structure of Embodiment 12 as a display portion of electronic equipment of Embodiment 13.

[Embodiment 13]

CMOS circuits and pixel portions formed by implementing the present invention can be used in a variety of electro-optical devices (such as an active matrix liquid crystal display, an active matrix light-emitting display device, and an active matrix EC display). Namely, the present invention can be implemented for all electronic equipment, which incorporates this type of electro-optical device in a display portion.

The following can be given as such electronic equipment: a video camera, a digital camera, a projector (rear type or front type), a head mount display (goggle type display), a car navigation system, a car stereo, a personal computer, and a portable information terminal (such as a mobile computer, a portable telephone, or an electronic book). Some examples of these are shown in FIGS. 32A to 32F, FIGS. 33A to 33D, and FIGS. 34A to 34C.

Figure 32A:
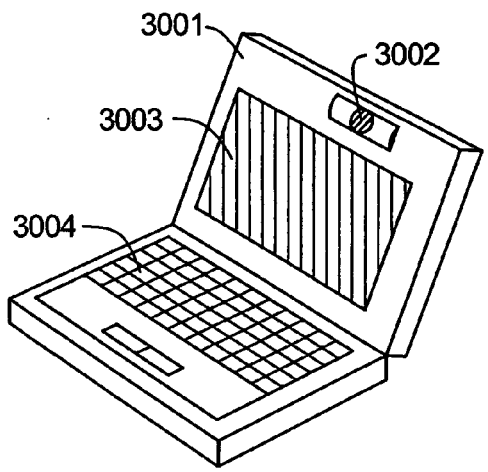
FIGS. 32A to 32F are diagrams showing examples of semiconductor devices.

FIG. 32A shows a personal computer and contains components such as a main body 3001, an image input portion 3002, a display portion 3003, and a keyboard 3004. The present invention can be applied to the image input portion 3002, the display portion 3003, and other signal control circuits.

Figure 32B:
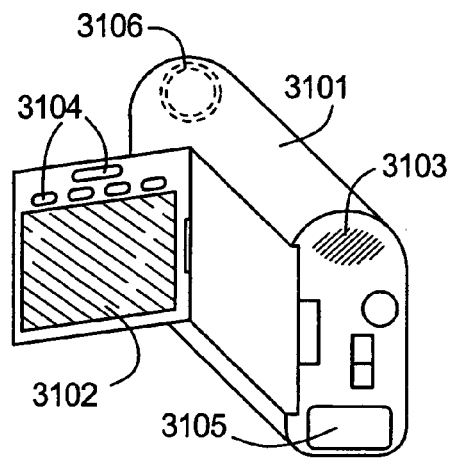

FIG. 32B shows a video camera and contains components such as a main body 3101, a display portion 3102, an audio input portion 3103, operation switches 3104, a battery 3105, and an image receiving portion 3106. The present invention can be applied to the display portion 3102, and other signal control circuits.

Figure 32C:
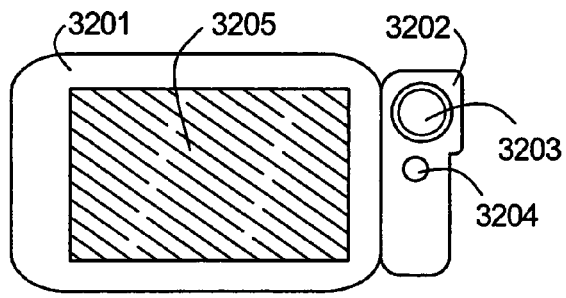

FIG. 32C shows a mobile computer and contains components such as a main body 3201, a camera portion 3202, an image receiving portion 3203, operation switches 3204, and a display portion 3205. The present invention can be applied to the display portion 3205 and other signal control circuits.

Figure 32D:
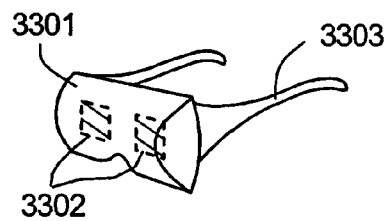

FIG. 32D shows a goggle type display and contains components such as a main body 3301, a display portion 3302, and arm portions 3303. The present invention can be applied to the display portion 3302 and other signal control circuits.

Figure 32E:
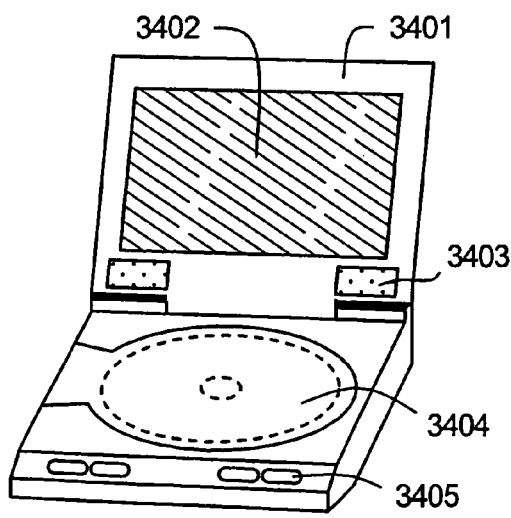

FIG. 32E shows a player which uses a recording medium with a program recorded therein (hereinafter referred to as recording medium) and contains components such as main body 3401, a display portion 3402, a speaker portion 3403, a recording medium 3404, and operation switches 3405. Note that a DVD (Digital Versatile Disk), CD (Compact Disk), etc. is used as a recording medium for this player, and that appreciation of music or a movie or performing games or the Internet can be done. The present invention can be applied to the display device 3402 and other signal control circuits.

Figure 32F:
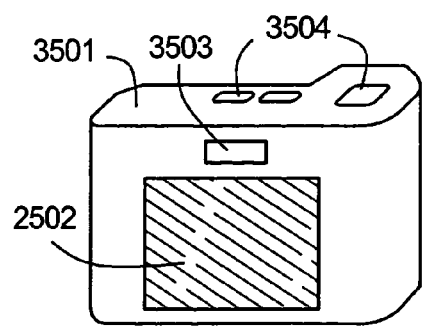

FIG. 32F shows a digital camera and contains components such as a main body 3501, a display portion 3502, an eye piece portion 3503, operation switches 3504, and an image receiving portion (not shown in the figure). The present invention can be applied to the display portion 3502 and other signal control circuits.

Figure 33A:
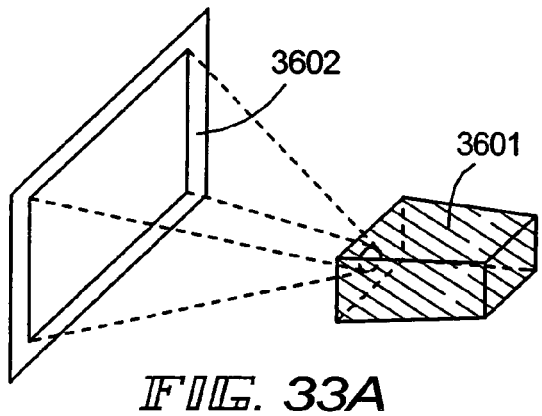
FIGS. 33A to 33D are diagrams showing examples of the semiconductor devices.

FIG. 33A shows a front type projector, and contains components such as a projecting apparatus 3601 and a screen 3602. The present invention can be applied to a liquid crystal display device 3808 which structures a portion of the projecting apparatus 3601, and to other signal control circuits.

Figure 33B:
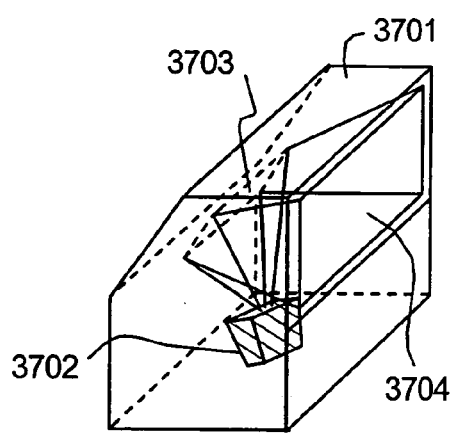

FIG. 33B shows a rear type projector, and contains components such as a main body 3701; a projecting apparatus 3702, a mirror 3703, and a screen 3704. The present invention can be applied to the liquid crystal display device 3808 which structures a portion of the projecting apparatus 3702, and to other signal control circuits.

Figure 33C:
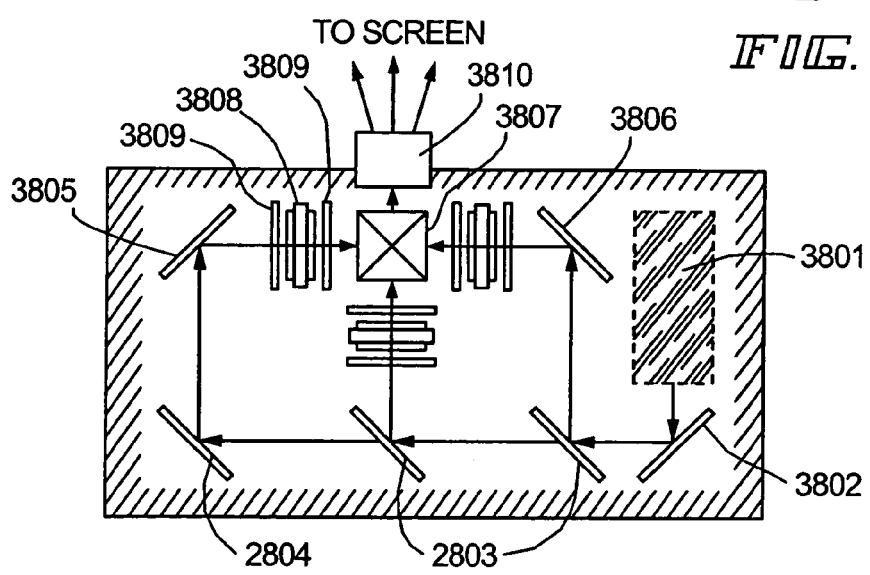

Note that an example of the structure of the projecting apparatuses 3601 and 3702 of FIG. 33A and FIG. 33B is shown in FIG. 33C. The projecting apparatuses 3601 and 3702 are composed of a light source optical system 3801, mirrors 3802 and 3804 to 3806, a dichroic mirror 3803, a beam splitter 2707, the liquid crystal display device 3808, a phase difference plate 3809, and a projecting optical system 3810. The projecting optical system 3810 is composed of a plurality of optical lenses. A three-plate type example is shown in Embodiment 13, but there are no particular limitations, and a single-plate type may also be used, for example. Further, optical systems such as an optical lens, a film having a light polarizing function, a film for regulating the phase, and an IR film may be suitably placed in the optical path shown by the arrow in FIG. 33C by an operator.

Figure 33D:
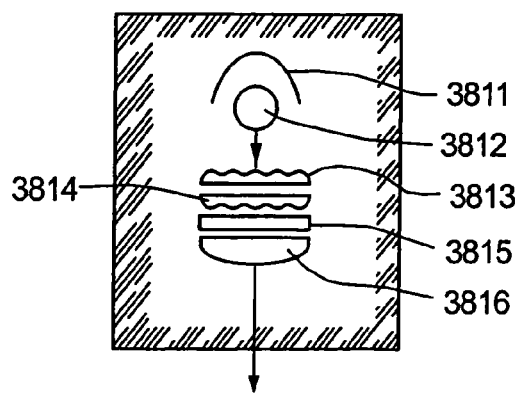

Further, FIG. 33D is a diagram showing one example of the light source optical system 3801 in FIG. 33C. In Embodiment 13, the light source optical system 3801 is composed of a reflector 3811, a light source 3812, lens arrays 3813 and 3814, a polarizing transformation element 3815, and a condenser lens 3816. Note that the light source optical system shown in FIG. 33D is one example, and the light source optical system is not limited to the structure shown in the figure. For example, optical systems such as an optical lens, a film having a light polarizing function, a film for regulating the phase, and an IR film may be suitably added by the operator.

Note that a case using a transmitting type electro-optical device in the projectors shown in FIGS. 33A to 33D is shown here, and an example of applying a reflecting type electro-optical device is not shown in the figures.

Figure 34A:
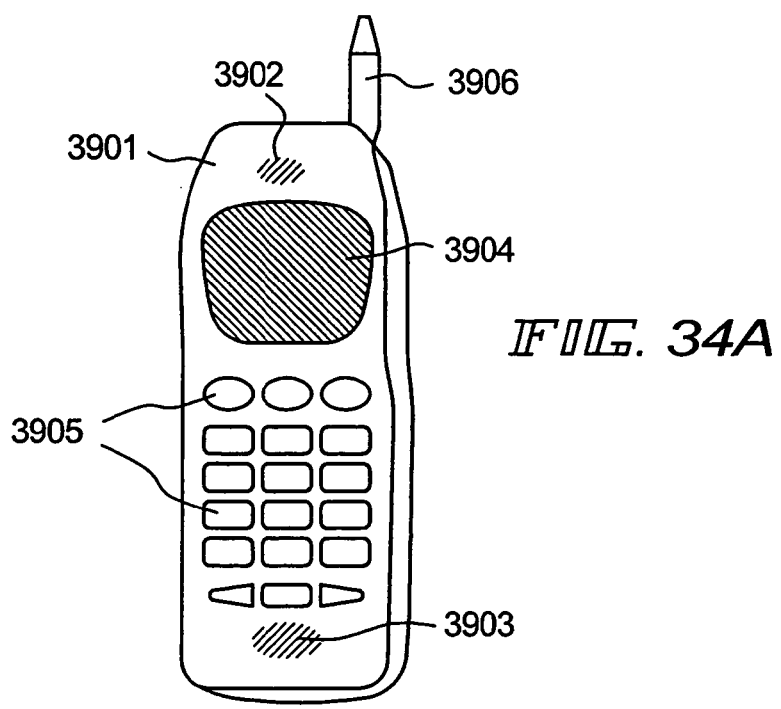
FIGS. 34A to 34C are diagrams showing the structures of projection type liquid crystal display devices.

FIG. 34A shows a portable telephone, and contains components such as a main body 3901, an audio output portion 3902, an audio input portion 3903, a display portion 3904, operation switches 3905, and an antenna 3906. The present invention can be applied to the audio output portion 3902, to the audio input portion 3903, to the display portion 3904, and to other signal control circuits.

Figure 34B:
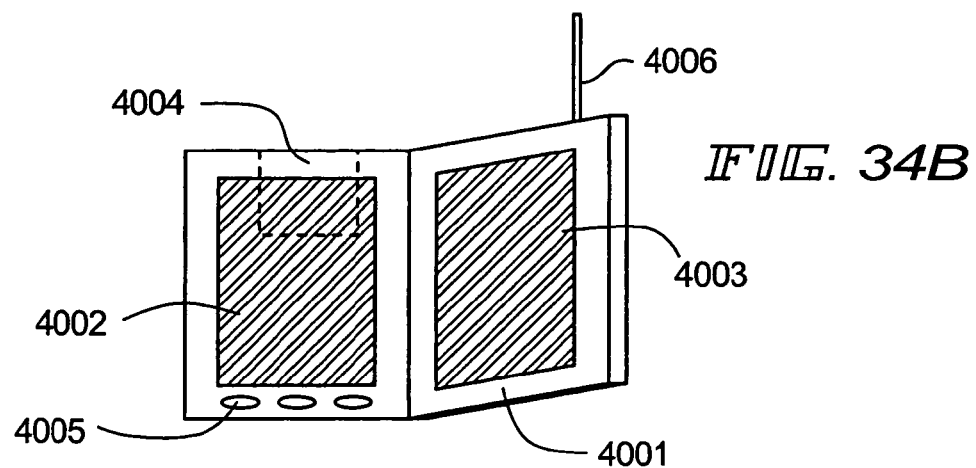

FIG. 34B shows a portable book (electronic book), and contains components such as a main body 4001, display portions 4002 and 4003, a recording medium 4004, operation switches 4005, and an antenna 4006. The present invention can be applied to the display portions 4002 and 4003, and to other signal control circuits.

Figure 34C:
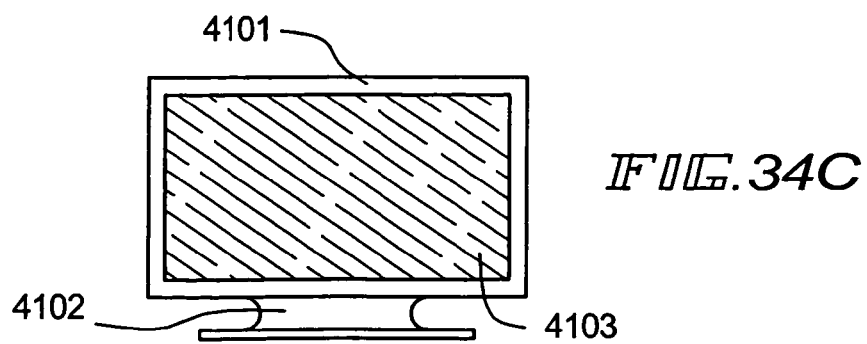
Figure 35A:
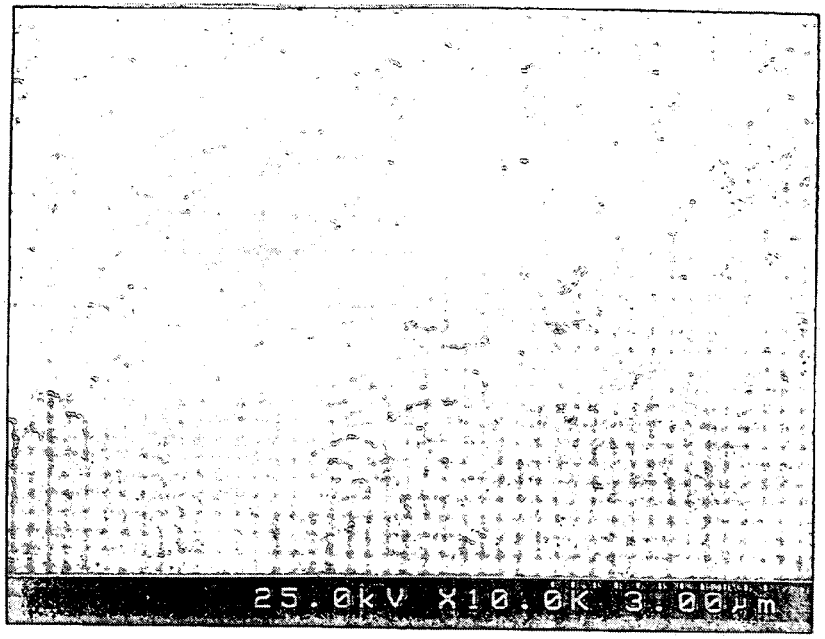
FIGS. 35A and 35B are diagrams showing SEM photographs of the surface of a polycrystalline silicon film.
Figure 35B:
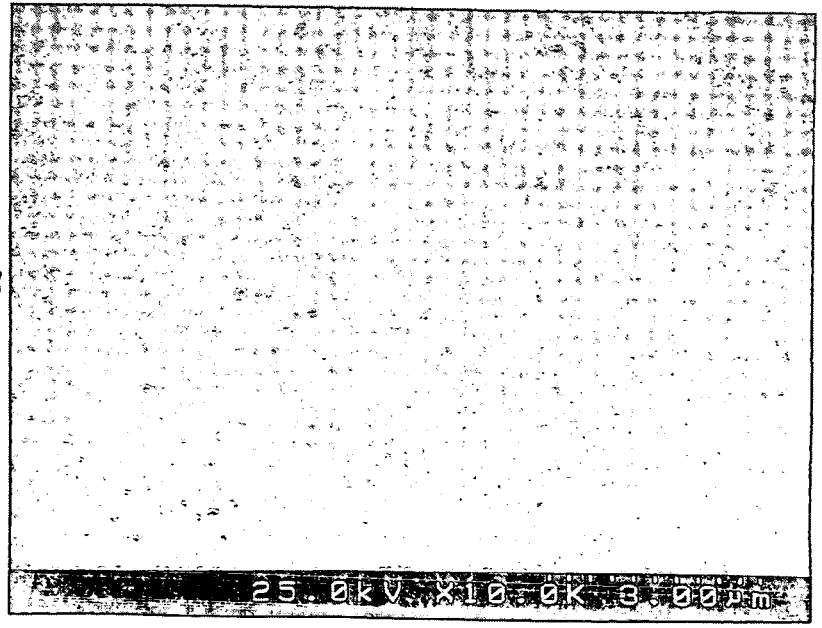
Figure 36A:
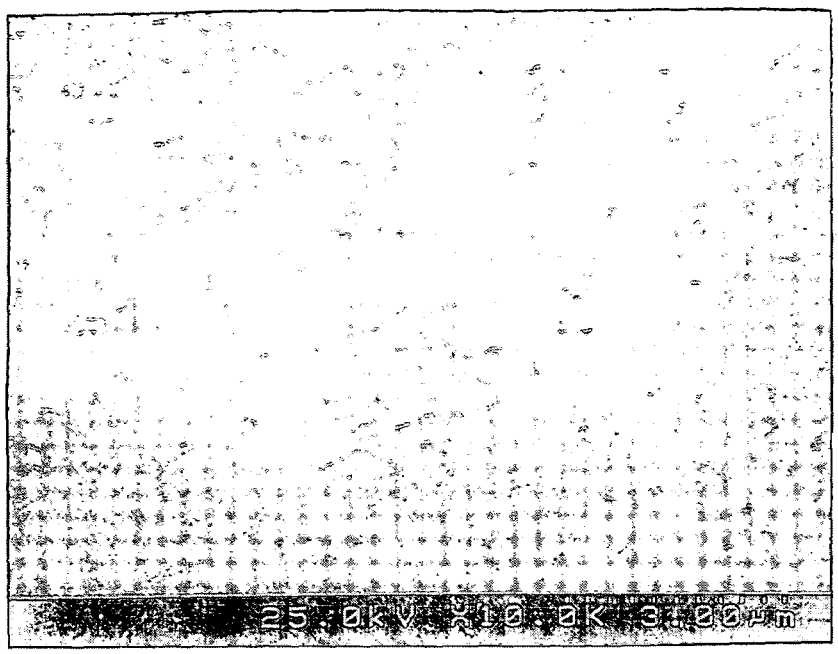
FIGS. 36A and 36B are diagrams in which SEM photographs of the surface of a polycrystalline silicon film are subjected to an image processing to emphasize the patterns of the surface.
Figure 36B:
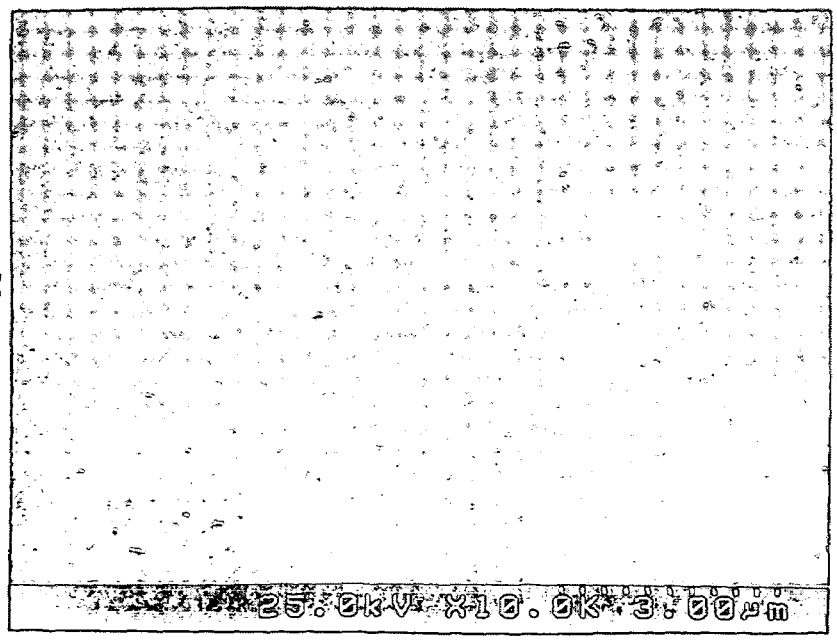

FIG. 34C shows a display, and contains components such as a main body 4101, a support stand 4102, and a display portion 4103. The present invention can be applied to the display portion 4103. The display of the present invention is advantageous for cases of large size screens in particular, and is advantageous for displays having a diagonal equal to or greater than 10 inches (in particular, equal to or greater than 30 inches).

The applicable scope of the present invention of this specification is thus extremely wide, and the present invention can be implemented when manufacturing electronic equipment of all fields. Furthermore, the electronic equipment of Embodiment 13 can be realized by using a constitution in which Embodiments 1 to 12 are freely combined.

When the crystallization of an amorphous semiconductor film is performed by heating, or the crystallinity thereof is improved by heating, a state is attained in which a area of an arbitrary lump of an amorphous region obtained by partially crystallizing with a heat treatment is less than or equal to 10.0 $\mu m^2$, and the lump which is equal to or greater than 0.30 $\mu m^2$ exists in the amorphous region, with the result that the improvement of the electric characteristics of the TFT and the control of the fluctuation thereof become possible. Further, it is preferable that the total area of the amorphous region is set between 2.0 and 8.0%, preferably between 2.0 and 6.0% with respect to the total area of the semiconductor film.

In addition, when an amorphous silicon film is used as the amorphous semiconductor film, after the heat treatment is performed to the amorphous silicon film for the crystallization or for the improvement of the crystallinity, laser annealing is performed thereto with the limited wave length of from 360 to 650 nm, preferably from 400 to 600 nm. with the result that the crystallization can be carried out without destroying the crystallized regions as much as possible because the absorption coefficient of the amorphous silicon film is higher than that of the polycrystalline silicon film.

What is claimed is:

1. A method of manufacturing a semiconductor device, comprising:
    a first step of introducing a metallic element for promoting crystallization of an amorphous semiconductor film introducing into the amorphous semiconductor film;
    a second step of partially crystallizing the amorphous semiconductor film by heat treatment to form a first polycrystalline semiconductor film; and
    a third step of irradiating a laser beam with a wave length from 360 to 650 nm to the first polycrystalline semiconductor film to form a second polycrystalline semiconductor film, wherein the first polycrystalline semiconductor film is crystallized in the range from 92 to 99% in a region which becomes an active layer of a TFT.

2. A method of manufacturing a semiconductor device, comprising:
a first step of introducing a metallic element for promoting crystallization of an amorphous semiconductor film introducing into the amorphous semiconductor film;
a second step of partially crystallizing the amorphous semiconductor film by heat treatment to form a first polycrystalline semiconductor film; and
a third step of irradiating a laser beam with a wave length from 360 to 650 nm to the first polycrystalline semiconductor film to form a second polycrystalline semiconductor film,
wherein, in the first polycrystalline semiconductor film, the total area of amorphous regions in a region which becomes an active layer of a TFT is set from 1 to 8% of an area of the region which becomes the active layer of the TFT.

3. A method of manufacturing a semiconductor device according to claim 1, wherein the metallic element is one kind or plural kinds of elements selected from the group consisting of Ni, Pd, Pt, Cu, Ag, Au, Al, In, Sn, Pb, P, As and Sb.

4. A method of manufacturing a semiconductor device according to claim 2, wherein the metallic element is one kind or plural kinds of elements selected from the group consisting of Ni, Pd, Pt, Cu, Ag, Au, Al, In, Sn, Pb, P, As and Sb.

5. A method of manufacturing a semiconductor device according to claim 1, wherein the laser beam is one kind selected from the group consisting of a second harmonic of a YAG laser, a second harmonic of a glass laser, an Ar laser, a second harmonic of a YLF laser, and a second harmonic of a YVO$_4$ laser.

6. A method of manufacturing a semiconductor device according to claim 2, wherein the laser beam is one kind selected from the group consisting of a second harmonic of a YAG laser, a second harmonic of a glass laser, an Ar laser, a second harmonic of a YLF laser, and a second harmonic of a YVO$_4$ laser.

7. A method of manufacturing a semiconductor device according to claim 1, wherein the semiconductor device is a liquid crystal display device or a light-emitting device.

8. A method of manufacturing a semiconductor device according to claim 2, wherein the semiconductor device is a liquid crystal display device or a light-emitting device.

9. A method of manufacturing a semiconductor device according to claim 1, wherein the semiconductor device is a portable telephone, a video camera, a digital camera, a projector, a goggle type display, a personal computer, a DVD player, an electronic book, or a portable information terminal.

10. A method of manufacturing a semiconductor device according to claim 2, wherein the semiconductor device is a portable telephone, a video camera, a digital camera, a projector, a goggle type display, a personal computer, a DVD player, an electronic book, or a portable information terminal.

11. A method of manufacturing a semiconductor device according to claim 1, wherein the laser beam has a wave length from 400 to 600 nm.

12. A method of manufacturing a semiconductor device according to claim 2, wherein the laser beam has a wave length from 400 to 600 nm.

13. A method of manufacturing a semiconductor device according to claim 2, wherein, in the first polycrystalline semiconductor film, the total area of amorphous regions in a region which becomes an active layer of a TFT is set from 1 to 6% of an area of the region which becomes the active layer of the TFT.

14. A method of manufacturing a semiconductor device according to claim 1, wherein the second polycrystalline semiconductor film formed is crystallized in equal to or greater than 99% of the region which becomes the active layer of the TFT.

15. A method of manufacturing a semiconductor device according to claim 2, wherein, in the second polycrystalline semiconductor film, the total area of amorphous regions in the region which becomes the active layer of the TFT is set equal to or less than 1% of the area of the region which becomes the active layer of the TFT.

* * * * *